United States Patent
Koike et al.

(10) Patent No.: US 8,681,282 B2
(45) Date of Patent: *Mar. 25, 2014

(54) LIQUID CRYSTAL DISPLAY DEVICE

(75) Inventors: Junichi Koike, Sendai (JP); Hideaki Kawakami, Chiba (JP)

(73) Assignee: Altiam Services Ltd. LLC, Dover, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/453,946

(22) Filed: Apr. 23, 2012

(65) Prior Publication Data

US 2012/0267628 A1    Oct. 25, 2012

Related U.S. Application Data

(63) Continuation of application No. 12/583,165, filed on Aug. 13, 2009, now Pat. No. 8,164,701.

(30) Foreign Application Priority Data

Aug. 19, 2008 (JP) .................... 2008-210226

(51) Int. Cl.
    G02F 1/136    (2006.01)
(52) U.S. Cl.
    USPC ............................... 349/43; 349/41
(58) Field of Classification Search
    USPC .................. 349/41–43; 257/59, 71–72
    See application file for complete search history.

(56) References Cited

U.S. PATENT DOCUMENTS

| | | | |
|---|---|---|---|
| 5,959,358 | A | 9/1999 | Lanford et al. |
| 6,686,661 | B1 | 2/2004 | Lee et al. |
| 7,289,183 | B2 | 10/2007 | Gan et al. |
| 7,507,666 | B2 | 3/2009 | Nakao et al. |
| 7,782,413 | B2 * | 8/2010 | Koike et al. ............ 349/43 |
| 8,164,701 | B2 | 4/2012 | Koike et al. |
| 8,384,836 | B2 * | 2/2013 | Sakai .................... 349/43 |
| 2006/0151788 | A1 | 7/2006 | Cho et al. |
| 2008/0252843 | A1 | 10/2008 | Koike et al. |
| 2008/0278649 | A1 | 11/2008 | Koike et al. |

FOREIGN PATENT DOCUMENTS

| | | |
|---|---|---|
| JP | 10-152788 | 6/1998 |
| JP | 10-153788 | 6/1998 |
| JP | 10-301150 | 11/1998 |
| JP | H11-194361 | 7/1999 |
| JP | 2000-199054 | 7/2000 |
| JP | 2000-252472 | 9/2000 |

(Continued)

OTHER PUBLICATIONS

Notification of Reasons for Refusal in Japan Patent Application No. 2007-124037, dispatched date Oct. 14, 2011.

(Continued)

*Primary Examiner* — Dung T. Nguyen
(74) *Attorney, Agent, or Firm* — Baker & Hostetler LLP

(57) ABSTRACT

In a liquid crystal display (LCD) device having a thin film transistor (TFT), the TFT includes a source electrode, a drain electrode and a semiconductor layer. At least one of the source electrode and drain electrode includes a first layer including copper and a second layer forming an oxide layer and covering the first layer. The semiconductor layer has a substantially linear current-voltage relationship with said source electrode or drain electrode including said first and second layers, when a voltage is applied between the semiconductor layer and said source electrode or drain electrode.

20 Claims, 47 Drawing Sheets

(56) References Cited

FOREIGN PATENT DOCUMENTS

| | | |
|---|---|---|
| JP | 2002-069550 | 3/2002 |
| JP | 2004-091907 | 3/2004 |
| JP | 2004-139057 | 5/2004 |
| JP | 2004-163901 | 6/2004 |
| JP | 2005-158887 | 6/2005 |
| JP | 2005-166757 | 6/2005 |
| JP | 2006-506682 A | 2/2006 |
| JP | 2007-072428 | 3/2007 |
| JP | 2008-091599 A | 4/2008 |
| JP | 2008-170744 A | 7/2008 |
| JP | 2008-282887 A | 11/2008 |
| KR | 2007-001648 | 1/2007 |
| WO | WO 2006/025347 | 3/2006 |
| WO | WO 2006/254347 | 3/2006 |

OTHER PUBLICATIONS

Arcot et al., "Intermetallic Reactions Between Copper and Magnesium as an Adhesion/Barrier Layer", Materials Research Society Symposium Proceedings, Apr. 30-May 3, 1991, vol. 225, 231-236.

Chae et al., "Self-passivated copper as a gate electrode in a poly-Si thin film transistor liquid crystal display", Journal of Applied Physics, Jul. 1, 2001, 90(1), 411-415.

Lee et al., "Diffusion barrier and electrical characteristics of a self-aligned MgO layer obtained from a Cu(Mg) alloy film", Applied Physics Letters, Oct. 2, 2000, 77(14), 2192-2194.

* cited by examiner

FIG. 26 The resistance change of Cu-Mn alloy where a heat treatment at a temperature of about 350 °C is conducted in various conditions of atmosphere Load value needed for boundary separation is measured by a nano scratch method. Even if the scratching time (speed) is changed, Cu-Mn needs further load than its Cu/Ta counterpart.

FIG. 34

| Heat temperature (degrees Celsius) \ Heat time (minute) | 10 | 20 | 30 | 60 |
|---|---|---|---|---|
| 150 | × | × | × | × |
| 200 | × | △ | ○ | ○ |
| 250 | ○ | ○ | ○ | ○ |
| 300 | ○ | ○ | ○ | ○ |
| 350 | ○ | ○ | ○ | ○ |

A cross section of gate interconnections

A cross section of an organic EL display

LIQUID CRYSTAL DISPLAY DEVICE

CROSS REFERENCE TO RELATED APPLICATIONS

This application is a continuation of U.S. patent application Ser. No. 12/583,165, filed Aug. 13, 2009, now U.S. Pat. No. 8,164,701, issued Apr. 24, 2012, which claims priority under 35 U.S.C. §119 from Japanese Patent Application Serial No. 2008-210226, filed Aug. 19, 2008, each of which is incorporated herein by reference in its entirety.

TECHNICAL FIELD

The present invention relates to a liquid crystal display (LCD) device having a thin film transistor (TFT).

BACKGROUND

In recent years, low-power-consumption liquid crystal display (LCD) devices, which are thin and light in terms of weight and may also be driven with low value voltages, are widely used. In addition, the demand for increasing the screen size is higher year after year, and motion pictures such as TV images are required to be displayed on these devices. For that, interconnections need to be composed of materials that have low resistivity and high conductivity. In recent years, in response to the above requirements interconnections are expected to be made of new materials such as copper (Cu). Copper (Cu) has lower resistivity, namely higher conductivity compared to aluminum (Al) alloys.

According to the actual demand for large screens, materials for gate interconnections have changed from a molybdenum (Mo) alloy to an aluminum (Al) alloy or an aluminum clad, etc. Needless to mention that Aluminum (Al) has problems of hillocks, migrations, etc.

For example, as shown in Japanese Unexamined Patent Application Publication No. 2000-199054, interconnection materials composed of an aluminum-neodymium (Al—Nd) alloy is proposed, or anodically oxidized Al, Al claded by molybdenum (Mo) alloy, or double layered aluminum (Al) is used. In the case of aluminum-neodymium (Al—Nd) alloy the resistivity of interconnections is about 5.1 $\mu\Omega$cm, while the resistivity of pure aluminum (Al) is 2.5 $\mu\Omega$cm.

Therefore, interconnections composed of three layers of titanium/aluminum/titanium (Ti/Al/Ti) or molybdenum/aluminum/molybdenum (Mo/Al/Mo) are used as a countermeasure against the above mentioned problems of hillocks, migrations, etc. when pure aluminum (Al) is practically used as a material for interconnections. However, this multilayer structure brings about new problems such as an increase in the layer formation process.

On the other hand, nowadays, copper (Cu) is considered to be an attractive material for thin film transistor (TFT) electrodes or interconnections because it represents a low electrical resistance compared to the other materials used in TFT electrodes or interconnections. However, copper (Cu) has poor characteristics with regards to the adhesiveness with insulating layers, in particular, with glass, which is a material used for the substrate of TFT. In addition, copper (Cu) gets easily oxidized when formed on an insulating layer.

Accordingly, to resolve the above-mentioned problems, a technique employing alloyed copper interconnections is attempted in TFT-LCD devices. This technique aims at securing the adhesiveness to the glass substrate by reaction of alloy elements with the substrate forming a layer at their interface. In addition, this technique also aims at forming an oxide layer on a surface of copper (Cu), in which the alloy elements function as an oxidation-resistance layer with a low resistivity for the copper (Cu).

However, according to the proposed technique, characteristics that are aimed at are not sufficiently achieved. Electric resistance of copper (Cu) increases due to the fact that alloy elements are remaining in Cu layer, and therefore it could not show its advantage over conventional interconnection materials such as aluminum (Al) or aluminum alloy.

Further, as shown in Japanese Unexamined Patent Application Publication No. 2004-163901, in order to utilize a copper interconnection in TFT-LCD devices, another technique is proposed in that a molybdenum (Mo) alloy layer is interposed between the copper (Cu) layer and the substrate, thereby securing the adhesiveness and the barrier properties with the substrate.

However, according to this technique, the manufacturing process has an additional step for depositing molybdenum (Mo) alloy. In addition, the effective resistance of interconnections increases in this structure. Further, although a single layer of copper (Cu) is utilized for the source and drain electrodes of TFT-LCD devices, their stability remains under question.

Further, in Japanese Unexamined Patent Application Publication No. 2004-139057, in order to resolve the above mentioned problems with regards to the copper (Cu) interconnections, another technique is proposed in that a high-melting-point nitride such as tantalum nitride (TaN), titanium nitride (TiN) or tungsten nitride (WN) is formed around the copper (Cu). However, this technique arises other problems such as, for example, a new material for forming the barrier layer and even an additional process are required compared to the case where conventional materials are used for the interconnections. In addition, the effective resistance of the interconnection increases because a high-resistivity barrier layer is deposited thickly around the copper (Cu).

Further, Japanese Unexamined Patent Application Publication No. 2005-166757 discloses that an addition of one or more elements of magnesium (Mg), titanium (Ti) and chromium (Cr) to the copper (Cu) of the interconnections in TFT-LCD devices improves the adhesiveness as well as the oxidation resistance. However, another problem arises in that the interconnection resistance increases as the additional elements are remaining in the interconnections. In addition, the interconnection resistance increases because the additional elements reduce oxides in the substrate layer and the reduced elements diffuse into the interconnection.

Japanese Unexamined Patent Application Publication No. 2002-69550 discloses another technique, which tries to improve the oxidation resistance by adding silver (Ag) of 0.3 to 10 weight percent to the copper (Cu). However, in this case, the adhesiveness to the glass substrate is not improved, and sufficient oxidation resistance may not be acquired to withstand liquid crystal manufacturing process.

Japanese Unexamined Patent Application Publication No. 2005-158887 proposes a copper alloy in which at least one element of titanium (Ti), molybdenum (Mo), nickel (Ni), aluminum (Al) and silver (Ag) is added by 0.5 to weight percent to the copper (Cu). However, the additional element increases electric resistance of the interconnections.

Japanese Unexamined Patent Application Publication No. 2004-91907 discloses the addition of molybdenum (Mo) by 0.1 to 3.0 weight percent to the copper (Cu) and segregation of molybdenum (Mo) to a grain boundary suppresses oxidation by grain boundary diffusion. Although this technique can improve oxidation resistance of the copper (Cu), there is a problem in that the interconnection resistance increases.

International Unexamined Patent Application Publication No. WO2006-025347 discloses that an oxide protective layer formed by an additional element will suppress the oxidation of Cu in the copper alloy layer in which the appropriate additional element is added. The protective layer is formed at an interface of an adjacent insulating layer that suppresses the mutual diffusion. This technique provides a copper interconnection that has high conductivity and good adhesiveness with the substrate. Further, this technique provides liquid crystal display (LCD) devices utilizing this copper interconnections. In addition, this publication suggests that manganese (Mn) is preferable as one of the additional elements. However, this technique is insufficient to realize features of interconnection structures used in the liquid crystal display (LCD) devices and TFT electrode structures.

Japanese patent No. 3302894 proposes a TFT structure used in TFT-LCD devices and explicitly discloses the gate electrode of TFT structure is covered by an oxide layer when a Cu alloy is applied to the gate electrode. This patent discloses that when a first metal is Cu, a second metal is at least one element selected from titanium (Ti), zirconium (Zr), hafnium (Hf), tantalum (Ta), niobium (Nb), silicon (Si), boron (B), lanthanum (La), neodymium (Nd), samarium (Sm), europium (Eu), gadolinium (Gd), dysprosium (Dy), yttrium (Y), ytterbium (Yb), cerium (Ce), magnesium (Mg), thorium (Th), and chromium (Cr). However, the second element is different from an additional element of the present invention.

None of the above-mentioned documents refers to a structure of source or drain electrodes in a TFT structure. However, high adhesiveness to a semiconductor layer or a pixel electrode, tolerability to a circumstance in which the TFT electrode is used, and stability of electric contacts with source or drain electrodes portion are required for the structure of the source or drain electrode. Therefore, the structure of the source or drain electrode is an important element of liquid crystal display (LCD) device.

As mentioned above, according to these conventional techniques, although adhesiveness to the semiconductor layer or the pixel electrode and the oxidation-resistance layer are tried to be secured by adding an additional alloyed element to the copper (Cu), a sufficient result is not yet obtained in all techniques. Further, sufficient results are not obtained with regard to the high adhesiveness to the semiconductor layer or the pixel electrode and tolerability of circumstances in which the TFT electrode is used. In the same way, the requirement of having stable electric contacts with the source or drain electrodes portion are not yet met.

Especially, although the International Unexamined Patent Application Publication No. WO2006-025347 suggests the liquid crystal display (LCD) device using copper interconnections, a sufficient structure for realizing the gate interconnection structure utilized in the liquid crystal display (LCD) device is not yet achieved by the suggested technique. Further, the Japanese patent No. 3302894 clearly specifies that an oxide layer covering a gate electrode is an oxide layer mainly composed of a second metal element, which is formed by applying a heat treatment in an oxygen atmosphere. However, it is not described at all nor even suggested that the adhesiveness between the semiconductor layer and the source electrode or drain electrode is secured by forming an oxide layer on the source or drain electrodes as a result of reaction between Cu alloy and a Si oxide layer contacting to the Cu alloy by heat treatment, as mentioned in the present invention. Further, an electrically stable contact between the source electrode or drain electrode and the semiconductor layer is not described nor suggested.

In other words, there is a need to provide a solution for all the above-mentioned problems such as, for example, depositing the Cu alloy layer with fewer process steps, decreasing effective resistance of interconnections, and forming a stable electric contact with improving the adhesiveness between the semiconductor layer and the source or drain electrodes. However, these problems cannot be solved by the above-mentioned conventional techniques, therefore actual products, featuring all the requirements, are difficult to be manufactured.

The present invention is made under the above-mentioned situation. The purpose of the present invention is to prevent an oxidation of interconnection materials, including a source electrode or drain electrode, by forming an oxide layer covering the interconnections and securing a high adhesiveness to a semiconductor layer or a pixel electrode. Further, the purpose of the present invention is to provide a liquid crystal display (LCD) device having a TFT structure in which a source electrode or drain electrode is sandwiched between the semiconductor layer, such as amorphous silicon, and a passivation layer with a stable ohmic contact.

SUMMARY

In accordance with a first aspect of the present invention, in a liquid crystal display (LCD) device having a thin film transistor (TFT), the TFT includes:

a source electrode;

a drain electrode, where at least one of said source electrode and drain electrode includes: a first layer including copper, a second layer forming an oxide layer and covering said first layer; and a semiconductor layer having a substantially linear current-voltage relationship with said source electrode or drain electrode including said first and second layers, when a voltage is applied between the semiconductor layer and said source electrode or drain electrode.

In the first aspect of the present invention described above, the second layer forming the oxide layer covers the first layer in the source or drain electrode. Therefore, copper in the first layer is prevented from oxidation. Further, the semiconductor layer has the substantially linear current-voltage relationship with the source electrode or drain electrode even though the oxide layer covers the first layer in the source electrode or drain electrode. Such a substantially linear current-voltage relationship is a preferable characteristic for a TFT transistor of a LCD device.

In accordance with a second aspect of the present invention, in a liquid crystal display (LCD) device having a thin film transistor (TFT), the TFT includes:

a source electrode;

a drain electrode, where at least one of said source electrode and drain electrode includes: a first layer including copper, a second layer forming an oxide layer for sandwiching said first layer; and a semiconductor layer having a substantially linear current-voltage relationship with said source electrode or drain electrode with said first and second layers, when a voltage is applied between the semiconductor layer and said source electrode or drain electrode.

In the second aspect of the present invention described above, the second layer forming the oxide layer sandwiches the first layer in the source or drain electrode. Therefore, copper in the first layer is prevented from oxidation. Further, the semiconductor layer has the substantially linear current-voltage relationship with the source electrode or drain electrode even though the oxide layer sandwiches the first layer in the source electrode or drain electrode. Such a substantially linear current-voltage relationship is a preferable characteristic for a TFT transistor of a LCD device.

In accordance with a third aspect of the present invention, in a liquid crystal display (LCD) device having a thin film transistor (TFT), the TFT includes:

a source electrode;

a drain electrode, where at least one of said source electrode and drain electrode includes: a first layer including copper and manganese, a second layer forming an oxide layer including manganese and covering said first layer; and a semiconductor layer having a substantially linear current-voltage relationship with said source electrode or drain electrode with said first and second layers, when a voltage is applied between the semiconductor layer and said source electrode or drain electrode.

In the third aspect of the present invention described above, the second layer forming the oxide layer covers the first layer in the source or drain electrode. Therefore, copper in the first layer is prevented from oxidation. Further, the semiconductor layer has the substantially linear current-voltage relationship with the source electrode or drain electrode even though the oxide layer sandwiches the first layer in the source electrode or drain electrode. Such a substantially linear current-voltage relationship is a preferable characteristic for a TFT transistor of a LCD device. Further, the second layer is an oxide layer including manganese. Therefore, adhesiveness between the source electrode or drain electrode and the semiconductor layer is secured. Copper in the first layer is also prevented from diffusing into the semiconductor layer.

BRIEF DESCRIPTION OF THE DRAWINGS

FIG. 34 illustrates tape test results for evaluating the adhesiveness of a Cu—Mn alloy sample.

DETAILED DESCRIPTION OF ILLUSTRATIVE EMBODIMENTS

Embodiments of the present invention will be described hereinafter with reference to the accompanying drawings, in which preferred exemplary embodiments of the invention are shown. The ensuing description is not intended to limit the scope, applicability or configuration of the disclosure. Rather, the ensuing description of the preferred exemplary embodiments will provide those skilled in the art with an enabling description for implementing preferred exemplary embodiments of the disclosure. It should be noted that this invention may be embodied in different forms without departing from the spirit and scope of the invention as set forth in the appended claims.

Embodiments of the present invention are related to a technique in which copper alloy is applied to electrodes and interconnections of amorphous silicon (a-Si) TFTs forming an active matrix LCD on a TFT substrate. First of all, the liquid crystal display (LCD) device used for the present invention will be described.

Figure 1:
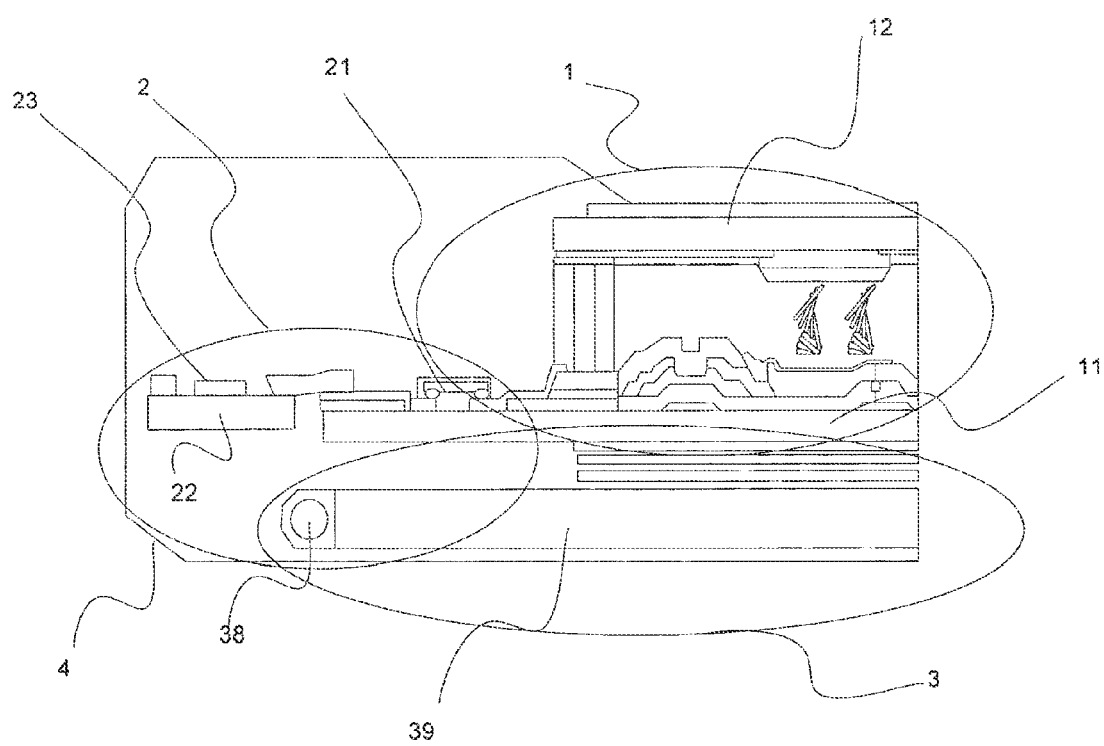
FIG. 1 illustrates a cross-sectional view of a thin film transistor liquid crystal display (TFT-LCD) module.

Referring first to FIG. 1, a cross-sectional view of a thin film transistor liquid crystal display (TFT-LCD) module is shown. The TFT-LCD module is composed of a LCD display panel 1, a driver circuit 2, a backlight unit 3 and a chassis 4. The LCD display panel 1 consists of a TFT substrate 11 and a color filter (CF) substrate 12, which are positioned respectively at the lower and upper sides of the LCD display panel 1 forming an LCD display cell.

The driver circuit 2 drives the LCD display panel 1 by providing electrical signals reached from an outside source to the LCD display panel 1. The driver circuit 2 may include a LCD driver LSI chip 21, a multilayer printed circuit board (PCB) 22 and a control circuit 23. The LCD driver LSI chip 21 is electrically coupled with a terminal electrode of the LCD display panel 1 by an anisotropic conductive film. In addition, a lamp 38 and a light guide plate 39 are provided on the backlight unit 3. The chassis 4 is set to complete the LCD module structure.

Figure 2:
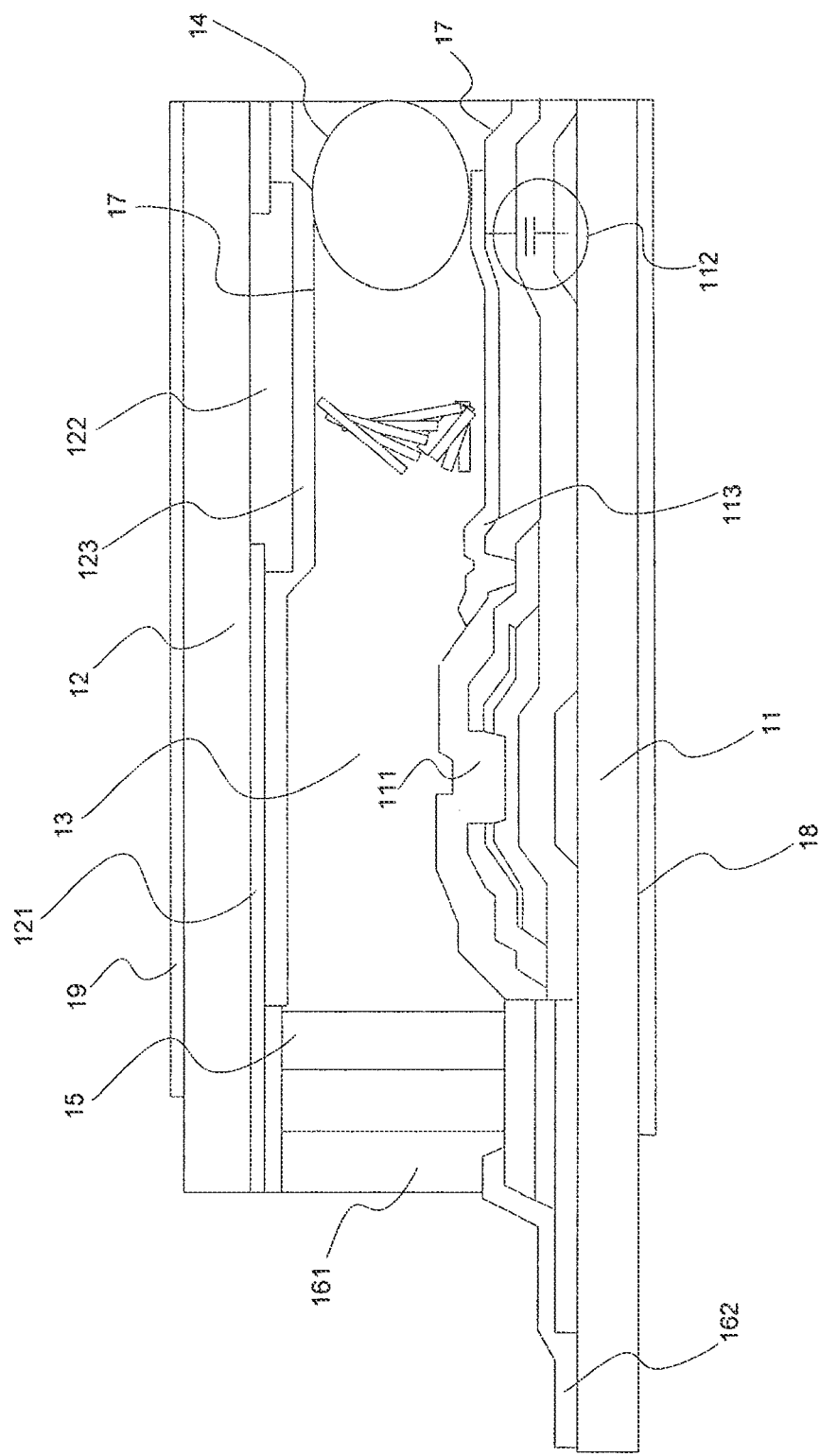
FIG. 2 illustrates a cross-sectional view of a LCD display panel.

Referring next to FIG. 2, a cross-sectional view of the LCD display panel 1 is shown. As explained above, the LCD display panel 1 includes a pair of substrates (TFT substrate 11 and CF substrate 12), arranged to face each other with a gap in which a liquid crystal layer (LC layer) 13 is filled. The gap is about 3 to 5 μm, and the distance of the gap is controlled by positioning a spacer 14 in the LCD display panel 1. The liquid crystal layer 13 is liquid, and is sealed by a surrounding seal 15. The arrangement of liquid crystal molecules within the liquid crystal layer 13 controls the rotation of light to direct the polarized light as an optical crystal. The liquid crystal molecules align themselves with each other, within their physical surrounding, and with an electric field such that they are arranged vertically or transversely against an interface between the liquid crystal layer 13 and the TFT substrate 11 or the CF substrate 12. This is called orientation.

As shown in FIG. 2, an orientation film 17 is applied between the interface of the liquid crystal layer 13 and the TFT substrate 11 or the CF substrate 12. Furthermore, polarizing films 18 and 19 are disposed, respectively, on outer surfaces of the TFT substrate 11 and the CF substrate 12. Additionally, a thin film transistor (TFT) 111, a storage capacity (Cs) 112 and a pixel electrode 113 are placed on an inner surface of the TFT substrate 11 forming a basic TFT-LCD pixel. The LCD display panel 1 includes millions of pixels placed on the TFT substrate 11 such that they are connected in form of an active matrix through interconnections.

Figure 3:
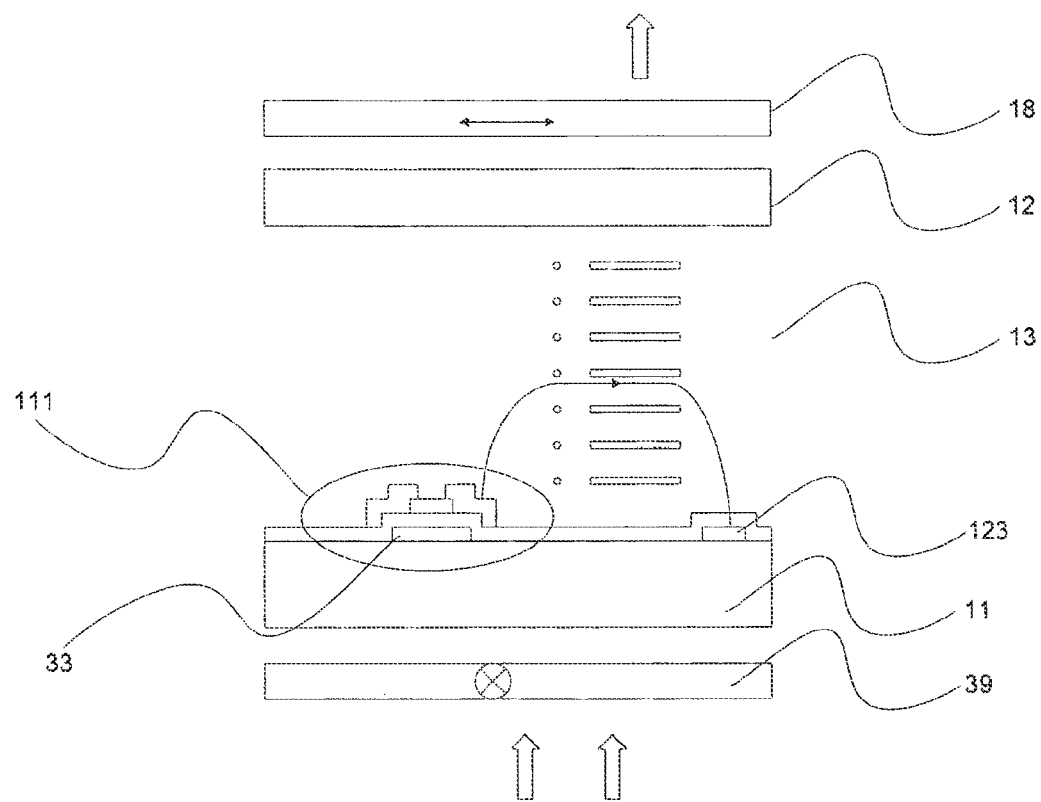
FIG. 3 is a conceptual view of an IPS liquid crystal display device.

The CF substrate 12, which faces the TFT substrate 11, consists of a black matrix (BM) 121, a color filter (CF) 122 having three primary colors (red, green, and blue), and a common electrode 123. In this embodiment, the common electrode 123 is placed on the CF substrate 12. Other embodiments may use an in-plane switching (IPS) nematic liquid crystal mode, where the common electrode 123 is placed on the TFT substrate 11, as shown in FIG. 3.

Referring back to the FIG. 2, the common electrode 123 is a transparent electrode, formed from indium tin oxide (ITO), indium zinc oxide (IZO), or indium zinc tin oxide (ITZO). In order to extend the common electrode 123 to the TFT substrate 11, a short portion 161 is used between the common electrode 123 and the TFT substrate 11 after the surrounding seal 15. Each electrode is electrically connected to the driver circuit 2 by a connecting pad 162. In addition, the TFT substrate 11 and the CF substrate 12 are required to be optically-transparent, and hard glass is used as a material for them. Incidentally, refer to U.S. Pat. Nos. 2,701,698 and 5,598,285 about the IPS nematic liquid crystal mode shown in FIG. 3.

Figure 4:
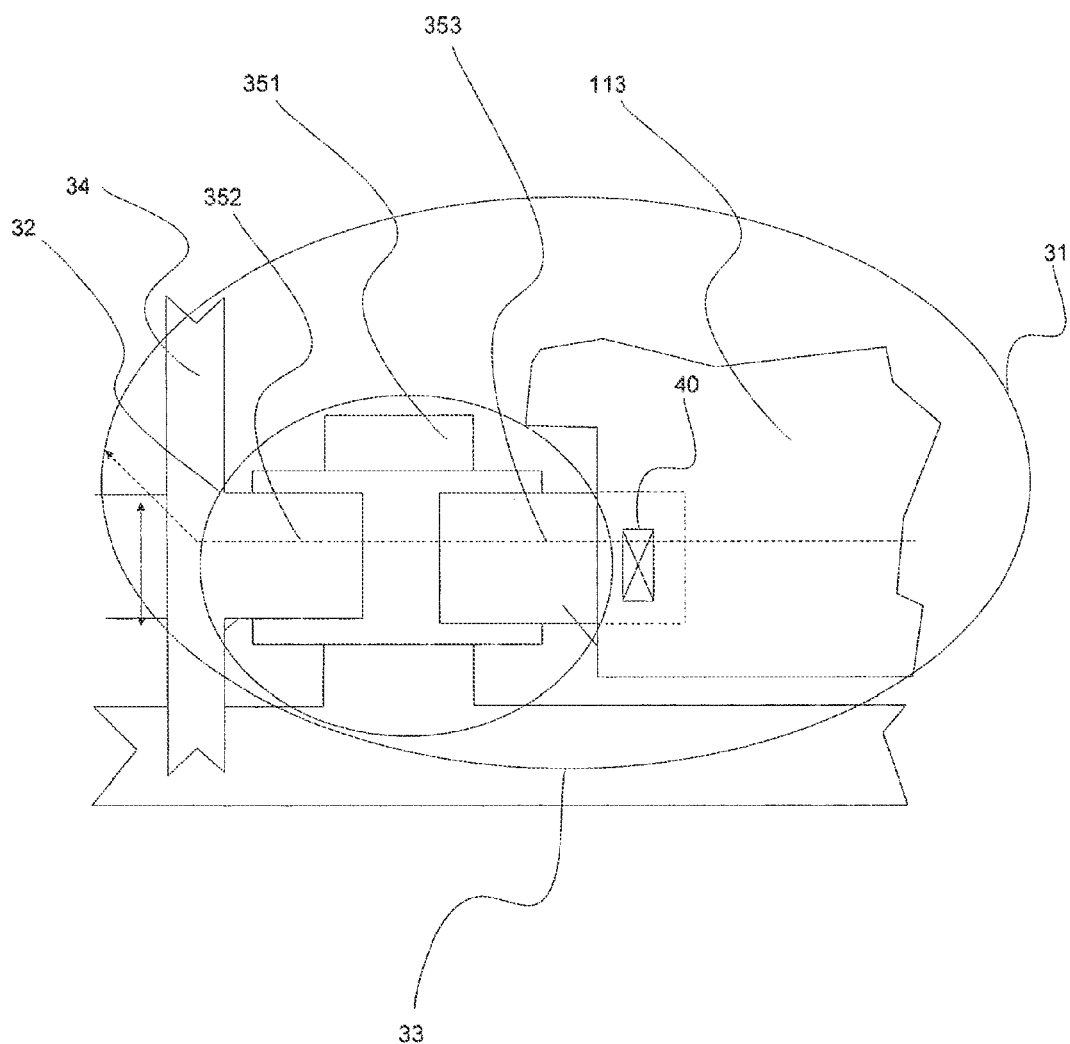
FIG. 4 illustrates a plan view of a pixel portion and a TFT portion.
Figure 5:
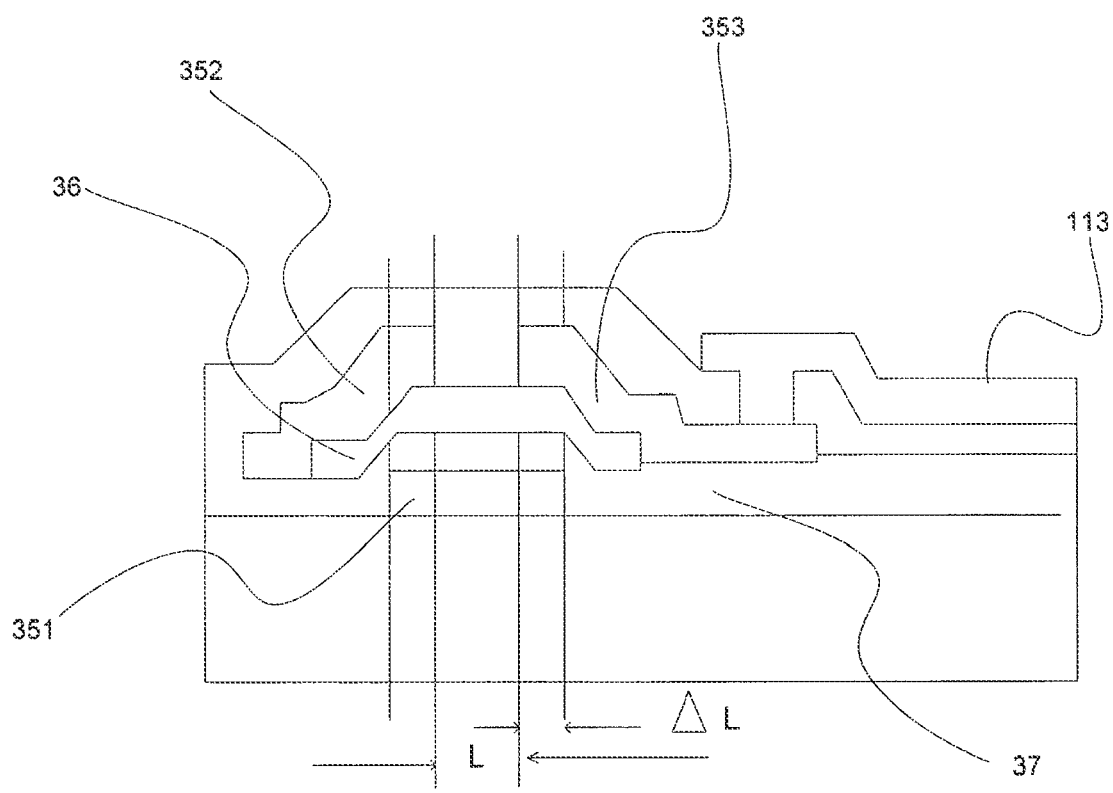
FIG. 5 illustrates a cross-sectional view of a pixel portion and a TFT portion.
Figure 6:
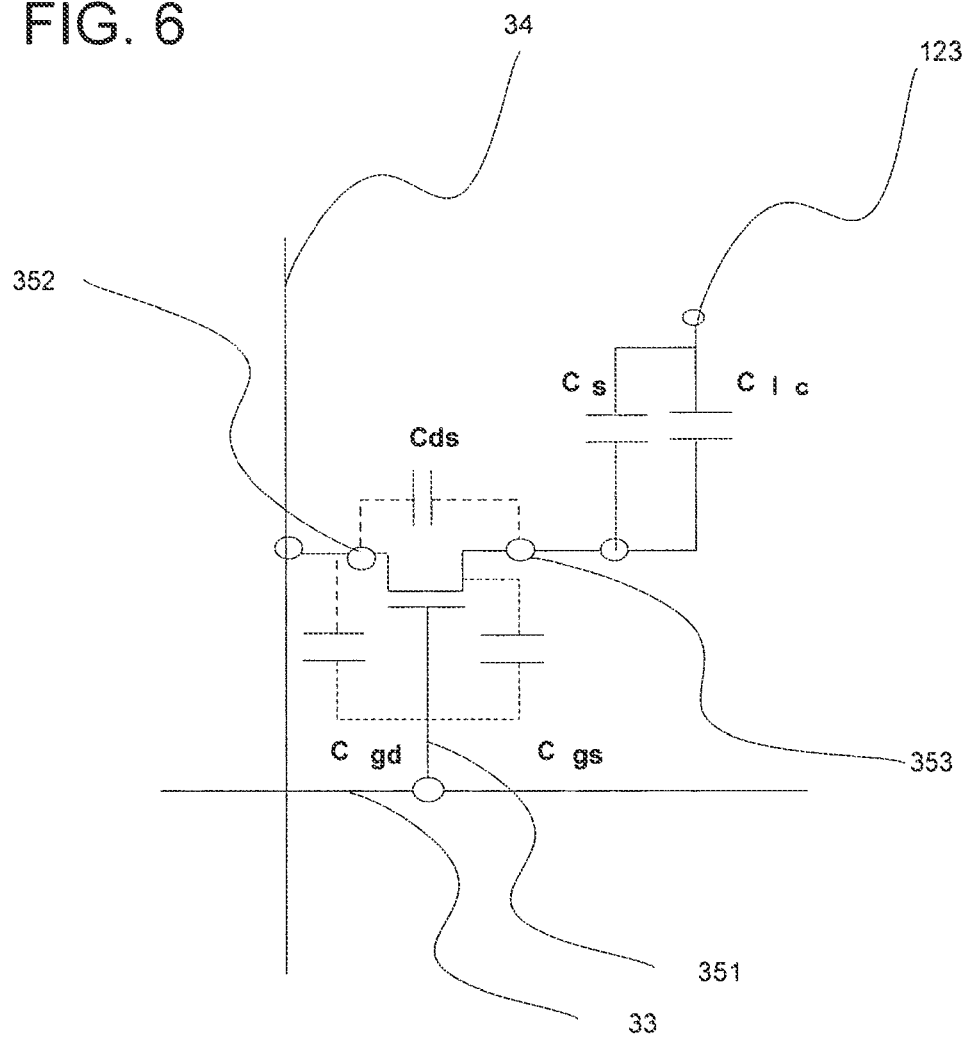
FIG. 6 illustrates a schematic diagram of an equivalent circuit for a pixel portion and a TFT portion.

FIGS. 4-6 illustrate respectively a plan view, a cross sectional-view, and a schematic diagram of an equivalent electrical circuit for a pixel portion 31 and a TFT portion 32. Each pixel portion 31 is connected to a gate interconnection 33 and a signal interconnection 34. Accordingly, as seen in the plan view of the FIG. 4, the TFT portion 32 has three electrodes such as a gate electrode 351, a source electrode 352 and a drain electrode 353. The drain electrode 353 is coupled to the pixel electrode 113 via a through hole 40.

As shown in FIG. 5, a thin film semiconductor material 36, such as amorphous silicon (a-Si), is disposed between the source electrode 352 and the drain electrode 353. The gate electrode 351 is located in proximity to the semiconductor layer 36 but electrically insulated therefrom by a gate insulator layer 37. The gate insulator layer 37 is made of silicon nitride ($SiN_x$) or silicon oxide ($SiO_x$) film. In other embodiments, the gate insulator layer 37 may be made from a laminated or an organic layer.

As discussed before, the schematic diagram of an equivalent electrical circuit for each pixel portion 31 is shown in FIG. 6. Parasitic capacitors C.sub.gs, C.sub.gd, and C.sub.ds are applied respectively between the gate electrode 351 and the source electrode 352, between the gate electrode 351 and the drain electrode 353, and between the drain electrode 353 and the source electrode 352. In this equivalent circuit, the liquid crystal layer 13, disposed between the common electrode 123 of CF substrate 12 and the TFT substrate 11, is represented by C.sub.lc. The storage capacitor $C_s$ is connected in parallel to the C.sub.lc capacitor to sustain the pixel electrode voltage during holding period.

Figure 7:
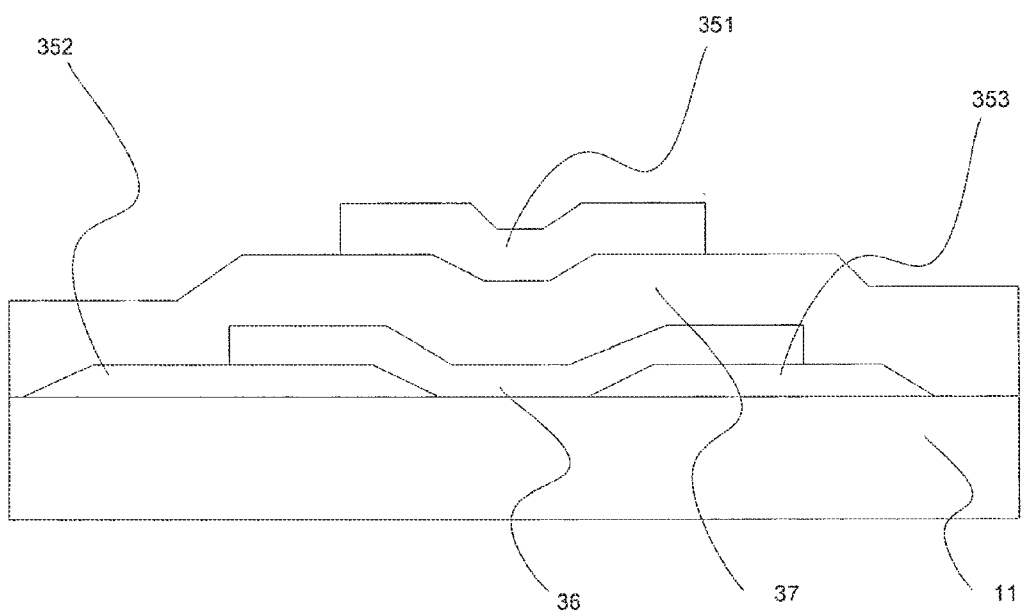
FIG. 7 illustrates a schematic diagram of an embodiment of a TFT structure (a top gate structure having a staggered type).
Figure 8:
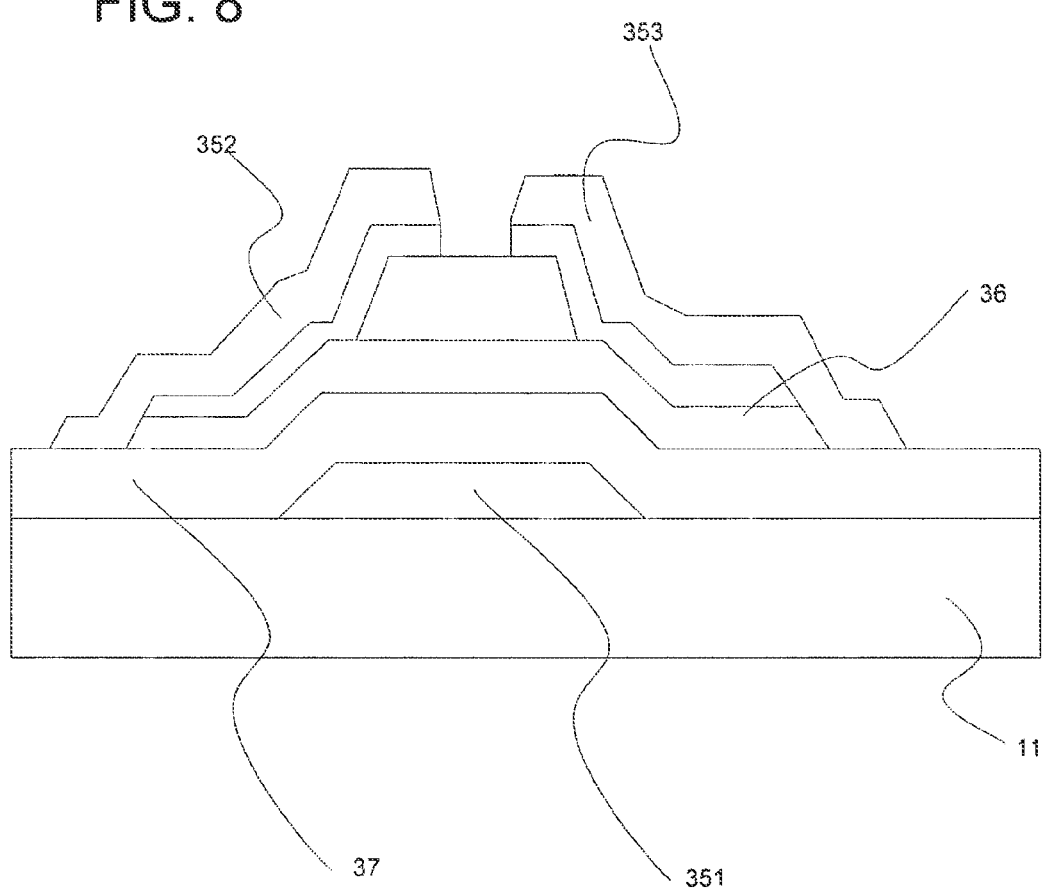
FIG. 8 illustrates a schematic diagram of an alternative embodiment of a TFT structure (a channel stopper structure having an inverted-staggered type).
Figure 9:
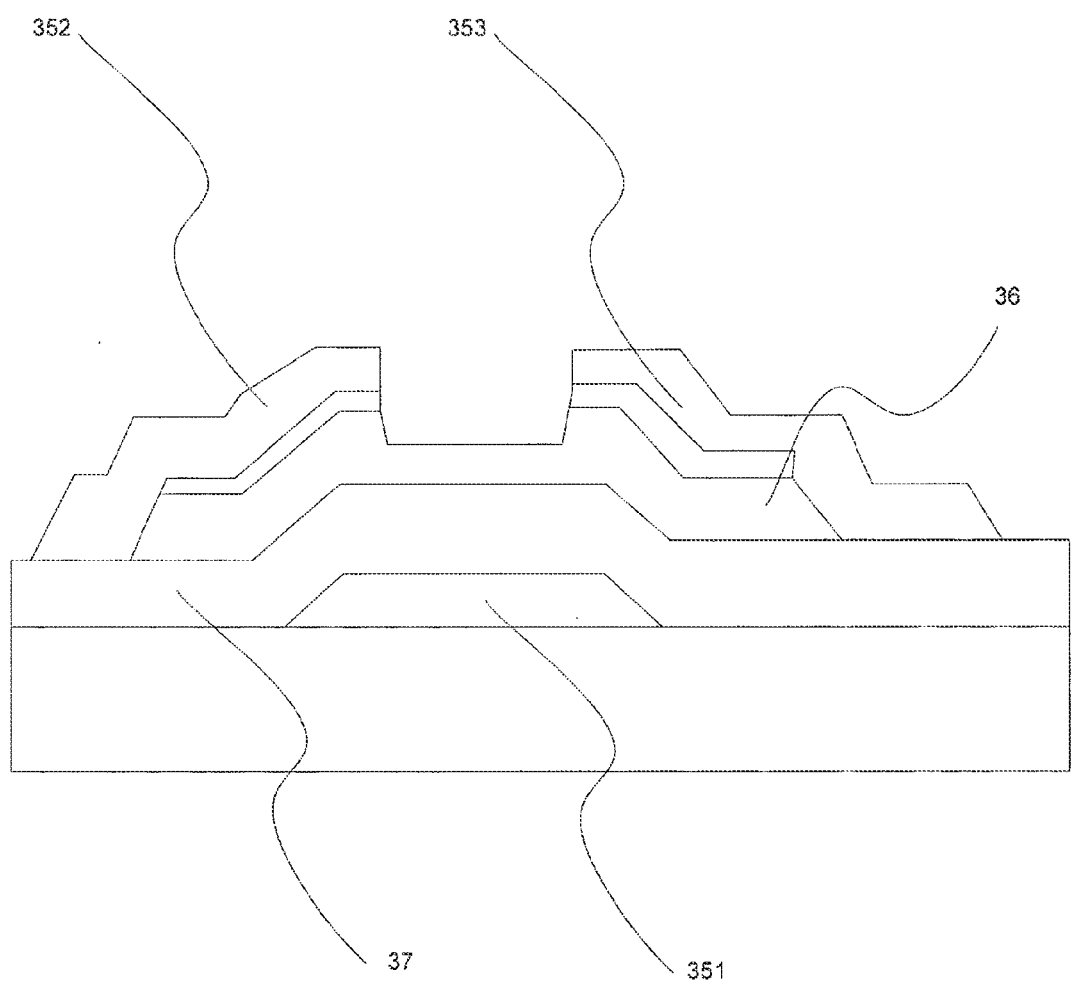
FIG. 9 illustrates a schematic diagram of an alternative embodiment of a TFT structure (a channel etch structure having an inverted-staggered type).

FIGS. 7-9 illustrate schematic diagram of alternative embodiments for a TFT structure made of amorphous silicon material (a-Si). By way of example, the TFT structure may be a top gate structure having a staggered type, a channel stopper structure having an inverted-staggered type, or a channel etch structure having an inverted-staggered type. Among these embodiments, the channel etch structure shown in FIG. 9 is the most commonly used structure.

[Gate Electrode]

Next, a technique for applying a copper alloy to a gate interconnection of a TFT electrode will be explained. As described above, the most commonly used configuration for TFT structures with amorphous silicon material is the inverted-staggered type with channel etch structure. In this embodiment, the gate electrode 351 is deposited on a glass substrate 11 by a sputtering method and patterns are formed by wet etching process. Thereby, the gate electrode 351 has a tapered shape in order to reduce mechanical stress.

In this embodiment, it is preferable to use an alkali-free glass as a glass substrate. Examples of composition for the alkali-free glass are shown below:

| Component | Content percentage (%) |
| --- | --- |
| SiO$_2$ | 49.9 |
| Al$_2$O$_3$ | 11.03 |
| B$_2$O$_3$ | 15.0 |
| Metal (such as Fe) | 25.0 |
| Alkali | — |

Figure 10:
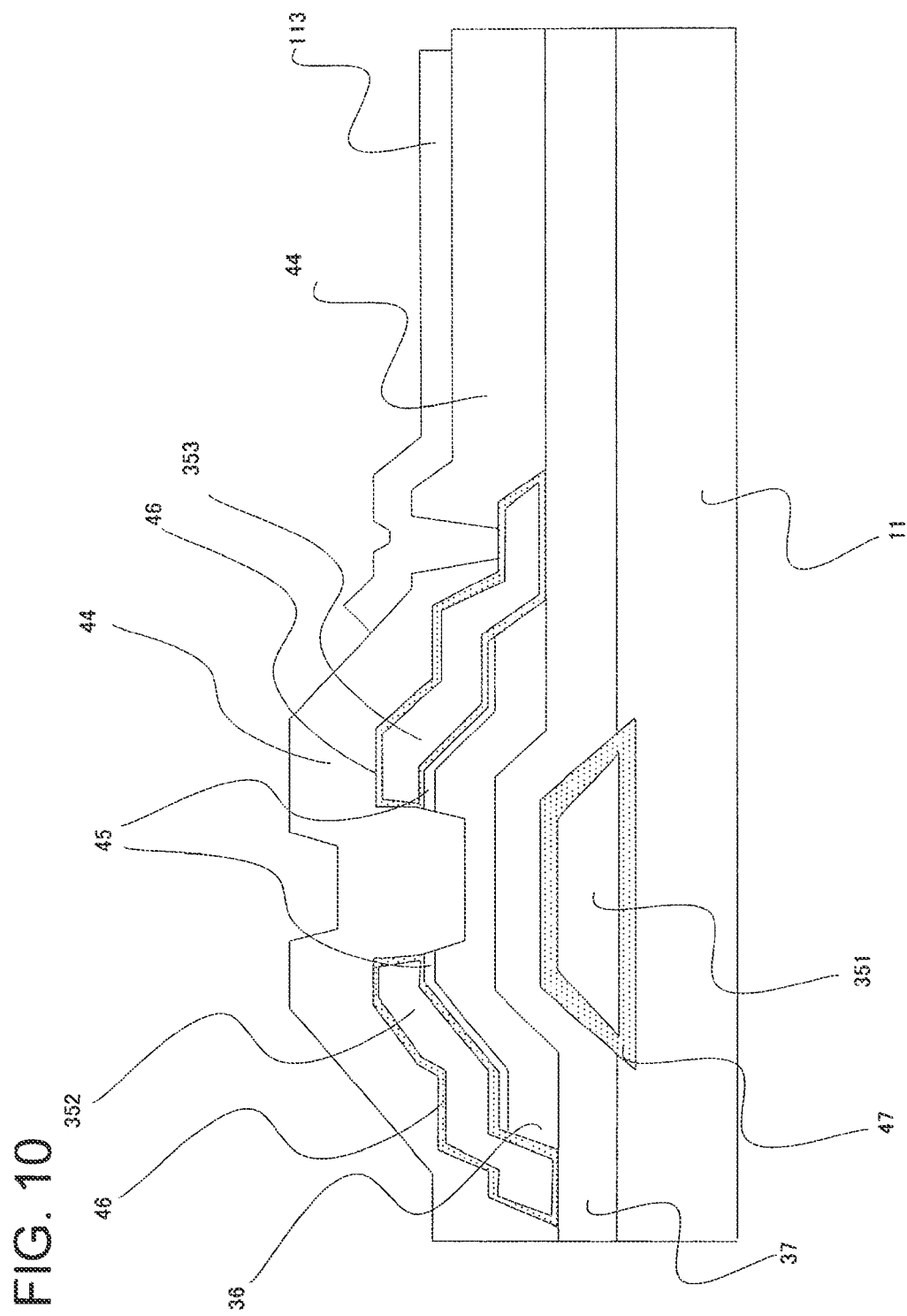
FIG. 10 illustrates a cross-sectional view of an embodiment of a pixel portion and a TFT portion.
Figure 12:
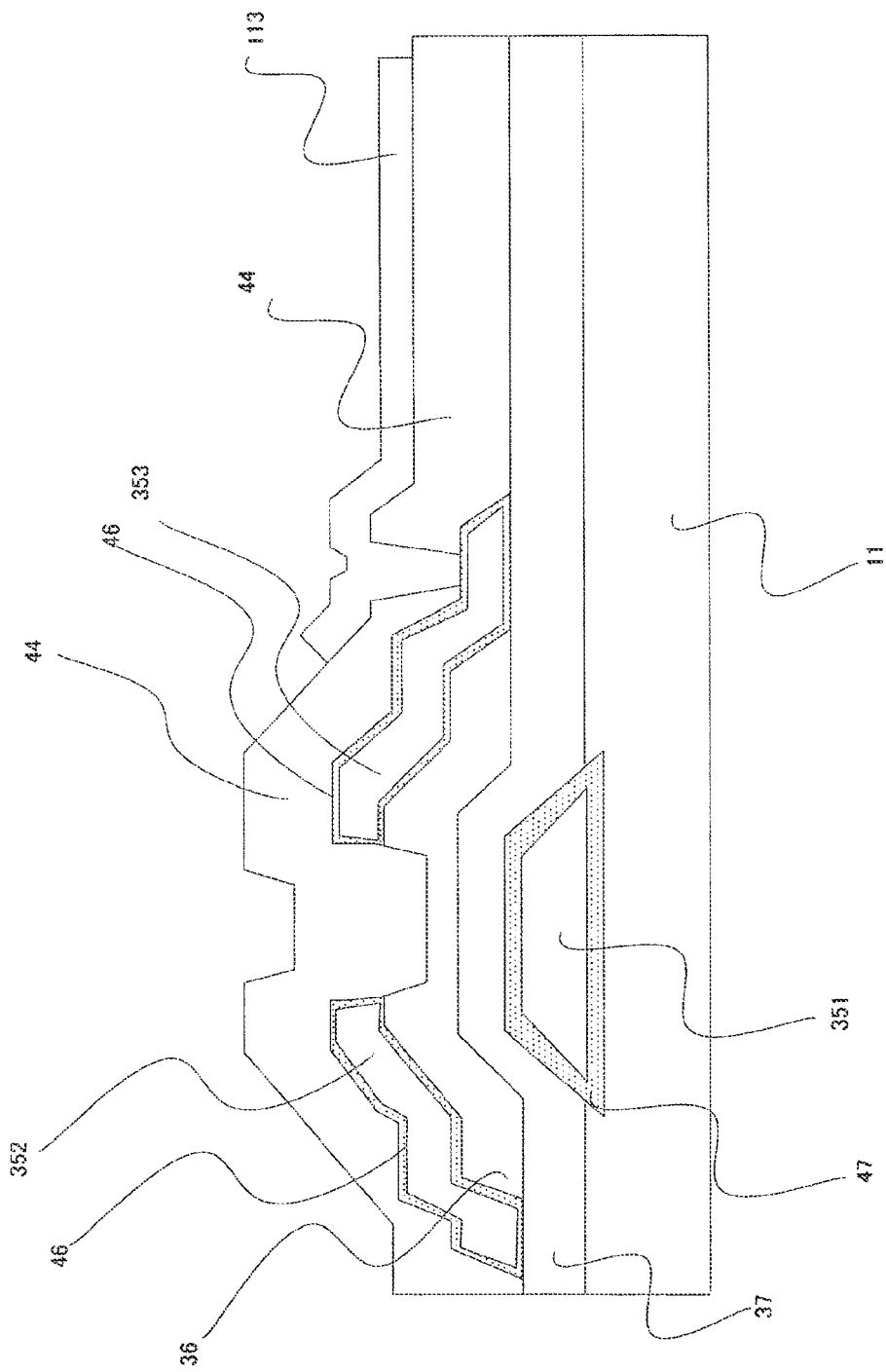
FIG. 12 illustrates a cross-sectional view of an embodiment of a pixel portion and a TFT portion.

A schematic diagram of a TFT structure using a copper (Cu) alloy as a gate electrode is shown in FIGS. 10 and 12. In this embodiment, manganese (Mn), which is an element for forming an alloy with copper (Cu), is used to form the copper (Cu) alloy layer of the gate electrode 351. Next, the process of forming an oxide layer over the gate electrode 351 is explained.

First, a Cu—Mn layer is deposited on the glass substrate 11 by a sputtering method. The thickness of the Cu—Mn alloy layer is about 200 nm. Then, a heat treatment is conducted on the glass substrate 11 at temperatures ranging from 200 to 450° C. for about 3 minutes to 50 hours in an atmosphere containing traces of oxygen. This heat treatment results in diffusing manganese (Mn) within the Cu—Mn alloy layer such that an oxide layer 47 is formed at the interface between the glass substrate 11 and a bottom surface of the Cu—Mn layer. In other words, the bottom surface of the Cu—Mn layer is covered by the oxide layer 47. The thickness of the oxide layer 47 at the interface between the Cu—Mn layer and the glass substrate 11 is about 2 to 10 nm. In fact, manganese (Mn), which is an additional element in copper (Cu) alloy layer, diffuses to the interface with the glass substrate 11 and reacts with silicon dioxide (SiO$_2$) forming an oxide layer 47 containing Cu, Mn and Si. This oxide layer may be represented by (Cu, Mn, Si)O$_x$. As a result of this oxide formation, the adhesiveness between the gate electrode 351 and the glass substrate 11 can be ensured. In addition, the existence of manganese oxide MnO$_x$ in the oxide layer 47 may further prevent copper (Cu) from diffusing into the glass substrate 11.

Meanwhile, on the top surface of the Cu—Mn layer, an oxide layer 47 containing Cu and Mn, e.g. (Cu, Mn)O$_x$, is formed by reaction with the oxygen in the surrounding atmosphere. In other words, the top surface of the Cu—Mn layer is covered by the oxide layer 47. Incidentally, this embodiment shows the structure where the oxide layer 47 sandwiches the gate electrode 351. This is because both the top and bottom surfaces of the gate electrode 351 are covered by the oxide layer 47. In the same manner, an additional heat treatment is conducted on the gate electrode 351 at temperatures about 200 to 450° C. in an atmosphere containing traces of oxygen so that oxide layer 47 is formed on the tapered portions of the gate electrode 351. In other words, the tapered portions of the gate electrode 351 are covered by the oxide layer 47. The overall thickness of the oxide layer 47 around the gate electrode 47 is about a few nanometer.

Other embodiments may use other methods for forming oxide layer on the gate electrode 351. For example, after forming the gate electrode 351, three layers of SiN/a-Si/n$^+$a-Si which represent respectively the gate insulating layer 37 and semiconductor layers 36 and 45, are successively deposited by plasma chemical vapor deposition (CVD) (hereinafter simply referred to as "plasma CVD"). During this deposition process, the substrate temperature is about 300 to 350° C., which is sufficient for applying the heat treatment. Thus, when the substrate temperature arrives to a point around 300 to 350° C., the substrate is placed into a plasma CVD chamber so that the oxide layer 47 can be formed in the atmosphere containing traces of oxygen. Therefore, at the interface with the glass substrate 11, the oxide layer 47 is formed in the same manner as described before.

Meanwhile, the oxide layer 47, containing Cu, Mn and Si, (Cu, Mn, Si) O$_x$, is also formed at the interface between the gate electrode 351 and the gate insulating layer 37. This oxide layer 47 can ensure the adhesiveness between the gate electrode 351 and the gate insulating layer 37, and further prevent the diffusion of Cu from the gate electrode 351 into the gate insulating layer 37. In an alternative embodiment, the gate insulating layer 37 is made of SiON. In this embodiment, Mn diffuses to the interface of the gate insulating layer 37 and reacts with oxygen in SiON and forms the oxide layer 47. The oxide layer 47 of this embodiment eventually results in an oxide layer containing Cu, Mn and Si, (Cu, Mn, Si)O$_x$, in the same way as described in the previous embodiment.

Since the Cu—Mn layer contains a fixed amount of Mn which diffuses to the surfaces of the Cu—Mn layer, due to the heat treatment, to form the oxide layer 47, the gate electrode 351 becomes very close to the pure Cu. For a heat treatment at temperatures ranging from 200 to 250° C. in the atmosphere containing traces of oxygen, the resistivity of gate electrode 351 is about 2.2 µΩcm, whereas the resistivity of bulk pure Cu is about 1.7 µΩcm. The resistivity of resulting gate electrode 351 is adequately lower than the resistivity of Al. Since gate interconnections are formed with low resistance gate electrodes 351, the propagation delay of the gate voltage pulse can be reduced, therefore reducing the non-uniformity of brightness of LCD due to shadings.

As described above, in this embodiment, the Cu—Mn is applied to the gate electrode 351, which is sandwiched between the glass substrate 11 and the gate insulating layer 37, in other words, between different types of insulating layers. Then, the oxide layer 47 is formed at the interface of insulating layers 11 and 37 covering the gate electrode 351. In this way, the oxide layer 47 prevents Cu from diffusively intruding into the glass substrate 11 and the gate insulating layer 37 while ensuring the adhesiveness between the gate electrode 351 and the insulating layers 11 and 37.

In addition, the formation of the oxide layer 47 covering the gate electrode 351 results in achieving a low resistivity close to the resistivity of pure copper and therefore reducing the shading of displayed images.

Furthermore, whereas conventional Cu interconnections use three deposited layers of Cu alloy/pure Cu/Cu alloy, the present embodiment can use a single deposited layer of copper alloy, e.g. Cu—Mn. Therefore, the present invention is effective in shortening the deposition process and reducing the manufacture cost.

[Source Electrode or Drain Electrode]

With reference to FIGS. 10-13, embodiments of the present invention will be explained in terms of manufacturing process for applying a copper alloy, e.g. Cu—Mn, to the source electrode 352 or drain electrode 353 of the TFT 111 within the TFT-LCD module of the present invention.

A semiconductor layer for the present invention includes, for example, amorphous silicon (a-Si) layer or heavily doped amorphous silicon (n$^+$a-Si) layer which contains impurities, and the like.

As explained above, after forming the gate electrode 351, three layers including a gate insulating layer 37, e.g. SiN, and two semiconductor layers 36 and 45 are successively deposited over the gate electrode 351 and the TFT substrate 11. Examples of semiconductor composition, used in the present invention, may include amorphous silicon (a-Si) or heavily doped amorphous silicon (n$^+$a-Si). Then, a dry etch method is used to form a desired pattern on the gate insulating layer 37 and the semiconductor layers 36 and 45. After the patterning step, a copper alloy layer, e.g. Cu—Mn, is deposited by a sputtering method. Using a wet etch process, desired patterns for the source electrode 352 and the drain electrode 353 are formed. After the patterning step, a heat treatment is applied at temperatures ranging from 200-450° C. and in an atmosphere containing traces of oxygen. Due to this heat treatment, an oxide layer 46 covering the source electrode 352 and the drain electrode 353 is formed. Here, the top, bottom and side surfaces of the source electrode 352 and the drain electrode 353 are covered by the oxide layer 46. This embodiment also shows the structure where the oxide layer 46 sandwiches the source electrode 352 and the drain electrode 353 respectively. This is because both the top and bottom surfaces of the source electrode 352 and the drain electrode 353 are covered by the oxide layer 46. The oxide layer 46 has a thickness of few nm and contains Cu, Mn, and Si, (Cu, Mn, Si)$O_x$, or Cu and Mn, (Cu, Mn)$O_x$, depending on which interface the oxide layer 46 is formed. At the interface where the source electrode 352 or the drain electrode 353 has a direct contact with the gate insulator layer 37, e.g. SiN, or the semiconductor layers 36 and 45, e.g. a-Si or n$^+$a-Si, the oxygen remaining in the insulating layers 36, 37, and 45 reacts with the Mn from the Cu—Mn layer to form the oxide layer 46.

After the heat treatment step, a passivation layer 44 is deposited over the TFT structure 111 and the gate insulator 37 such that the source electrode 352 and the drain electrode 353 are sandwiched between the passivation layer 44 and the semiconductor layers 45 or 36. This deposition step is performed at a substrate temperature ranging from 250-300° C. by a plasma CVD deposition process. Different embodiments may use different composition for the passivation layer 44. Examples of those compositions may include silicon nitride (SiN$_x$), silicon oxide (SiO$_x$), silicon nitrogen oxide (SiN$_y$O$_x$), or organic layer, such as polyimide with a high fluidity. Desired pattern for the passivation layer 44 is also formed by an etching process. As the deposition process is formed at temperatures ranging from 250-300° C., the oxide layer 46 containing Cu, Mn, and Si, (Cu, Mn, Si)$O_x$, can be eventually formed at the interface between the passivation layer 44 and the source electrode 352 or the drain electrode 353. This additional oxide layer may have a thickness of a few nm.

In an alternative embodiment, the step of passivation layer deposition may be performed, directly after the source and drain patterning step, without performing a heat treatment. In this embodiment, Mn in the Cu—Mn layer diffuses thermally due to a heat generated from the deposition process, which is performed at a substrate temperature ranging from 250-300° C. Therefore, the oxide layer 46 with a thickness of a few nm is formed around the source electrode 352 or the drain electrode 353, as shown in FIGS. 10-13.

The resulting oxide layer 46 ensures the adhesiveness between the source electrode 352 or the drain electrode 353 with the insulating layers 37 or 44, as well as the semiconductor layers 36 or 45. In addition, the oxide layer 46 functions as a high-resistivity conducting layer, such that the oxide layer 46 does not become an inhibitor against the ohmic contact between the semiconductor layer 45, e.g. n$^+$a-Si, and the source electrode 352 or the drain electrode 353.

The high-resistivity conducting oxide layer 46 is primarily due to the fact that Cu and Si are also diffusing thermally from the Cu alloy layer and the surrounding semiconductor or insulating layers 36, 37, 44, or 45 toward the interfacial oxide layer 46. In addition, using an aging process, a voltage within a tens of volts range is applied to the source electrode 352 or the drain electrode 353 so that the insulating property of the oxide layer 46 with a few nm thickness breaks down. As a result, the oxide layer 46 functions as a conductive layer ensuring an ohmic contact between the source or drain electrodes 352 or 353 and the semiconductor layers 36 or 45.

Furthermore, the source electrode 352 or the drain electrode 353 may have low-value resistance, close to the resistance of pure copper, in the same way described above in regards to the gate electrode 351. This low value resistivity of respective electrodes enables the TFT structure of the present invention to reduce the propagation delay and its related disadvantages. In addition, depositing a single layer of copper alloy, e.g. Cu—Mn, in the present invention may shorten the deposition process, having an effect of reducing cost compared with the conventional ways.

Different embodiments of TFT structure may result from the manufacturing process described above, which are respectively shown in FIGS. 10-13.

Referring next to FIG. 10, a cross-sectional view of an embodiment of a TFT portion 32 and a pixel portion 31 is shown. In this embodiment, the source electrode 352 and the drain electrode 353 are covered with the oxide layer 46. The semiconductor layer is composed of two layers; an amorphous silicon (a-Si) layer 36 and an amorphous silicon (n$^+$a-Si) layer 45 which is doped with an impurity at high concentration. In addition, the gate electrode 351 is surrounded by the oxide layer 47.

Figure 11:
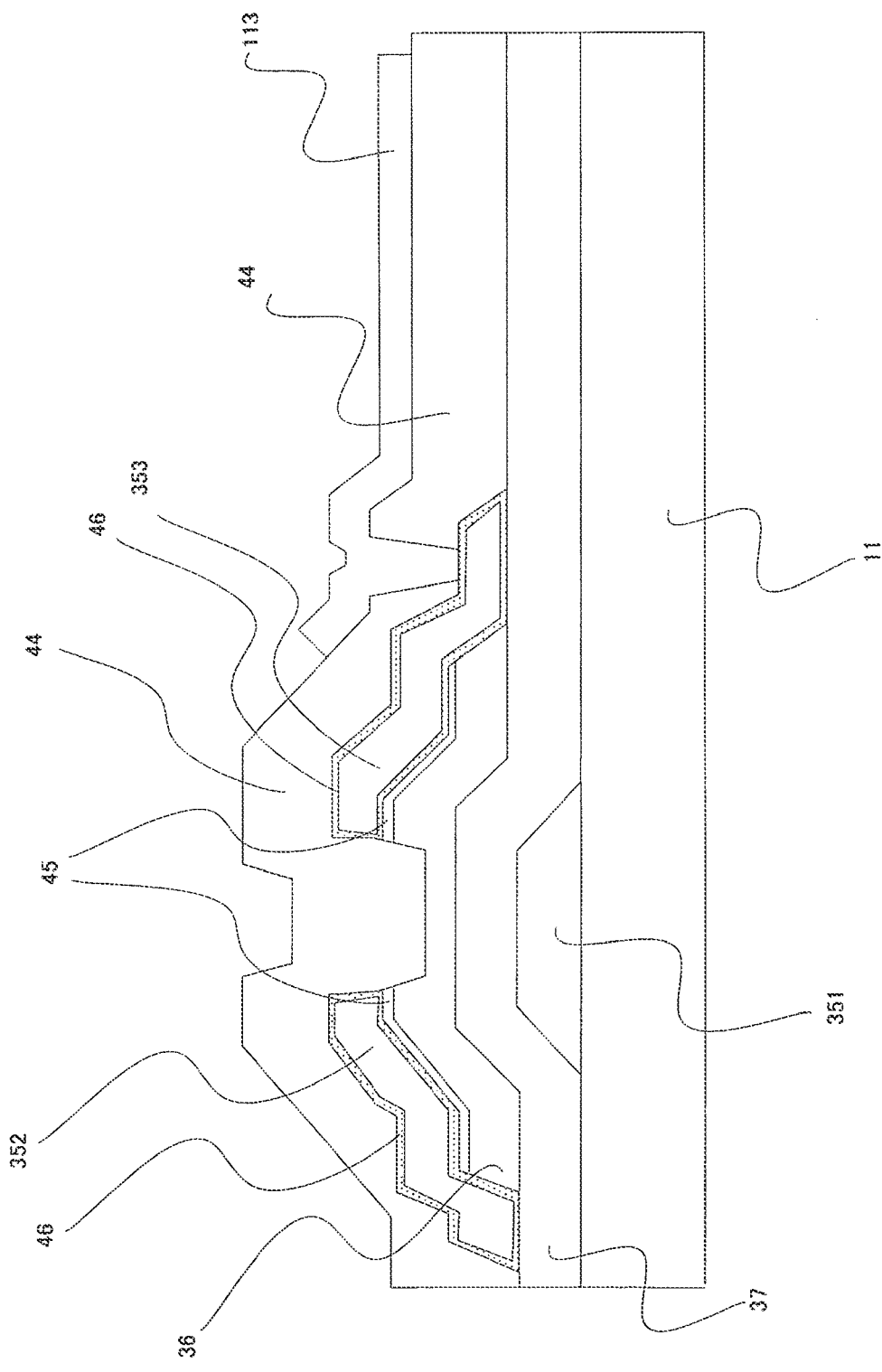
FIG. 11 illustrates a cross-sectional view of an alternative embodiment of a pixel portion and a TFT portion.

With reference to FIG. 11, a cross-sectional view of another embodiment of a TFT portion 32 and a pixel portion 31 is shown. This embodiment differs from that of FIG. 10 in that the electrode 351 is not surrounded by any oxide layer.

FIG. 12 illustrates a cross-sectional view of an alternative embodiment of a TFT portion 32 and a pixel portion 31. This embodiment differs from that of FIG. 12 in that the semiconductor layer is composed of one single amorphous silicon layer (a-Si) 36. In addition, the gate electrode 351 is surrounded by the oxide layer 47.

Figure 13:
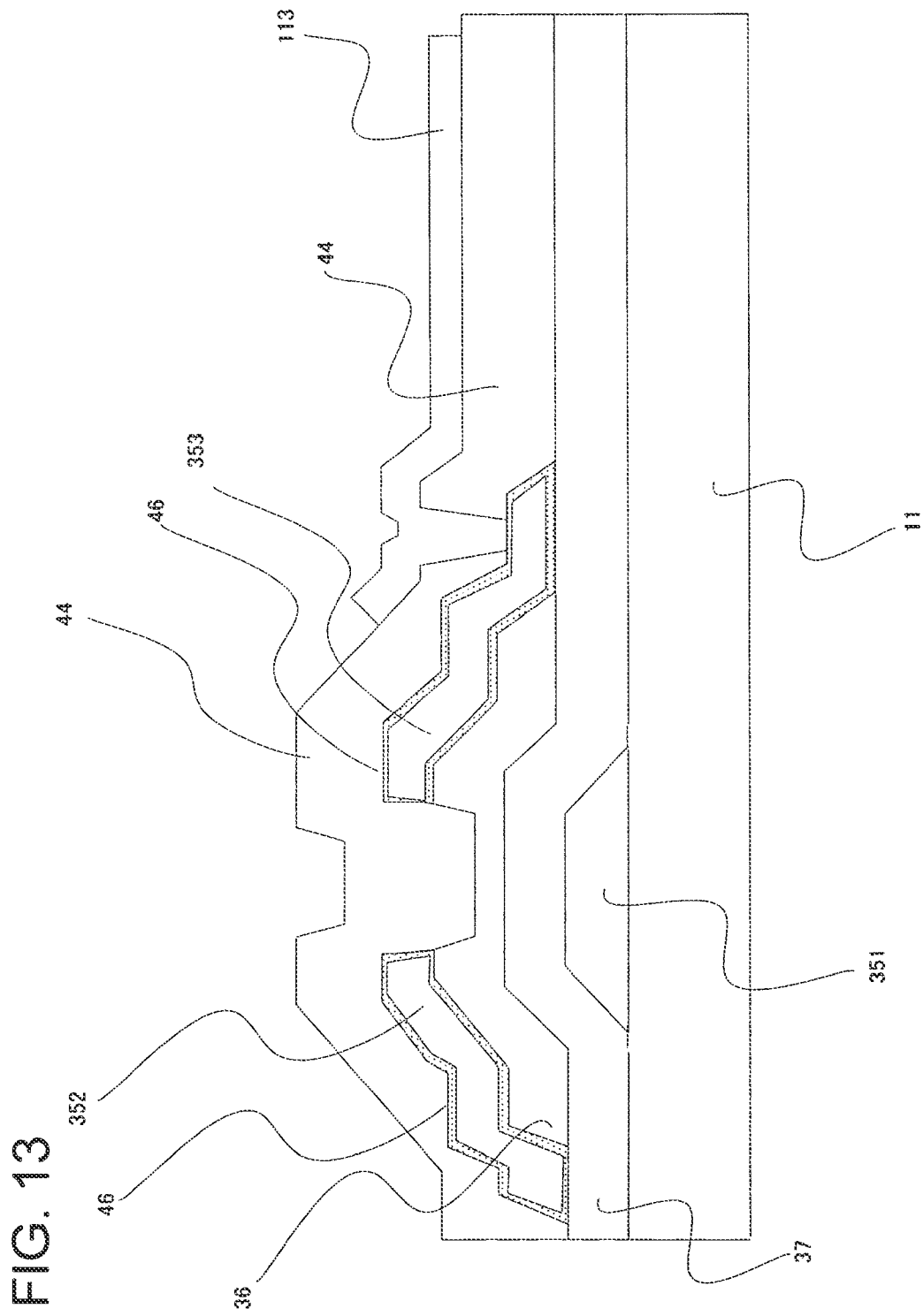
FIG. 13 illustrates a cross-sectional view of an embodiment of a pixel portion and a TFT portion.

FIG. 13 illustrates a cross-sectional view of another alternative embodiment of a TFT portion 32 and a pixel portion 31. In this embodiment, the semiconductor layer is composed of one single amorphous silicon layer (a-Si) 36, however the gate electrode 351 is not surrounded by any oxide layer 47. It has to be noted that similar effects may be obtained in different embodiments of FIGS. 10-13 using a microcrystal silicon as semiconductor layers 36 and 45. In addition, the pixel electrode 113, common to the different embodiments of FIGS. 10-13, may include, for example, indium tin oxide (ITO), indium zinc oxide (IZO), or indium zinc tin oxide (ITZO), and the like.

The TFT having the above-described embodiments, FIGS. 10-13, may be manufactured in an alternative process, described as below; First, a thin silicon oxide layer SiO$_x$ having a thickness of about 1-2 nm is formed on a top surface of the semiconductor layers 36 or 45 (for example, amorphous silicon (a-Si) or amorphous silicon doped with an impurity at high concentration (n+a-Si)). Different process may be used to form the silicon oxide layer SiO$_x$ of the present invention. By way of example, an ozone oxidation method or a plasma oxidation method may be used. According to another embodiment of the present invention, an alternative method is provided for forming the silicon oxide layer SiO$_x$. The method includes attaching a hydroxy group (—OH) on the top surface of the semiconductor layer 36 or 45 by spraying moisture vapor.

Then a copper alloy layer, e.g. Cu—Mn, is formed over the silicon oxide layer SiO.sub.x. After forming the copper alloy layer, a heat treatment is applied at temperatures ranging from 200-350° C. As a result of this heat treatment, Mn from the Cu—Mn layer migrates into the silicon oxide layer, interposed between the semiconductor layer 36 or 45 and the copper alloy layer, forming an oxide layer 46 containing Mn, Cu, and silicon, (Mn, Cu, Si)$O_x$. The resulting oxide layer 46 may have a thickness of a few nm and the main component of the oxide layer 46 is $MnO_x$.

(Ohmic Contact)

The resulting oxide layer 46 may have a high-value electrical resistance that functions as a conductive layer. This conductive layer ensures an ohmic contact at the interface between the semiconductor layer 36 or 45 and the source electrode 352 or the drain electrode 353. The source electrode 352 or the drain electrode 353 is mainly composed of copper.

Figure 14:
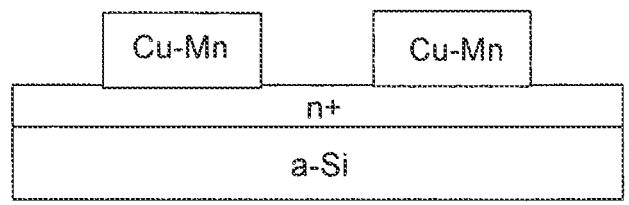
FIG. 14 illustrates a schematic diagram of a cross-sectional view of an experimental sample.

Referring next to FIG. 14, a schematic diagram of a cross-sectional view of an experimental sample is shown. The experimental sample of FIG. 14 is manufactured using the process explained above with respect to FIGS. 10-13. An amorphous silicon semiconductor layer doped with an impurity at high concentration ($n^+$a-Si) is formed on an amorphous silicon (a-Si) semiconductor layer. Then, a silicon dioxide layer ($SiO_2$) is formed on the top surface of the $n^+$a-Si layer, by using the plasma oxidation process. In this embodiment, the thickness of the $SiO_2$ layer is about 1.5 nm. After the oxidation step, a Cu—Mn layer is deposited over the $SiO_2$ layer and patterned using an etching process in order to obtain two Cu—Mn electrodes. After the patterning step, a heat treatment is conducted at 250° C. for 30 minutes in an atmosphere containing traces of oxygen. According to this heat treatment, a $MnO_x$ layer containing traces of Cu and Si is formed. The resulting $MnO_x$ layer has a thickness about 1-2 nm, which surrounds both of the Cu—Mn electrodes.

Also referring to FIG. 14, the a-Si layer gets a process of plasma oxidation in order to form $SiO_2$ having thickness in 1.5 nm. CU-4 atm % Mn alloy is deposited. A heat treatment at 250° C. for 30 minutes is conducted in an atmosphere containing a trace of oxygen. A distance between pads is 40 nm. A contact resistance is 0.85 $cm^2$.

Figure 15:
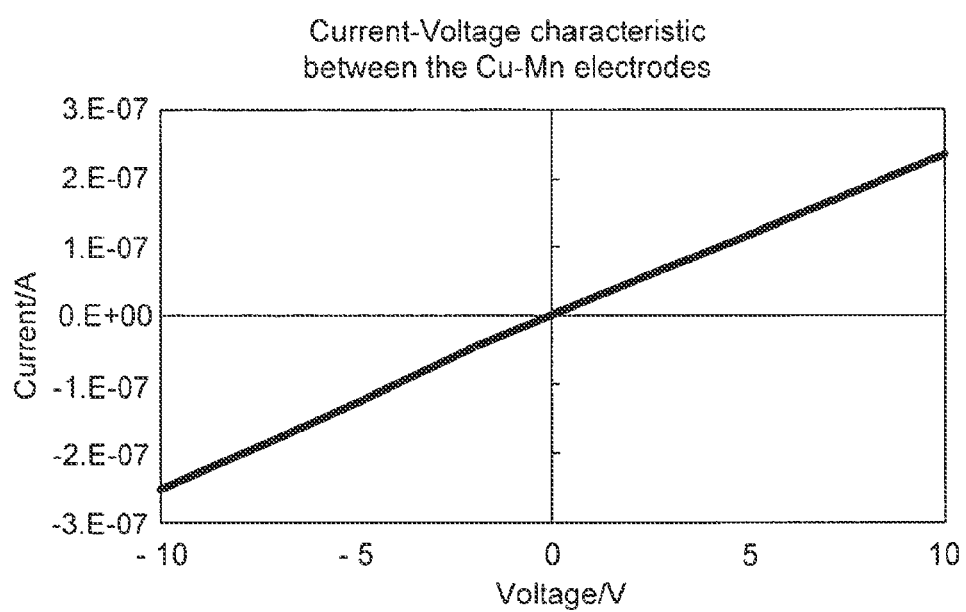
FIG. 15 illustrates a voltage-current characteristic between Cu—Mn electrodes.

Then, voltage is applied between the two Cu—Mn electrodes of the experimental sample, to measure the electrical current there between. FIG. 15 illustrates the current-voltage (I-V) characteristic of the experimental sample. As shown in FIG. 15, the current-voltage characteristic between the Cu—Mn electrodes is substantially linear within ±10 volts. More particularly, an ohmic contact is obtained between the Cu—Mn electrodes when the applying voltage is within ±5 volts. Accordingly, the metal-semiconductor contact, formed between the Cu—Mn electrodes and the $n^+$a-Si semiconductor layer, represents an ohmic contact characteristic when the applied voltage between the Cu—Mn electrodes is within .+−.10 volts. These results will apply to the TFT structure of the present invention where the ohmic contact is formed between the source or drain electrodes 352 or 353 and the semiconductor layers 36 or 45.

In the TFT structure of the present invention, it is necessary to obtain an stable connection within pixels of the TFT-LCD module. Therefore, it is desirable to obtain an ohmic contact between the source or drain electrodes 352 or 353 and their corresponding semiconductor layers 36 or 45. In different embodiments of present invention, the source and drain electrodes 352 and 353 are mainly composed of Cu, which are covered by the oxide layer 46. The oxide layer 46 is mainly composed of MnOx with a high-value electrical resistivity to ensure the realization of ohmic contacts within the TFT structure.

Figure 16:
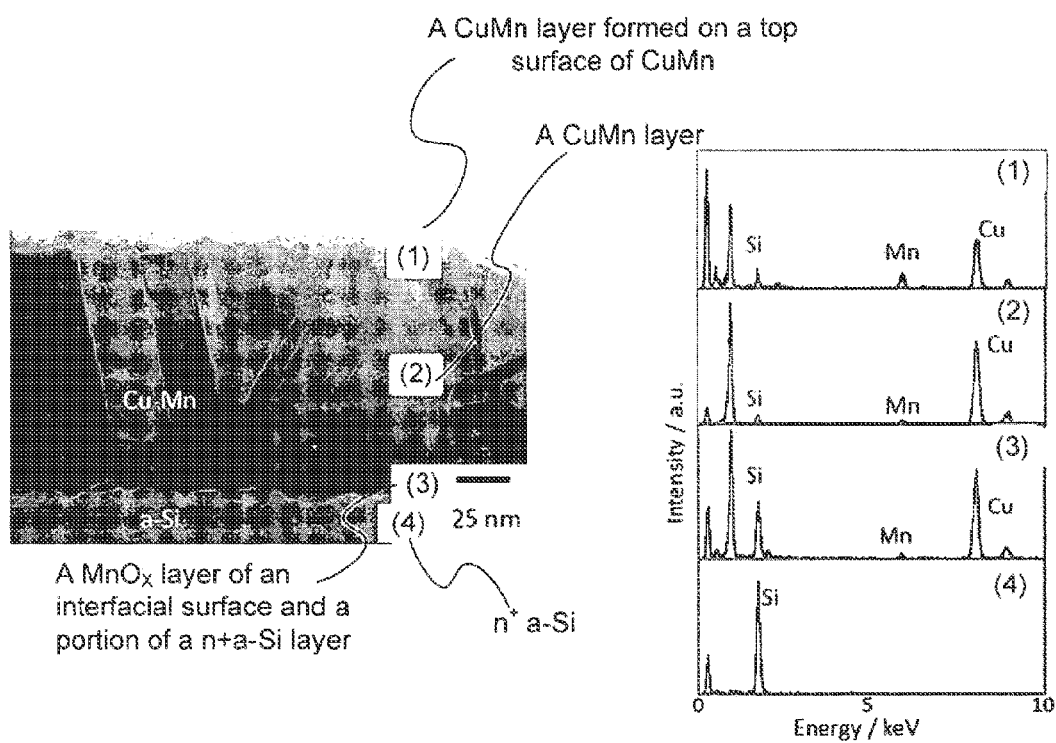
FIG. 16 illustrates a cross-sectional TEM image of the experimental sample and its XEDS spectra.

A cross-sectional TEM image of the experimental sample with its XEDS spectra is shown in FIG. 16. The sample surface (1) shows the formation of a $MnO_x$ layer of few nm in average thickness. In addition, the interface with $n^+$a-Si layer shows another $MnO_x$ layer of few nm in average thickness. The XEDS spectra of FIG. 16 are taken from (1) the surface layer of the experimental surface, (2) the Cu—Mn inside layer, (3) the $MnO_x$ layer formed at the interface with the $n^+$a-Si layer, and from (4) the $n^+$a-Si inside layer.

A weak Si peak is observed in both (1) and (2) spectra. This is mainly due to the excitation of the Si peak from the dead layer of the XEDS detector. Thus, a weak Si peak in both spectra should be neglected. In addition, the Cu peak in spectra (1) is mainly due to the radiation of electron beam in the Cu—Mn layer. Therefore, the Cu peak in spectra (1) should be neglected. The XEDS analysis shown in FIG. 16 (1) confirms that the surface layer consists of Mn and O, indicating the formation of the upper surface $MnO_x$ layer. The spectrum from the Cu—Mn inside layer in FIG. 16 (2) shows no Si and Mn, indicating that Mn atoms are expelled from the Cu—Mn layer and the Cu—Mn electrodes of the experimental sample are mainly made of Cu. FIG. 16 (3) shows Si, Mn, and Cu peaks, indicating the formation of a $MnO_x$ layer at the interface with the $n^+$a-Si layer. The spectrum from the $n^+$a-Si inside layer in FIG. 16 (4) shows only Si peaks, indicating a good diffusion barrier property of the $MnO_x$ layer at the interface with the $n^+$a-Si layer.

Figure 17:
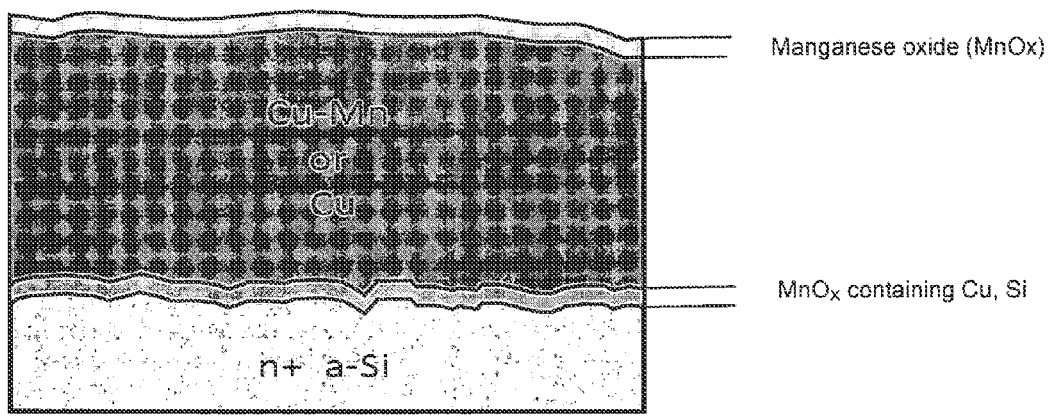
FIG. 17 illustrates a schematic diagram of the experimental sample.

The XEDS spectra of FIG. 16 are taken from (1) the surface layer of the experimental surface, (2) the Cu—Mn inside layer, (3) the $MnO_x$ layer formed at the interface with the $n^+$a-Si layer, and from (4) the $n^+$a-Si inside layer. In summary, Mn mainly exists in the surface layer of the experimental sample (1) forming a $MnO_x$ layer The amount of Mn in the Cu—Mn inside layer (2) and the $MnO_x$ layer formed at interface with the $n^+$a-Si layer (3) are substantially the same. The $MnO_x$ layer at the interface with the $n^+$a-Si layer is extremely thin. A schematic diagram of the experimental sample zoomed at the Cu—Mn electrode with its respective interfaces is shown in FIG. 17.

Also referring to FIG. 16, depicted is an enlarged picture of a contact portion between CuMn and a semiconductor layer, and a result of analysis of each portion by XEDS. XEDS: X-ray energy-dispersive spectroscopy. Cu-2 atom % mn150 nm/$SiO_2$1.5 nm/n+/a-Si350° C., 30 mn. Interdiffusion is not found. Mn mainly exists in the surface. The amount of Mn in the Cu—Mn layer and the amount of Mn in the interfacial surface are substantially same.

Figure 18:
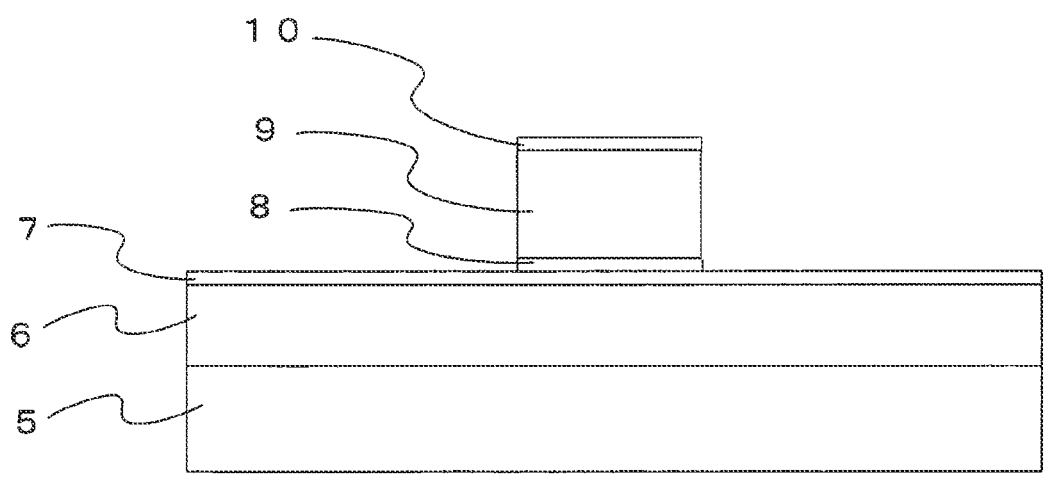
FIG. 18 is a cross-sectional view of an embodiment of an interfacial surface model of the experimental sample.

Referring next to FIG. 18, a cross-sectional view of an interfacial surface model of the experimental sample is shown. The interfacial surface model of FIG. 18 is obtained according to the experimental results conducted on the experimental sample and explained through FIGS. 14-17. As shown in FIG. 18, after depositing a $n^+$a-Si layer 6 over the a-Si layer 5, a plasma oxidation method is used to form an extremely thin, e.g. 1-2 nm, $SiO_x$ layer 7. Then, the Cu—Mn layer 9 is formed on the $SiO_x$ layer 7. After depositing the Cu—Mn layer 9, a heat treatment is conducted at about 200-350° C. on the stacked layers. As a result of this heat treatment, oxide layers 8 and 10 are formed respectively at the interface with the $n^+$a-Si layer 6 and the surface layer of the Cu—Mn layer 9. The main element of the oxide layer 8 is Mn, but other elements such as Cu and Si are also included in its composition. In addition, the oxide 8 may have a thickness of about 2 to 3 nm. The oxide layer 10 formed on the top surface of the Cu—Mn layer 9 is composed of $MnO_x$.

Figure 19:
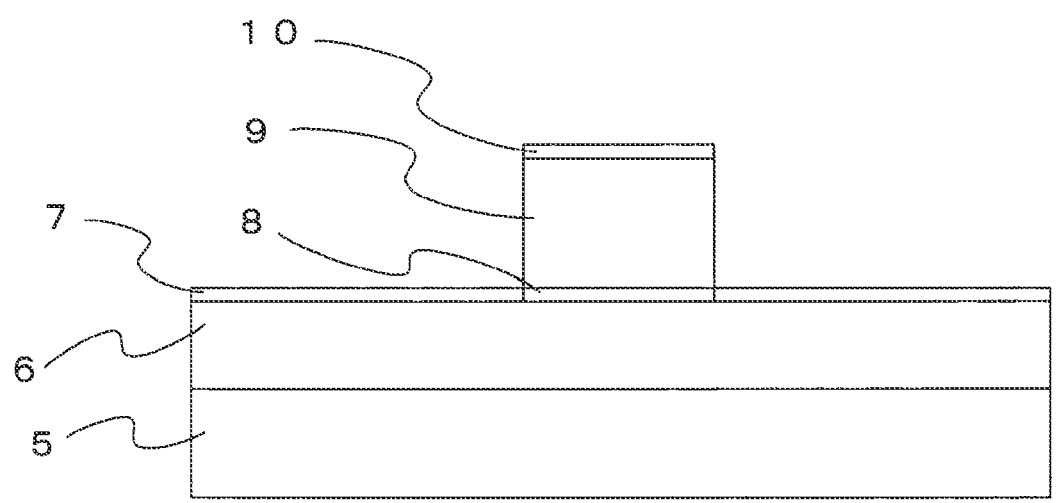
FIG. 19 is a cross-sectional view of an alternative embodiment of an interfacial surface model.

According to the experimental results explained in FIGS. 14-15, an ohmic contact at the interface between the Cu—Mn layer 9 and the $n^+$a-Si layer 6 may be realized, despite the existence of the oxide layers 7 and 8 with a total thickness of about 5 nm. In other words, generally, in a case where an oxide layer is interposed between a metal layer and a semiconductor layer, there is a possibility that the metal-semiconductor becomes a Schottky contact or an ohmic contact. However, the metal-semiconductor contact pertaining to the resent invention is confirmed to be an ohmic contact. Therefore, the source electrode 352 and the drain electrode 353 of TFT structures pertaining to the present invention may represent the linear current-voltage characteristic of an ohmic contact. FIG. 19 illustrates a cross-sectional view of an alternative embodiment of an interfacial surface model of the experimental sample. This embodiment differs from that of FIG. 18 in that the $MnO_x$ layer 8 and the $SiO_x$ layer 7 are merged together. As Cu and Si may diffuse from Cu—Mn layer 9 and $SiO_x$ layer 7 or $n^+$a-Si layer 6 into the $MnO_x$ layer 8, the resulting oxide layer 8 may also contain Cu and Si.

In what follows a technique for applying the Cu alloy to a terminal electrode of the LCD display panel 1 will be explained. Referring back to FIG. 1, a terminal electrode is used to connect the LCD display panel 1 to the driver circuit 2, via the LCD driver LSI chip 21. In the TFT-LCD module of the present invention, the terminal electrodes associated with the gate interconnection 33 and the signal interconnection 34 (see FIG. 4) are made of copper alloy, e.g. Cu—Mn. As will be described further below, the terminal electrodes made of copper alloy are covered by an oxide layer formed during manufacturing process.

Different embodiments of terminal electrode structure are shown in FIGS. 20-24. In these embodiments, the terminal electrode 66 is covered by an oxide layer 47, which is mainly composed of manganese (MnOx). Additionally, the oxide layer 47 may also include copper (Cu) or silicon (Si) and the like, which makes the terminal electrode 66 more stable in the atmosphere. With regard to the connectivity with the driver circuit 2, since the oxide layer 47 has a thickness of about a few nm, sufficient conductive properties may be obtained through the contact portions by thermo-compression bonding or voltage application. Furthermore, when the oxide layer 47 is formed on the TFT substrate 11, e.g. glass, the terminal electrode 66 may obtain a sufficient adhesiveness with the TFT substrate 11.

Figure 20:
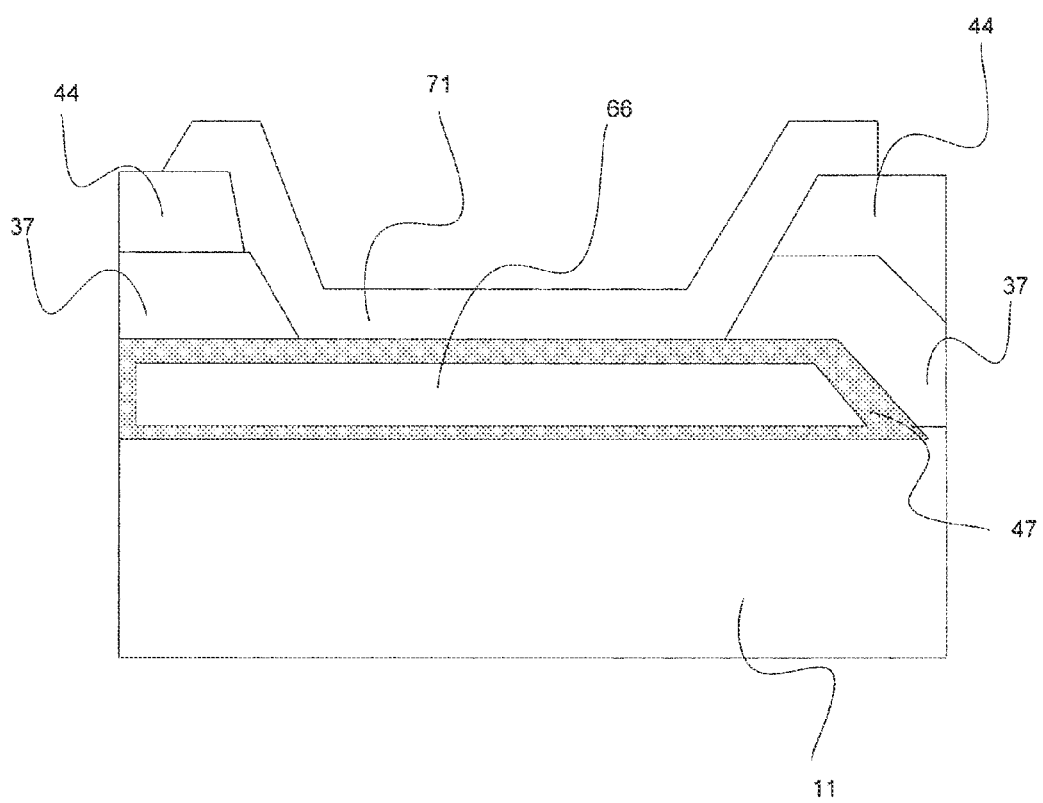
FIG. 20 illustrates a cross-sectional view of an embodiment of a terminal electrode structure.

With reference to FIG. 20, a cross-sectional view of an embodiment of a terminal electrode 66 is shown. In this embodiment, the layered structure on top of the terminal electrode 66 includes three layers: the gate insulating layer 37, the passivation layer 44, and a transparent electrode 71. The transparent electrode 71 may includes materials such as indium tin oxide (ITO), indium zinc oxide (IZO), or indium zinc tin oxide (ITZO). The embodiment of FIG. 20 is generally used in order to ensure a good environmental resistance. The sufficient conductivity property of this embodiment is ensured by applying voltage between the transparent electrode 71 and the terminal electrode 66.

Figure 25:
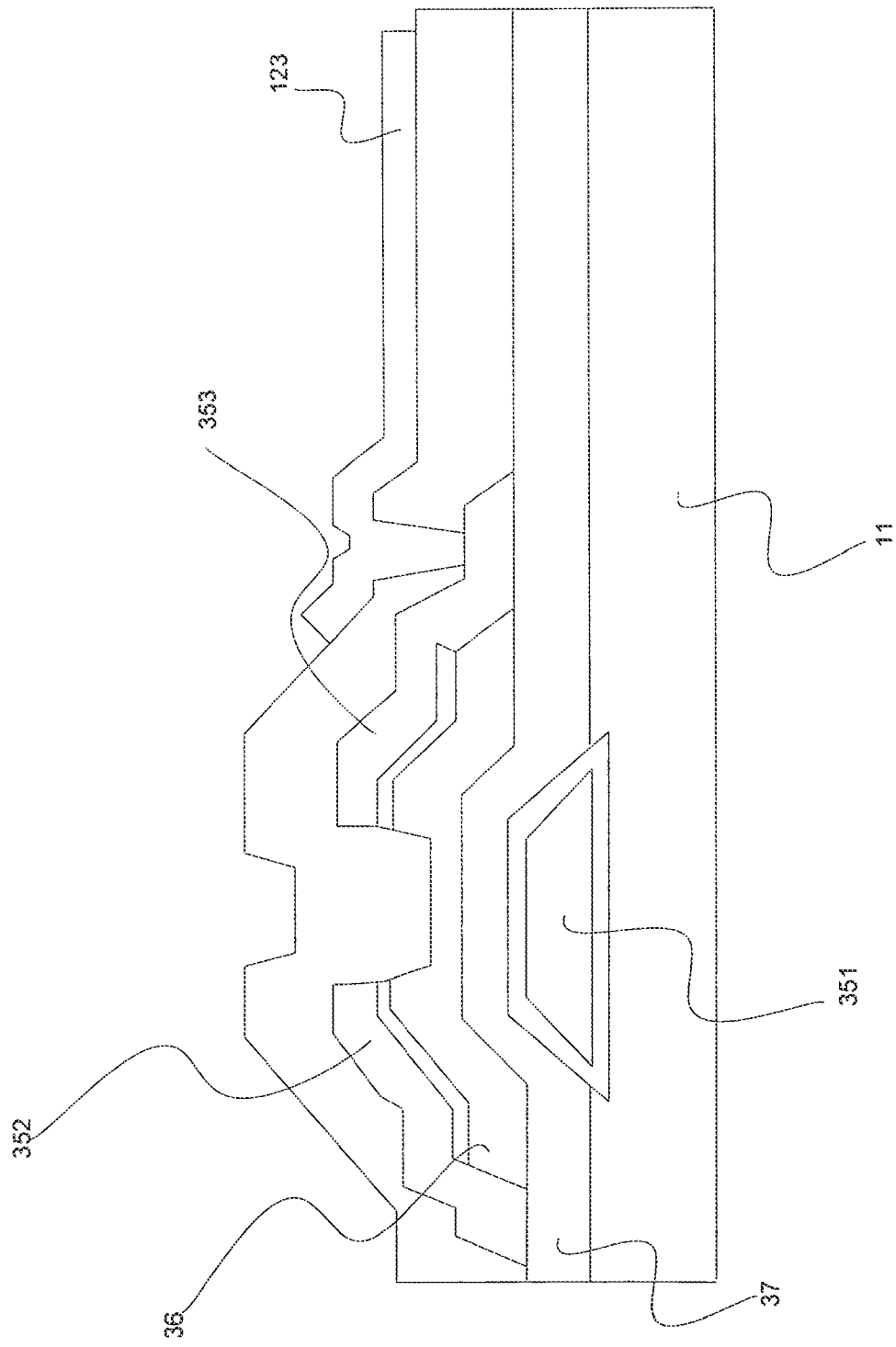
FIG. 25 illustrates a cross-sectional view of an embodiment of a pixel portion and a TFT portion.

Incidentally, in a case of manufacturing a TFT structure, as shown in FIG. 25, the existing manufacturing process may be used for manufacturing the terminal of the present invention. Therefore, it is possible to conduct the same manufacturing process within different cycles of production without drastically changing the manufacturing process. Furthermore, the oxide layer 47 can prevent Cu from intruding into the transparent electrode 71 providing a terminal structure with an excellent environmental resistance.

Figure 21:
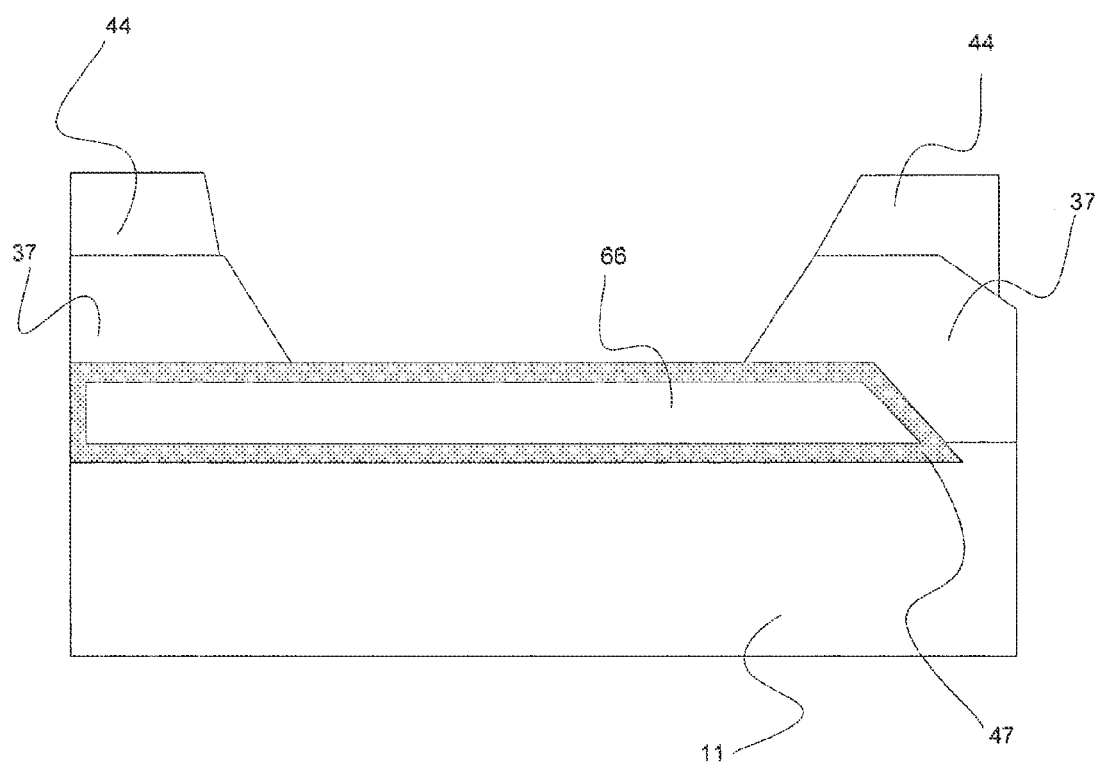
FIG. 21 illustrates a cross-sectional view of an alternative embodiment of a terminal electrode structure.

Referring next to FIG. 21, a cross-sectional view of another embodiment of a terminal electrode 66 is shown. This embodiment differs from that of FIG. 20 in that the transparent electrode 71 is removed from the terminal electrode structure. In this embodiment, the oxide layer 47 may have a thickness about 10 to several tens of nm where the environmental resistance is still ensured. In addition, the terminal electrode 66 of this embodiment is made by a single layer of copper (Cu) alloy material, e.g. Cu—Mn. Further, the electrical connection with an anisotropically-conductive layer may be achieved by a thermo-compression bonding.

Figure 22:
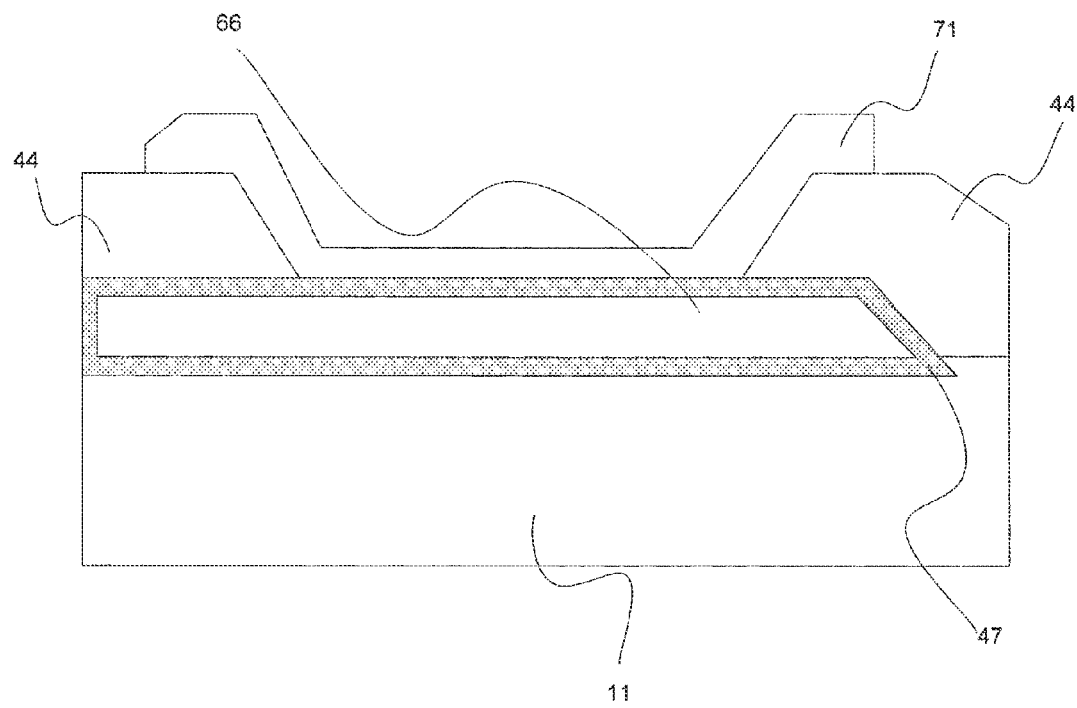
FIG. 22 illustrates a cross-sectional view of an alternative embodiment of a terminal electrode structure.

FIG. 22 illustrates a cross-sectional view of an alternative embodiment of a terminal electrode 66. In this embodiment, the passivation layer 44 and the transparent electrode 71 are both present in the terminal electrode structure. However, the gate insulating layer 37 is removed.

Figure 23:
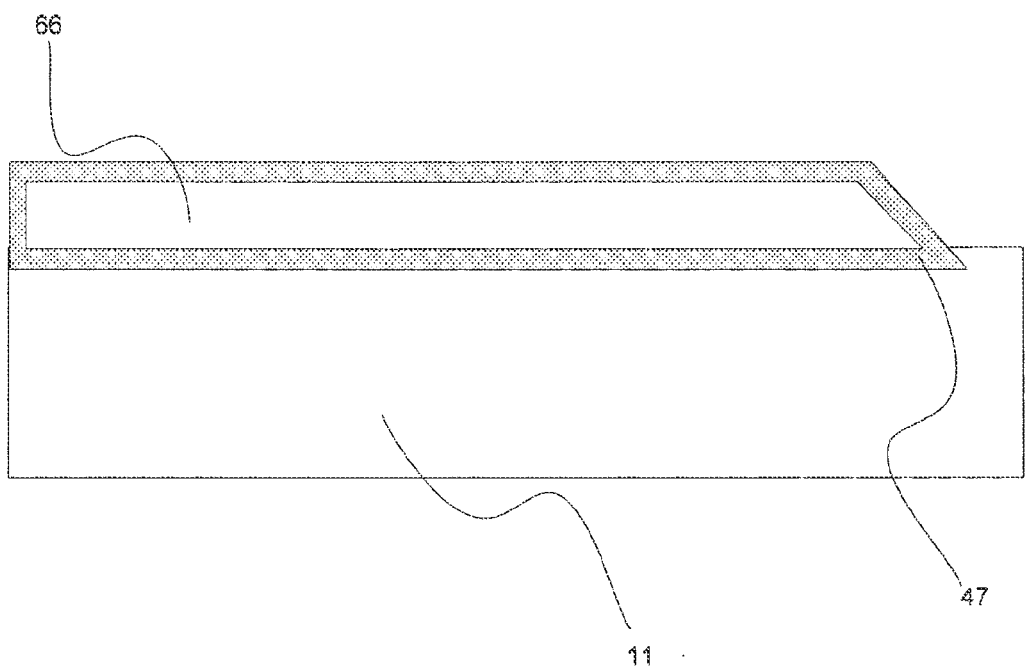
FIG. 23 illustrates a cross-sectional view of an alternative embodiment of a terminal electrode structure.

With reference to FIG. 23, a cross-sectional view of another alternative embodiment of a terminal electrode 66 is shown. This embodiment differs from that of FIG. 20 in that all three insulating layers including the gate insulating layer 37, the passivation layer 44, and the transparent electrode 71 are removed from the top surface of the terminal electrode 66. Similar to the embodiment of FIG. 21, the environmental resistance is ensured by the oxide layer 47, which has a thickness about 10 to several tens of nm. The sufficient conductive property is obtained by the thermo-compression bonding. Additionally, the terminal electrode 66 is made from a single copper (Cu) alloy layer.

Figure 24:
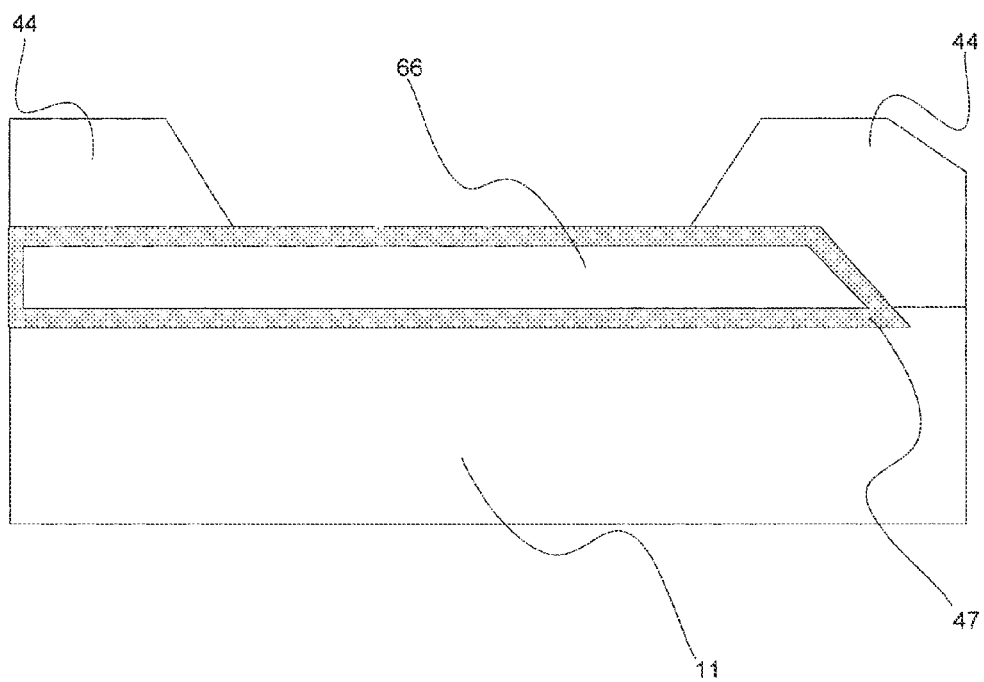
FIG. 24 illustrates a cross-sectional view of an alternative embodiment of a terminal electrode structure.

A cross-sectional view of yet another embodiment of a terminal electrode 66 is shown in FIG. 24. In this embodiment, the gate insulating layer 37 and the transparent electrode 71 are both removed from the terminal electrode structure.

[Cu Alloy]

In the following paragraphs, an additional element of copper alloy, which is applied to the TFT-LCD module of the present invention, will be described. In various embodiments of the present invention, the copper alloy with its additional element is applied to the gate interconnection 33, the signal interconnection 34, the gate electrode 351, the source electrode 352, and the drain electrode 353 of the TFT-LCD module. The additional element of copper alloy is a metal element which has an oxide formation free energy, which is negatively greater than the oxide formation free energy for Cu. In addition, the additional element of copper alloy has a diffusion coefficient, higher than the self-diffusion coefficient of copper (Cu).

Since the diffusion coefficient of the additional element is higher than the self-diffusion coefficient of copper (Cu), the additional element may reach copper (Cu) alloy surfaces faster than other elements. Therefore, an oxide covering layer composed of the additional element may be preferably formed on the Cu alloy surfaces.

That is, in a case where the diffusion coefficient of the additional element is smaller than the self-diffusion coefficient of copper (Cu), a considerable amount of time is needed for the additional element to reach the Cu alloy surfaces. As a result, Cu oxide covering layer such as CuO, $Cu_2O$ and the like is formed on the Cu alloy surfaces.

Since the Cu oxide covering layer does not show a strong barrier property, oxygen atoms may intrude into the inside of the copper (Cu) alloy layer forming an oxide composed of the additional element inside of the copper (Cu) alloy layer. In this case, the metal status of copper (Cu) gradually decreases, therefore, the electrical resistance of interconnections increases in the TFT-LCD modules.

In order to solve the above mentioned problems, the additional element of the copper (Cu) alloy layer is chosen, in the present invention, such that the additional element has a higher diffusion coefficient compared to the self-diffusion coefficient of copper (Cu).

Next, the additional element existing in the copper alloy layer of the present invention will be described. The additional element of the copper alloy layer is in a solid solution status and the additional amount is preferably within the range of 0.1 to 25 atom %. More preferably, the additional amount is within the range of 0.5 to 15 atom %. The most preferable additional amount of the additional element in the copper (Cu) alloy layer is 0.5 to 5 atom %. It has to be noted that, in a case where the additional element of the copper (Cu) alloy layer is not in a solid solution status, the diffusion of the additional element would be difficult. Especially, in a case where the additional element and the copper (Cu) from the copper (Cu) alloy layer form intermetallic compounds, the diffusion of the additional element would be very slow.

Furthermore, when the additional element of the Cu alloy layer is less than 0.1 atom %, the oxide covering layer will become too thin in order to prevent the copper (Cu) oxidation process. Meanwhile, the additional element of the Cu alloy layer is over 25 atom %, the solid solubility status of the additional element may be separated out at normal temperatures.

The additional element of the copper (Cu) alloy layer, pertaining to the embodiments of the present invention, is at least one metal element selected from the group of Mn, Ze, Ga, Li, Ge, Sr, Ag, In, Sn, Ba, Pr and Nd. In addition, the additional element of the copper (Cu) alloy layer is at least one metal element, preferably, selected from the group of Mn, Zn and Ga. Each additional element may be independently used in the copper (Cu) alloy layer while more than one additional element may also be used at the same time. In particular, it is most preferable that the additional element of copper (Cu) alloy layer is manganese (Mn). It has to be noted that, even though impurities such as S, Se, Te, Pb, Si and the like may get mixed inevitably into the copper (Cu) alloy layer, these impurities are allowed as long as they do not cause any degradations of different characteristics, such as the electrical conductivity and the tension strength of the copper (Cu) alloy layer.

Embodiments of the present invention are not limited to a specific process for forming the copper (Cu) alloy layer. Therefore, plating process such as electrolytic plating process or the dissolution plating process and the like, may be used to form the copper (Cu) alloy layer. Additionally, physical vapor deposition process such as the vacuum deposition process, the sputtering process, and the like may also be used. By conducting a heat treatment to the copper (Cu) alloy layer, formed as described above, the oxide covering layer will be formed.

The heat treatment is applied at temperatures ranging from 150 to 400° C., preferably from 150 to 350° C., and more preferably from 150 to 300° C. It has to be noted that, although independent heat treatments are possible for forming different interconnections of the Cu—Mn layer, these independent heat treatments may preferably be omitted from the manufacturing process. This is mainly because the CVD process is conducted at temperatures ranging from 150 to 400° C. when a passivation layer 44 is formed on the copper manganese (Cu—Mn) layer. Further, it is preferable to conduct the CVD process at temperatures ranging from 150 to 300° C. At this temperature zone, it is sufficiently possible to form the copper manganese (Cu—Mn) interconnections while the recent demands for decreasing the CVD's temperature process is also met.

The heat treatment is conducted for a time from 2 minutes to 5 hours. When the heat treatment is conducted at a temperature less than about 150° C., the formation of the oxide covering layer becomes slow, therefore the productivity of manufacturing line reduces. Meanwhile, when the heat treatment is conducted at a temperature above 450° C., the copper (Cu) oxidation process for forming the oxide covering layer starts before the additional element diffuses and reaches the surface of the copper (Cu) alloy layer. In addition, in a case where the heat treatment time is applied for less than 2 minutes, the thickness of the oxide covering layer may become too thin. Meanwhile, for a heat treatment applied over 5 hours, the oxide covering layer's formation time may become too long.

Figure 26:
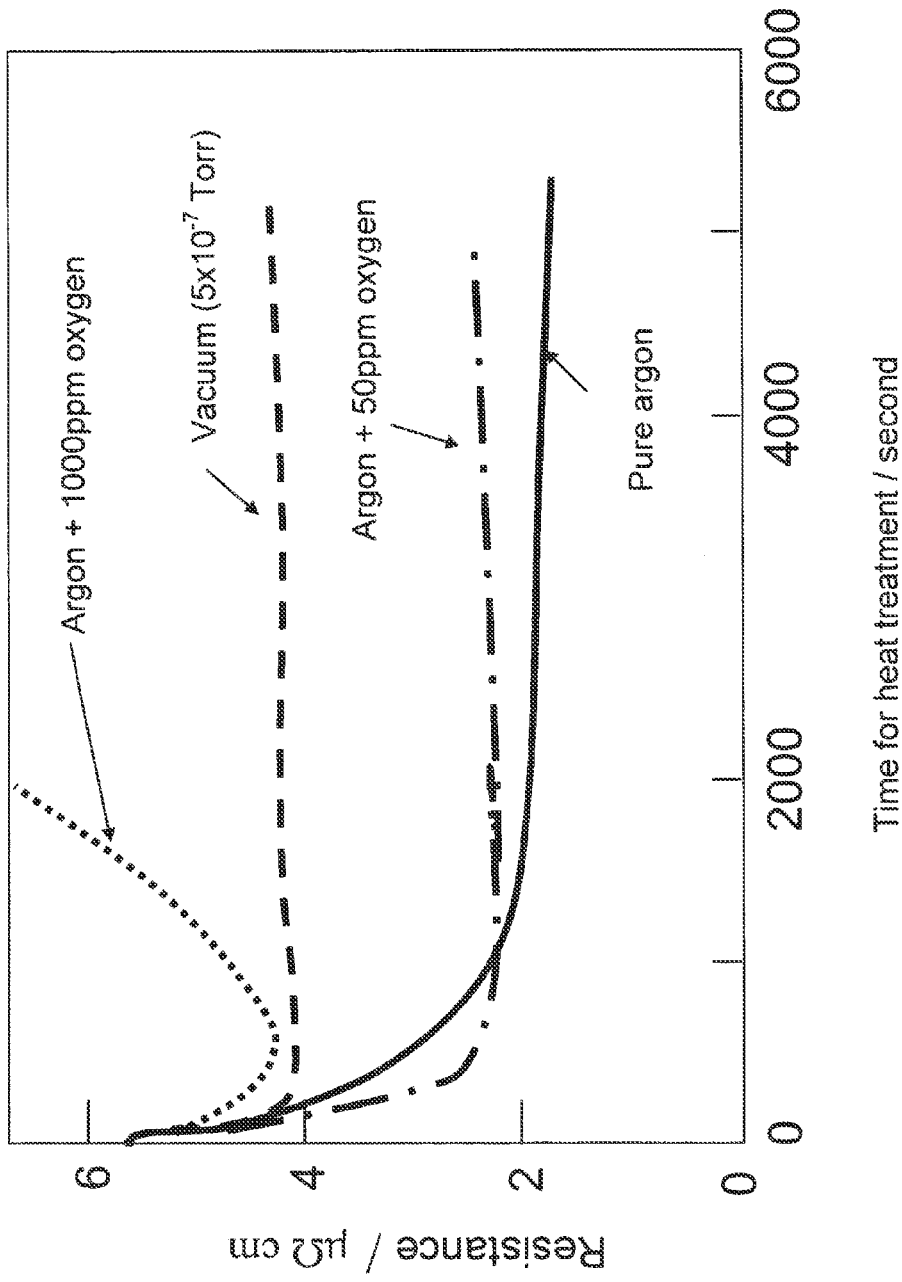
FIG. 26 illustrates the resistance of the copper alloy (Cu—Mn) layer.

Next, the resistivity reduction of copper manganese (Cu—Mn) layer, which is the preferable copper (Cu) alloy layer of the present invention, will be discussed. As described further above, by applying a heat treatment, the copper manganese (Cu—Mn) layer becomes an interconnection or electrode body mainly made of copper while a manganese oxide ($MnO_x$) layer covers the interconnection or electrode body. FIG. 26 illustrates the resistance change of the Cu—Mn layer at 350° C. with heat treatment time in various atmosphere of Ar plus a ppm level of oxygen.

In order to measure the resistance of the Cu—Mn layer, the oxide layer containing copper (Cu) and manganese (Mn) is removed from the top surface of the Cu—Mn layer such that the interconnection body is exposed. Then, the electrical resistance of the copper (Cu) interconnection body is measured. As shown in FIG. 26, the resistance value decreases rapidly with heat treatment time in all atmospheres, and is found to almost saturate after 1500 sec. In Ar +50 ppm of oxygen, a low resistivity of 2.2 μΩcm is obtained at 4000 sec. This resistivity is very close to the resistivity of pure copper (1.7 μΩcm) in bulk material. In this way, an acceptable value for realizing a low resistivity interconnection body for improving image quality of the TFT-LCD module may be obtained.

The low resistivity of the interconnection body, which is closed to the resistivity of pure copper (Cu), is mainly obtained due to the fact that the majority of manganese atoms are expelled from the copper manganese (Cu—Mn) layer by the heat treatment.

Figure 27:
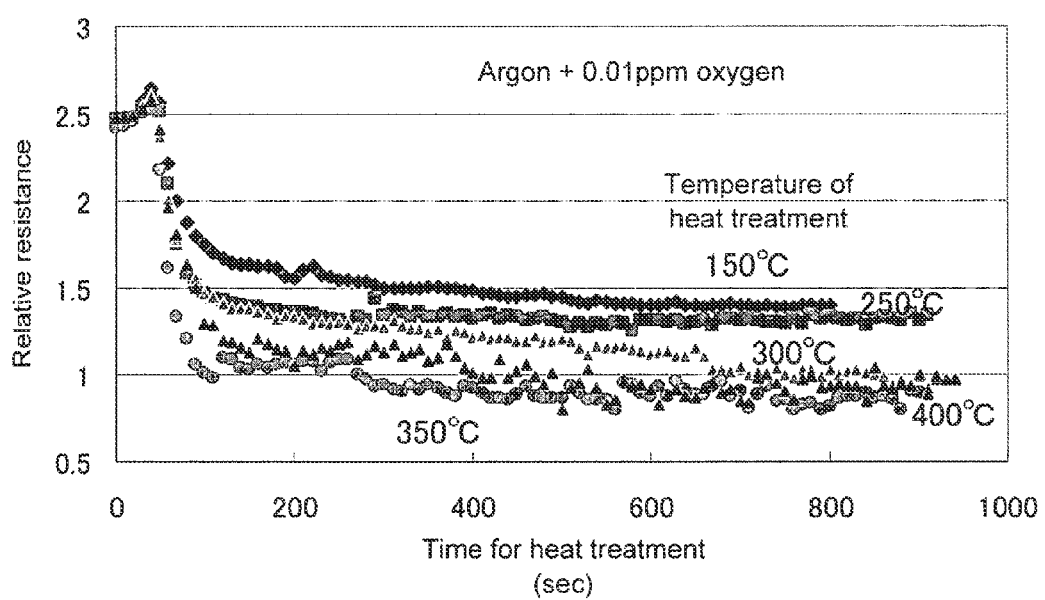
FIG. 27 illustrates the resistance of the copper alloy (Cu—Mn) layer.

Referring next to FIG. 27, the resistance change of the Cu—Mn layer with heat treatment time in Ar atmosphere at 150, 250, 300, 350, and 400° C. is shown. Note that Ar gas contains a trace amount (0.01 ppm) of oxygen. As shown in FIG. 27, the resistivity value of the interconnection body is saturated to a low value after about 200 sec for all temperatures. This result means a short process time, which is efficient in manufacturing the TFT-LCD module of the present invention.

[Shading]

Next, a shading reduction effect, which is one of the main features of the present invention, will be explained. The realization of low resistance interconnections leads to the reduction of the shading effect, thereby improving the image quality of the LCD display. First, the operation of a TFT-LCD module with regard to the shading effect will be described. The LCD display device of the present invention contains a large number of several pixels positioned in a matrix array (AM-LCD).

As an example, in the case of TFT-LCD modules for digital TV transmissions, the number of pixels on the LCD display are (1920×3)×1080 with a full high definition (HD) configuration. Since one pixel element is composed of three primary colors (red, green and blue), the number of pixels across the screen (1920) is multiplied by three, providing a total number of 5760 pixels or signal lines across the LCD display. The number of rows of pixels or scanning lines down the LCD display is 1080. In the TFT-LCD module of this embodiment, a gate voltage $V_G$ is applied to the gate electrode of the TFT associated with each pixels of the LCD display. The value of the gate voltage $V_G$ is usually set to be about 10 to 15V.

Meanwhile, a signal voltage $V_S$ is applied to the source electrode of the TFT such that the gate electrode pulse functions as scanning signals or lines. In the case where a frame frequency/rate of the display is set to be 60 Hz, the frame time for displaying each image on the display would be 16.7 ms. Meanwhile, where the 1080 scanning lines are scanned by a progressive scanning, the gate electrode pulse width would be set to 16 μs.

Figure 28:
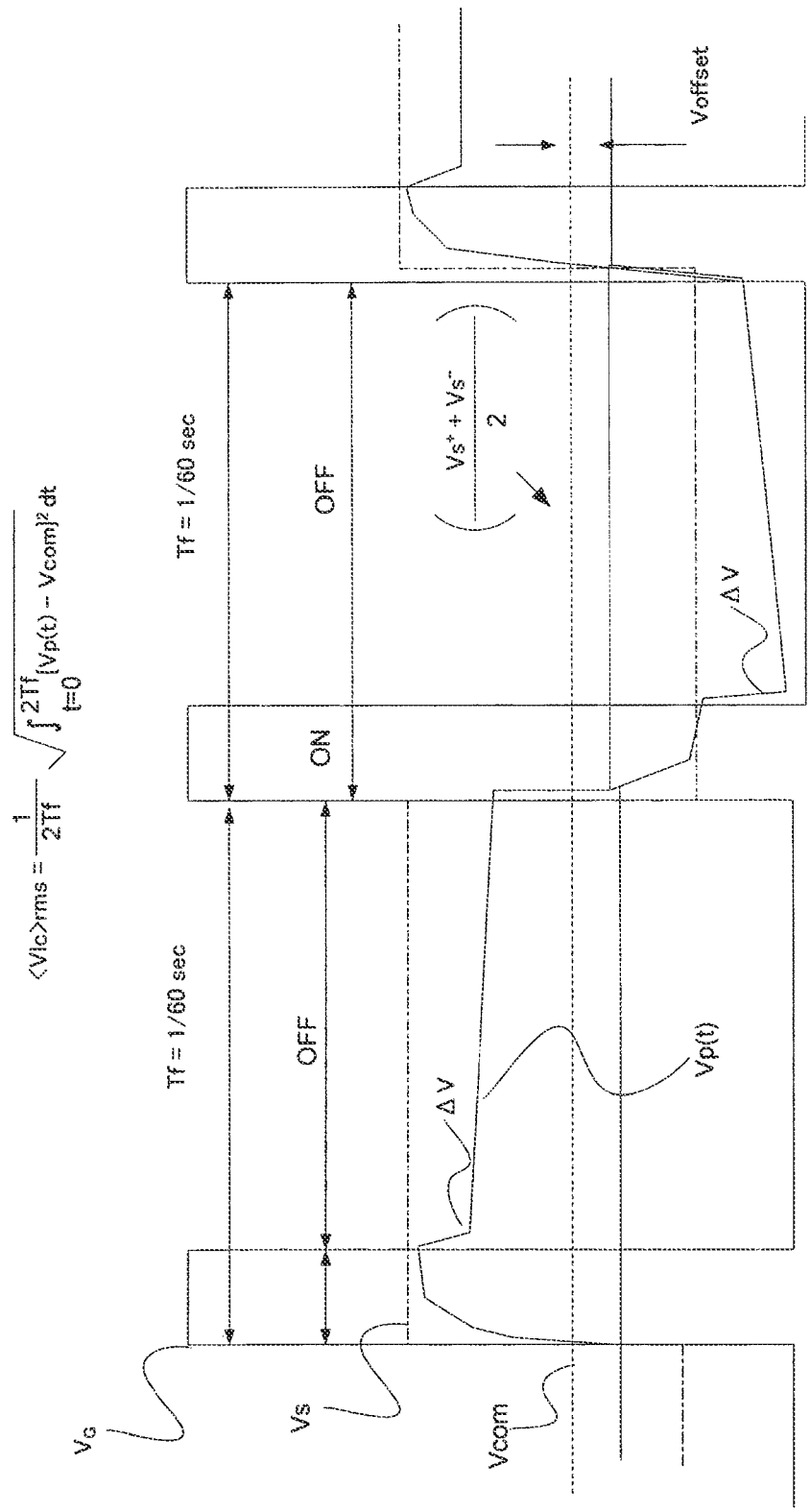
FIG. 28 illustrates an example of a LCD drive.

As shown in FIG. 28, the pulse period of the gate electrode is about 16.7 ms while the pulse width is about 16 μs. Meanwhile, in the case where a LCD drive voltage V.sub.lc is set to be about 5V, the signal voltage Vs applied to the source electrode is to be about 10V, meaning that the voltage amplitude of Vs is doubled in value in order to drive the liquid crystal display layer. FIG. 28 illustrates an embodiment showing a LCD drive waveform in a frame inversion mode. In this embodiment, the difference between the signal voltage Vs and a common voltage $V_{com}$, which is applied to the common electrode 123 of the TFT-LCD module, is defined as a drive voltage for the liquid crystal layer $V_{P(t)}$. The polarity of the drive voltage for the liquid crystal layer $V_{P(t)}$ is reversed at each frame to obtain an alternate current.

In this way, the penetration efficiency of the LCD display creates a voltage modulation on the signal voltage Vs to modulate the brightness of the LCD display. In addition, during the period when the gate voltage pulse is off the drive voltage for the liquid crystal layer $V_{P(t)}$ is held. The time period for which the gate voltage pulse is off is about 16 ms, which is substantially the same as frame time.

The drive voltage for the liquid crystal layer $V_{P(t)}$ may have two main status: 1) a write status and 2) a hold status. In addition, the penetration efficiency of the LCD display depends on effective values of the drive voltage for the liquid crystal layer $V_{P(t)}$. Therefore, the LCD drive voltage $V_{lc}$ is defined according to the following formula:

$$\langle Vlc\rangle\text{rms} = \frac{1}{2Tf}\sqrt{\int_{t=0}^{2Tf}[Vp(t)-Vcom]^2\,dt}$$

Wherein the LCD drive voltage V.sub.lc is proportional with the Root Mean Square of the drive voltage for the liquid crystal layer $V_{P(t)}$. Here, a switching time of an a-Si TFT drives a capacity load and the mobility of the a-Si is small like 0.3 to 1.0 cm$_2$/V sec. Therefore, the order of the switching time is μs. Accordingly, during the gate voltage pulse width 16.7 μs, it takes a few μs to turn on the switch of the TFT.

In addition, since the liquid crystal layer 13 functions as a capacity load, it causes some delay in the application of the signal voltage Vs. Thereby, causing some delay in a rising edge of the drive voltage for liquid crystal layer $V_{P(t)}$. Further, in the TFT-LCD module for a TV with the full HD configuration, 5760 pixels are positioned in one row. The gate voltage pulse is, then, applied to end portions of the gate interconnections, and a plurality of TFTs which are all positioned in one row become energized simultaneously.

At this point, the gate voltage pulse is propagated from the end portions to the gate electrode of each pixels. The propagation speed delays when the resistance and the parasitic capacitance of the gate interconnections increase. This is called propagation delay of the gate voltage pulse. When the propagation delay increases, sufficient time for writing the LCD drive voltage V.sub.lc may not be obtained. As a result, it becomes impossible that the LCD drive voltage V.sub.lc for each pixel achieve a predetermined value. For this reason, the penetration efficiency of the liquid crystal layer becomes uneven. That is, the brightness of the display becomes uneven, which causes shadings in the LCD display. Surely, such unevenness causes shadings, in the same way as described above, in the in plane switching (IPS) vertically aligned (VA) liquid crystal display devices.

Figure 29:
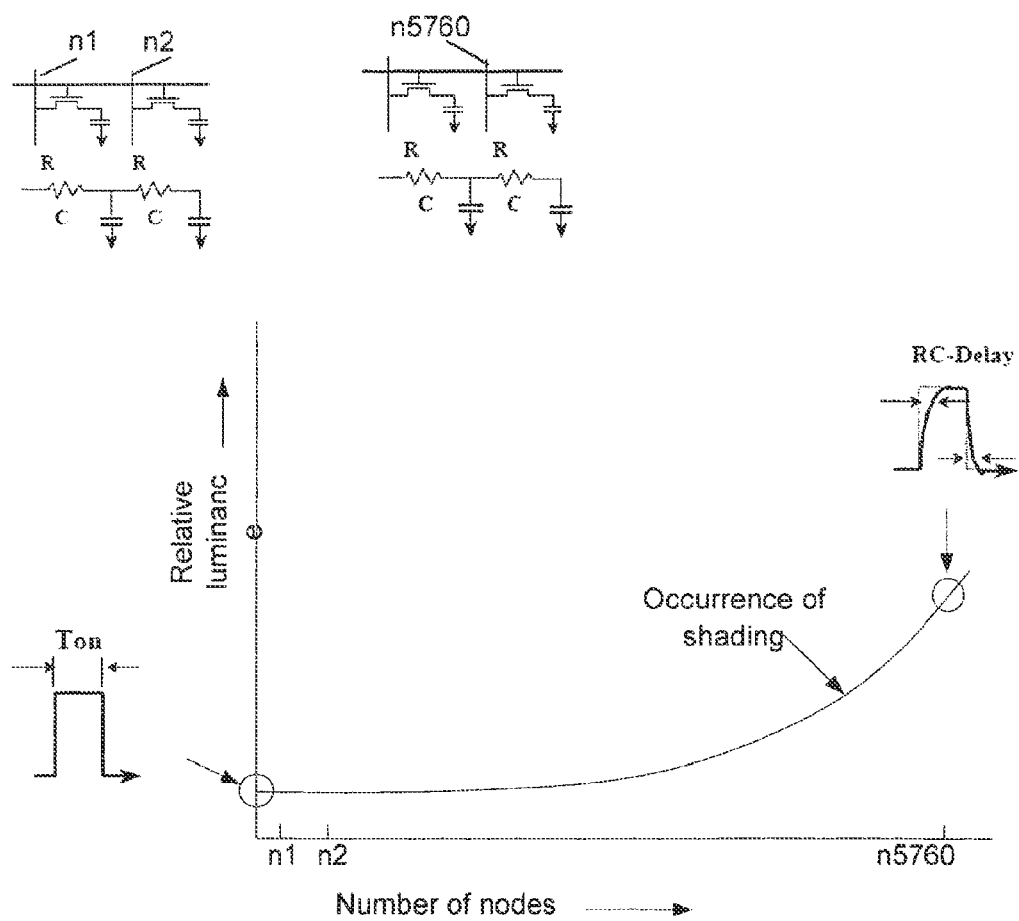
FIG. 29 illustrates a propagation delay model of a gate voltage pulse and its related brightness distribution.

With reference to FIG. 29, a propagation delay model for the gate voltage pulse and its related brightness distribution is shown. Each pixel of the gate interconnections may be equivalently represented using a resistance R and a parasitic capacitance C. The delay of the gate voltage pulse of RC in each element is accumulated, so that the propagation delay reaches a few μm at the termination node n5760.

As shown schematically in FIG. 29, the brightness of the LCD display device, which is normally in a white mode, gradually changes along with the gate interconnections. Therefore, the LCD drive voltage V.sub.lc at the termination node n5760 does not arrive to a sufficient value, so that the primary black display may not be shown, but a bright display will be shown instead. Accordingly, by decreasing the resistance of the gate interconnection, the propagation delay of the gate voltage pulse will be reduced. As a result, it is possible to prevent the unevenness of the brightness in the LCD display, thereby preventing the shading effect.

In the present invention, as shown in FIG. 29, the shading may be reduced by using the copper interconnections having a low resistance value close to resistance value of the pure copper.

Meanwhile, since the number of nodes in the signal interconnections is 1080, so the problem related to the propagation delay in the signal interconnections is not as severe as in the case of the gate interconnections. However, in accordance with increasing of display sizes in the LCD panels, the propagation delay in the signal interconnections may reach a value about 1 to 3 .mu.s which is not negligible. Therefore, reducing the propagation delay is efficient for decreasing unevenness of the brightness in the LCD display panels. This may achieve, according to the embodiments of the present invention, by applying a copper alloy, in particular Cu—Mn, as an interconnection materials to both the gate and signal interconnections.

[Adhesiveness with Glass]

Next, the adhesiveness between the copper alloy, e.g. Cu—Mn, and insulating layers, in particular glass, will be explained. As explained previously, thin layer of interconnections and electrodes, formed by the copper alloy such as Cu—Mn, are covered with oxide layers which are formed by conducting a heat treatment.

In the LCD devices, it is required for the interconnections and the electrodes to have an excellent adhesiveness with the glass substrate and other insulating layers, present in the LCD structure. The adhesiveness is generally evaluated by a tape test. Table I shows the adhesiveness, obtained using the tape test results, for three different materials at various temperatures.

TABLE I

An example of the tape test results for pure Cu and two Cu/Mn double layered on the insulating layer SiO$_2$

| Material (thickness nm) | Heat treatment temperature (° C.) | | | | | | |
|---|---|---|---|---|---|---|---|
| | 150° C. | 200° C. | 250° C. | 300° C. | 350° C. | 400° C. | 450° C. |
| Cu (150 nm) | X | X | X | X | X | X | X |
| Cu (150)/Mn(2) laminated layers | Δ | ○ | ○ | ○ | ○ | ○ | ○ |
| Cu (150)/Mn(20) laminated layers | Δ | ○ | ○ | ○ | ○ | ○ | ○ |

○: excellent adhesiveness
X: stripping was observed (adhesiveness is defective)
Δ: partial stripping was observed For a thin layer of pure copper Cu (150 nm), formed on an insulating layer, e.g. SiO$_2$, some stripping was found and the adhesiveness was defective for all temperatures. Meanwhile, in the case of both Cu/Mn double laminated layers, the heat treatment causes the interdiffusion of Cu and Si at the interface with SiO$_2$ layer, wherein an oxide layer is formed. The composition formula of the oxide layer is Cu$_X$Mn$_Y$Si$_Z$O (0<X<Y, 0<Z<Y). Therefore, an excellent adhesiveness with the insulating layer SiO$_2$ may be obtained.

As for the tape test method for evaluating the adhesiveness, a tape was applied to a Cu thin layer surface, then a stripping status of the thin Cu layer was evaluated when the tape was peeled off. The tape was pressed by nails so as to be adhered onto the Cu thin layer surface and then the tape was peeled off.

This process was repeated about ten times on the same portion of the Cu thin layer in order to verify whether the Cu thin layer is adhered to the substrate. Using this process, the results of the tape test method were analyzed in detail.

According to these results, in the case of the both Cu/Mn double laminated layers, low electrical resistance was shown by conducting heat treatment at temperatures greater than or equal to 200° C. Meanwhile, with regard to the adhesiveness, a partial stripping was observed after heat treatment at a temperature of about 150° C. When heat treatment was conducted at 250° C., excellent adhesiveness was observed for various heating periods. Examples of those heating periods may include 3 minutes, 30 minutes, one hour, 20 hours and 100 hours in heating time. Similarly, excellent adhesiveness was observed for heat treatment conducted at temperatures of about 350° C.

Figure 30:
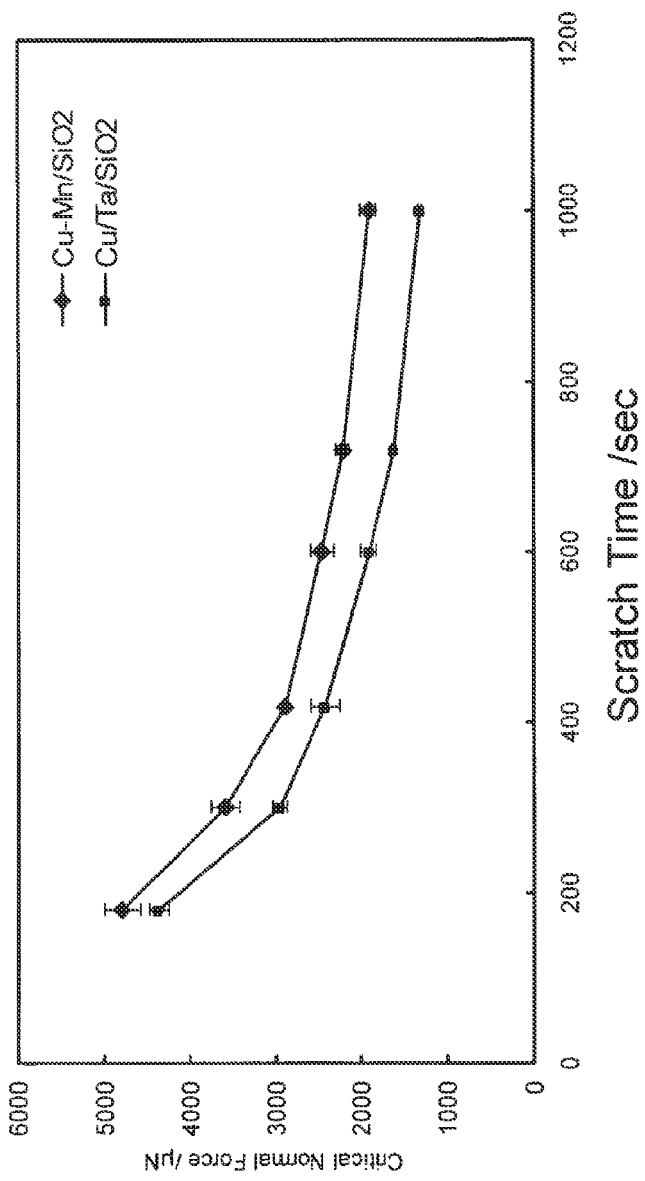
FIG. 30 illustrates comparative examples showing adhesive strength of two experimental samples.

Referring next to FIG. 30, comparative examples illustrating the adhesive strength of two samples at their interface with an insulating layer are shown. The first sample used for measuring the adhesive strength is based on Cu-4 atom % Mn alloy deposited on a SiO$_2$ substrate (Cu—Mn/SiO$_2$). A heat treatment is conducted at temperatures of about 400° C. for 30 minutes. The second sample is based on a case where Ta, which is often used for semiconductor interconnections, is interposed between the pure Cu and the SiO$_2$ substrate. The adhesive strength is measured by a nano-scratch method. In the lateral axis, time for scratching a distance of six micrometers is plotted, which corresponds to scratching speed. The vertical axis is critical normal force at which a force signal of film delamination was detected, indicating the adhesive strength. It is shown that Cu—Mn/SiO$_2$ requires a greater force and, thus, has a higher adhesive strength compared with Cu/Ta/SiO$_2$ for all scratching speeds.

Figure 31:
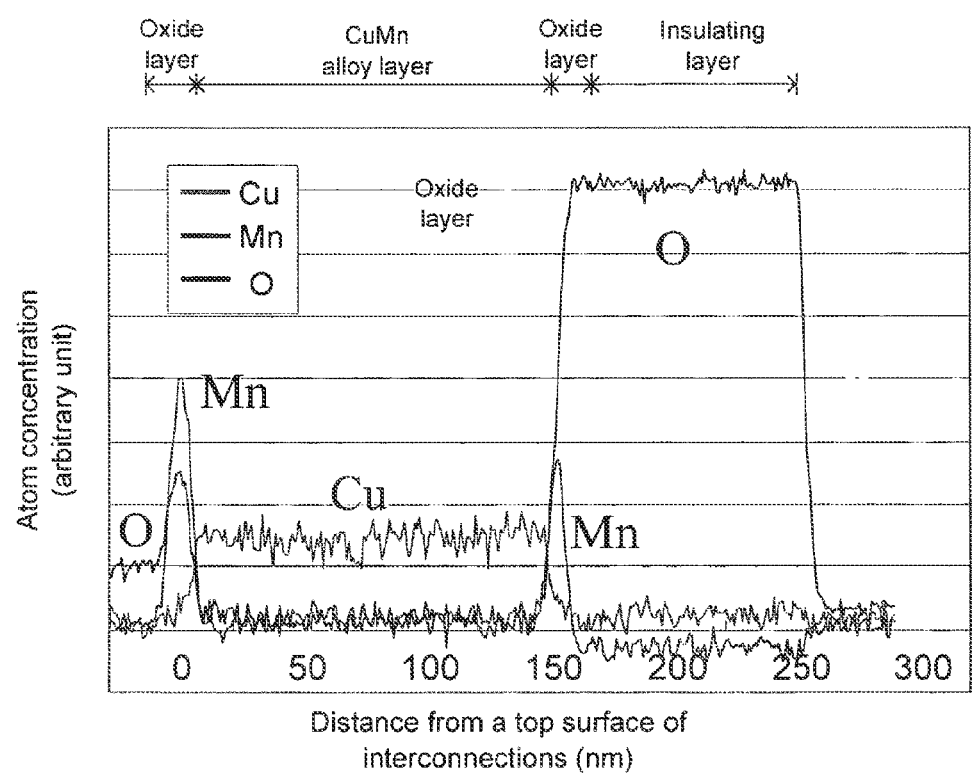
FIG. 31 is a composition view of an interconnection structure.
Figure 32:
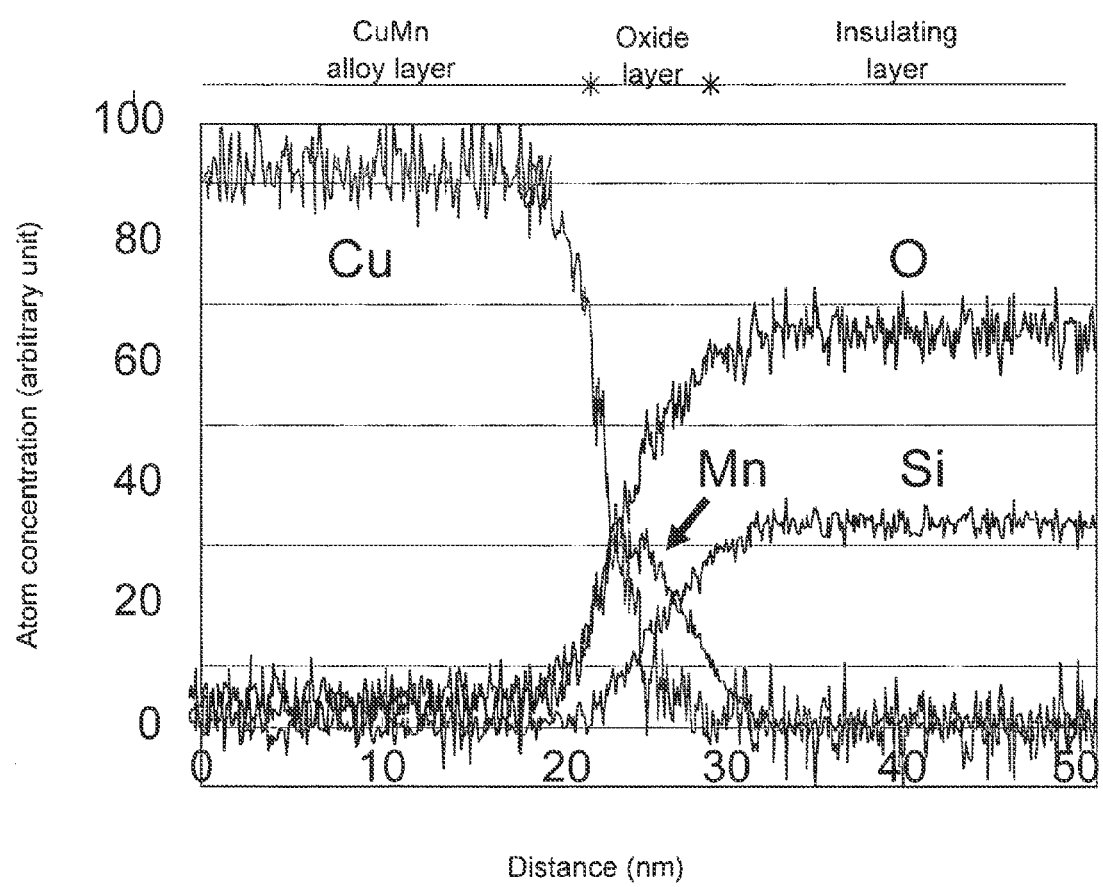
FIG. 32 is an enlarged view of a composition of an interconnection structure.

Referring now to FIGS. 31-32, an example of atomic concentration is shown as a function of distance from the top surface of the Cu interconnection. According to results from FIGS. 31-32, the oxide layer formed at the interface between the insulating layer SiO$_2$ and the Cu interconnections or electrodes is amorphous and has a composition represented by the following formula: Cu$_x$Mn$_y$Si$_z$O. Accordingly, by forming the oxide layer mainly composed of Mn at the interface, the interdiffusion between the Cu interconnections and the insulating layer may be prevented. In addition, the concentration of Cu and Si changes continuously across the interface with the interfacial oxide layer. Therefore, it is thought that the excellent adhesiveness may be achieved.

Accordingly, a LCD device and a method for its manufacturing may be provided. The LCD device can prevent the oxidation of the interconnection materials by forming oxide covering layers which have excellent adhesiveness with semiconductor layers or pixel electrodes. In addition, the LCD device may be provided with interconnections, electrodes or terminal electrodes (especially, source electrodes or drain electrodes) with high conductivity. Further, it is possible to form interconnections and electrodes or terminal electrodes according to various embodiments of the present invention, using the actual manufacturing process while solving simultaneously the above-mentioned problems.

Figure 33:
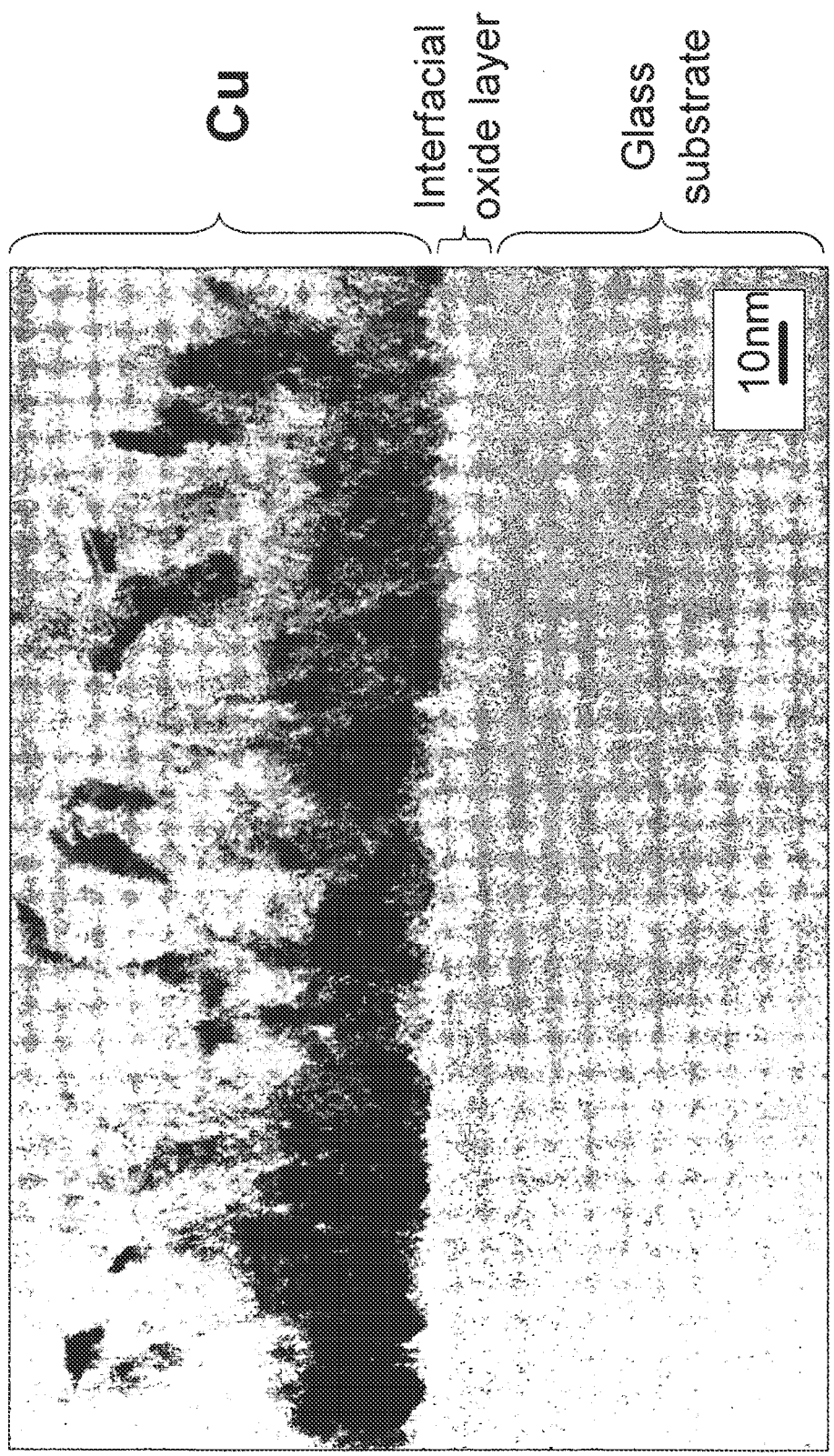
FIG. 33 illustrates a cross-sectional view of a TEM image for a Cu—Mn alloy sample.

FIG. 33 shows a cross-sectional view of a TEM image for a Cu—Mn alloy sample after a heat treatment is conducted at temperatures of about 250° C. for 10 minutes. The upper portion of the FIG. 33 shows the Cu—Mn alloy layer, while the lower portion shows the glass substrate. At the interface between both layers, a reaction layer having a uniform contrast maybe observed. According to the results of the analysis by an X-ray energy dispersive spectrometer (XEDS) attached to the TEM, the reaction layer is an oxide layer mainly composed of Mn. The formation of this oxide at the interface of both layers is the main reason for improving the adhesiveness.

In order to reduce the resistance of the oxide layer, it is mostly preferable to add Mn in efficient quantities. For example, in a case where a heat treatment is conducted at temperatures of about 250° C. for 10 minutes to an alloy layer having a thickness of about 200 nm, an interface oxide layer having a thickness of about 6 nm is formed. The amount of Mn contained in the interfacial oxide layer is about 50%. This is equivalent to the existence of pure Mn having a thickness of about 3 nm. Therefore, the amount of Mn added to the alloy layer is about 3/200 in volume ratio. In light of the concentrations of Cu and Mn, Cu-(1 to 2) atom % Mn is the most preferable. When the alloy layer has a thickness of about 100 nm, the concentration of Mn should be twice the concentration of Mn when the alloy layer has a thickness of about 200 nm. On the other hand, when the alloy layer has a thickness of about 300 nm, the concentration of Mn should be 2/3 times of the amount when the alloy layer has a thickness of about 200 nm.

In the present embodiment, Cu-4 atom % Mn alloy is deposited on the glass substrate using a sputtering method. Then, a heat treatment is conducted at temperatures ranging from 150 to 350° C. in a pure argon atmosphere for a period of about 10 to 60 minutes. Next, scotch tapes were adhered to the alloy thin layer surfaces of both samples, where one of which is subjected to the heat treatment after the deposition steps, and the other is not subjected to the heat treatment. By peeling the tape from the surface, it is evaluated whether the thin layer is stripped or not (Tape test). As a result, the alloy thin layer in which the heat treatment was not conducted is stripped off from the glass substrate.

Referring next to FIG. 34, tape test results for evaluating the adhesiveness of a Cu—Mn alloy after depositing on a glass substrate and conducting a heat treatment at various temperatures and heating period are shown. In this figure, X indicates a case where the stripping was observed, A indicates a case where the stripping was sometimes observed, and O indicates a case where the stripping was not at all observed. Incidentally, the stripping was observed for all conditions (temperature and time) when a pure Cu layer was used. It has to be noted that, in this embodiment, no stripping was observed when the heat treatment was conducted at temperatures of equal or greater than 250° C. for all heating period. Meanwhile, as shown in FIG. 34, when the heat treatments is conducted at temperatures of about 200° C. for not less than 20 minutes or is conducted at temperatures not less than 250° C. for not less than 10 minutes, the alloy thin layers are adhered to the glass substrate. When the same tape test is conducted with a pure thin Cu layer, stripping is observed for all heat treatment conditions. Accordingly, it was turned out that an excellent adhesiveness against the glass substrates may be achieved by conducting a heat treatment at not less than 200° C. with the Cu—Mn alloy sample.

Figure 35:
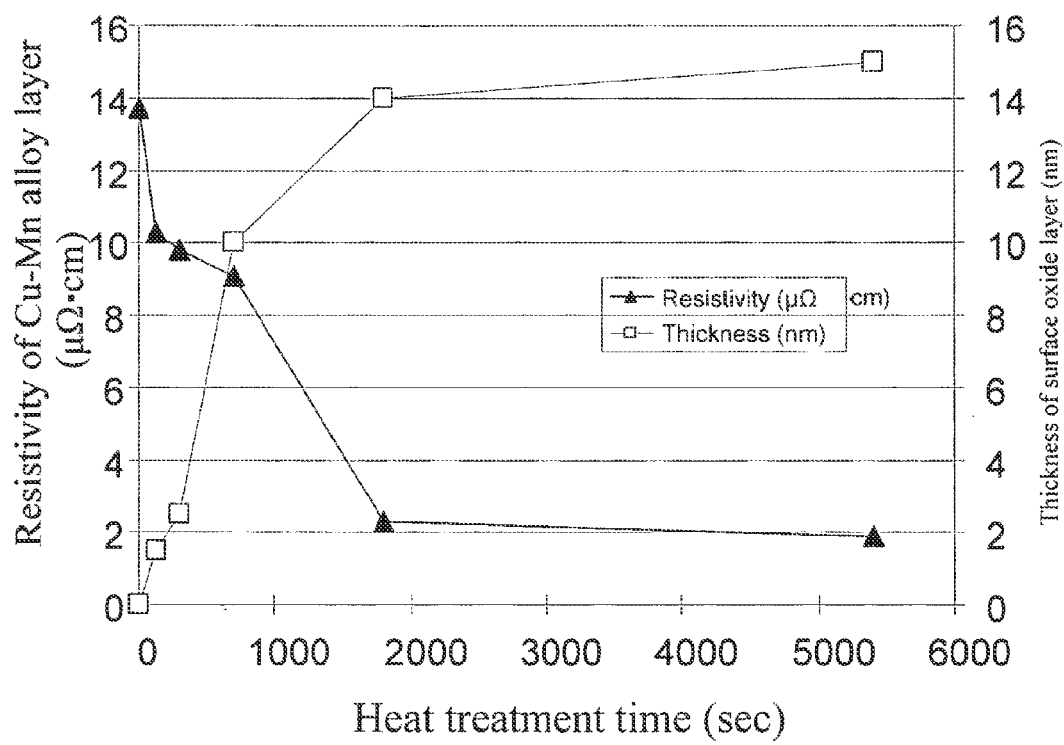
FIG. 35 illustrates resistivity of Cu—Mn layer and the thickness of the oxide layer formed on the Cu—Mn surface.

Incidentally, when Cu alloy contains Mn in an excessive amount, which is more than the amount needed to form the interfacial oxide layer, the heat treatment should be conducted in a highly-pure Ar gas (the oxygen concentration is not more than 0.1 ppm) containing oxygen as an inevitable impurities. With reference to FIG. 35, measurement results representing resistivity of a Cu—Mn layer and thickness of the oxide layer formed on the Cu—Mn surface are shown. It has to be noted that these measurements were taken after conducting a heat treatment at a temperature of about 350° C. to the Cu—Mn layer. As shown in FIG. 35, Mn left in the Cu—Mn alloy layer after forming the interfacial oxide layer reacts with oxygen, which is not more than 0.1 ppm in the pure Ar, and forms oxide on the surface thereby being enabled to get out of the Cu—Mn alloy layer. According to the results shown in FIG. 35, the resistance of Cu—Mn layer may decrease in accordance with the growth of Mn oxide layer on the surface. The resistance after 30 minutes heat treatment may decrease to a value, which is almost equal to the resistance value of pure Cu. According to the results taken by XEDS, Mn concentration was not detected in the alloy layer. Accordingly, in this embodiment, the excess amount of Mn from the Cu—Mn alloy layer can be completely eliminated by forming the Mn oxide layer on its surface.

[Manufacturing Process]

With regard to the liquid crystal display (LCD) devices of the present invention, manufacturing process for forming the oxide layers relating to copper alloy and their interconnections will be explained. The copper alloy is used as interconnection materials and electrode materials for TFT-LCD devices.

Figure 36:
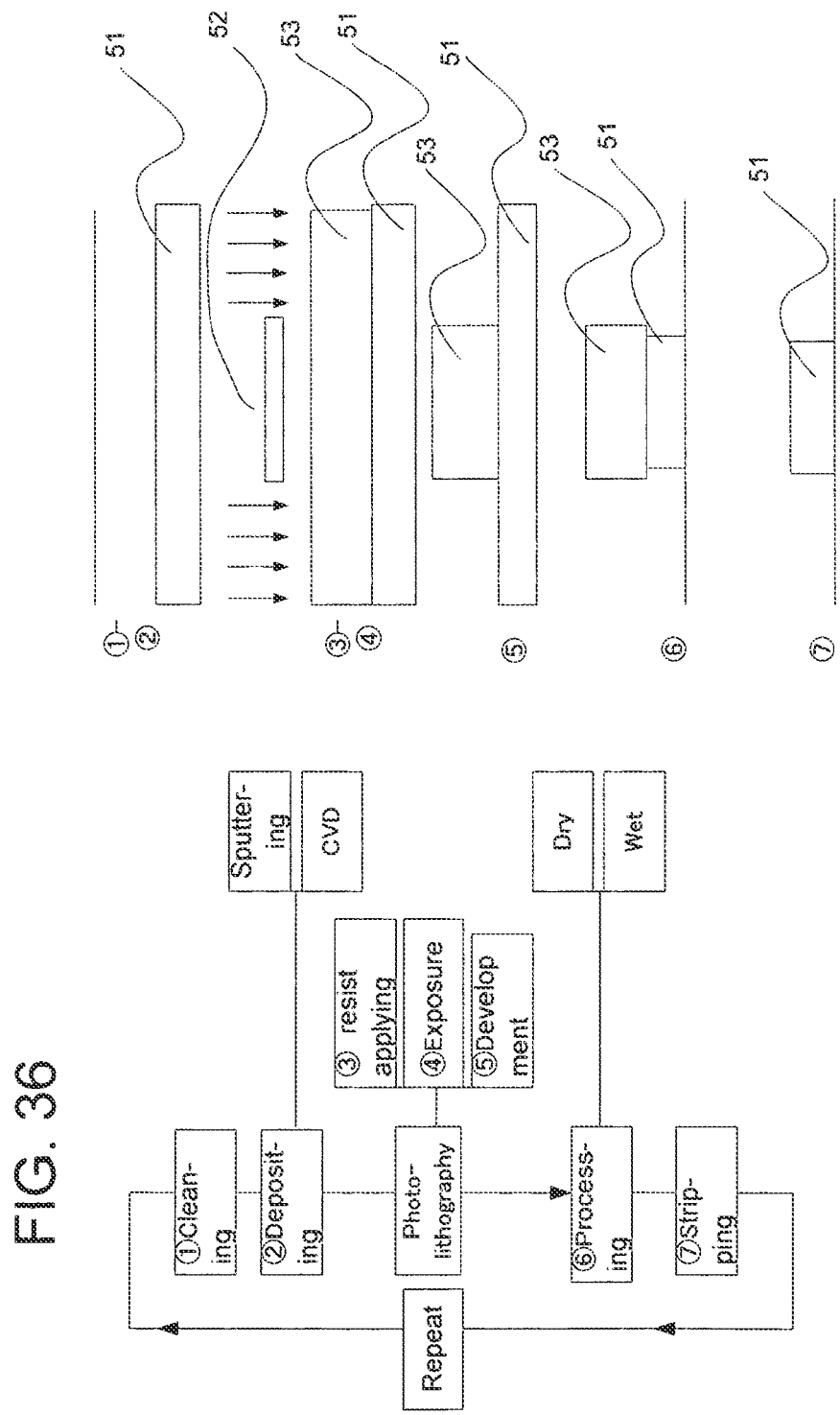
FIG. 36 illustrates an embodiment of a basic process for manufacturing of TFT devices.

FIG. 36 illustrates an embodiment of a basic process for manufacturing of TFT devices. First, a thin layer 51, which consists of a metal, a semiconductor and an insulator layers, is formed. Then, the thin layer 51 is patterned, by photolithography and etching methods, using a photo mask 52 and a resist 53. A sputtering method is used for depositing the metal layer, while a Chemical Vapor Deposition (CVD) is used for depositing the semiconductor and the insulating layers. Examples of etching methods may include a dry etching method or a wet etching method. The wet etching is generally used for metals which are used in interconnections. The etching process is repeated four to five times for manufacturing TFTs.

Figure 37:
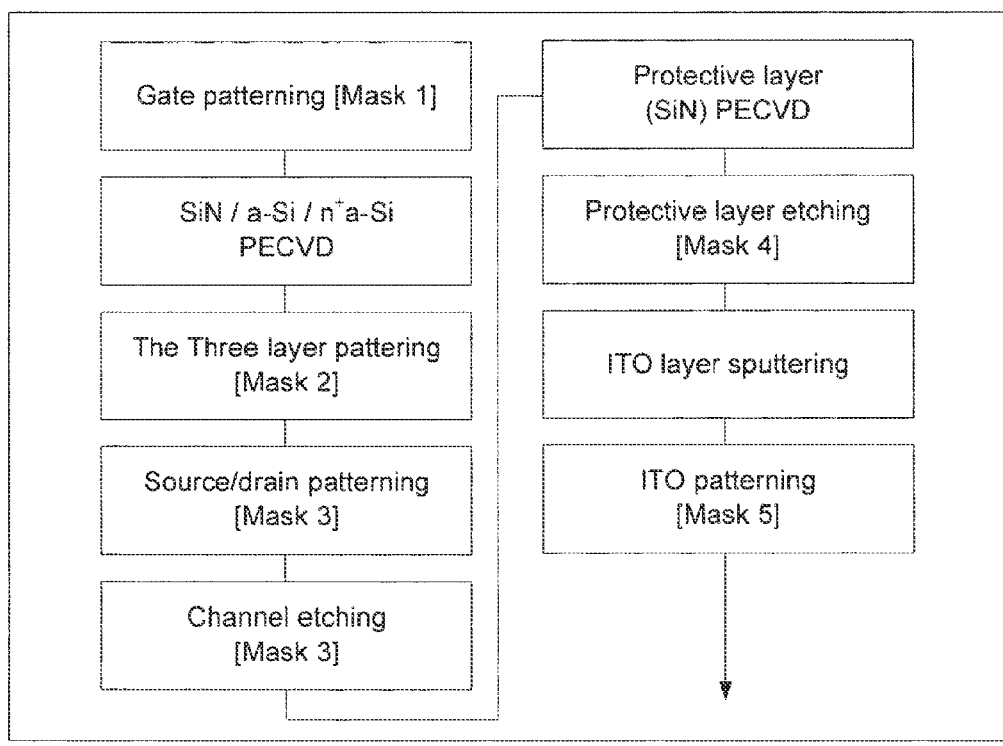
FIG. 37 illustrates an embodiment of a five-mask process for manufacturing of TFT devices.

Referring next to FIG. 37, an embodiment of a five mask processes for manufacturing of TFT devices is shown. The order of manufacturing process is given as follows: (1) mask 1; patterning the gate by a wet etching method, (2) mask 2; three layers of SiN/a-Si/n$^+$a-Si are processed altogether using a dry etching method, (3) mask 3; patterning the source/drain electrodes using a wet etching method, (4) mask 3; a dry etching method is conducted to an amorphous silicon (n$^+$a-Si) containing impurities so as to form a channel structure, (5) mask 4; patterning a SiN layer, which is a passivation layer (protective layer), (6) mask 5; patterning the Indium Tin Oxide (ITO) layer, which is a transparent electrode. Accordingly, a TFT structure is manufactured.

Figure 38:
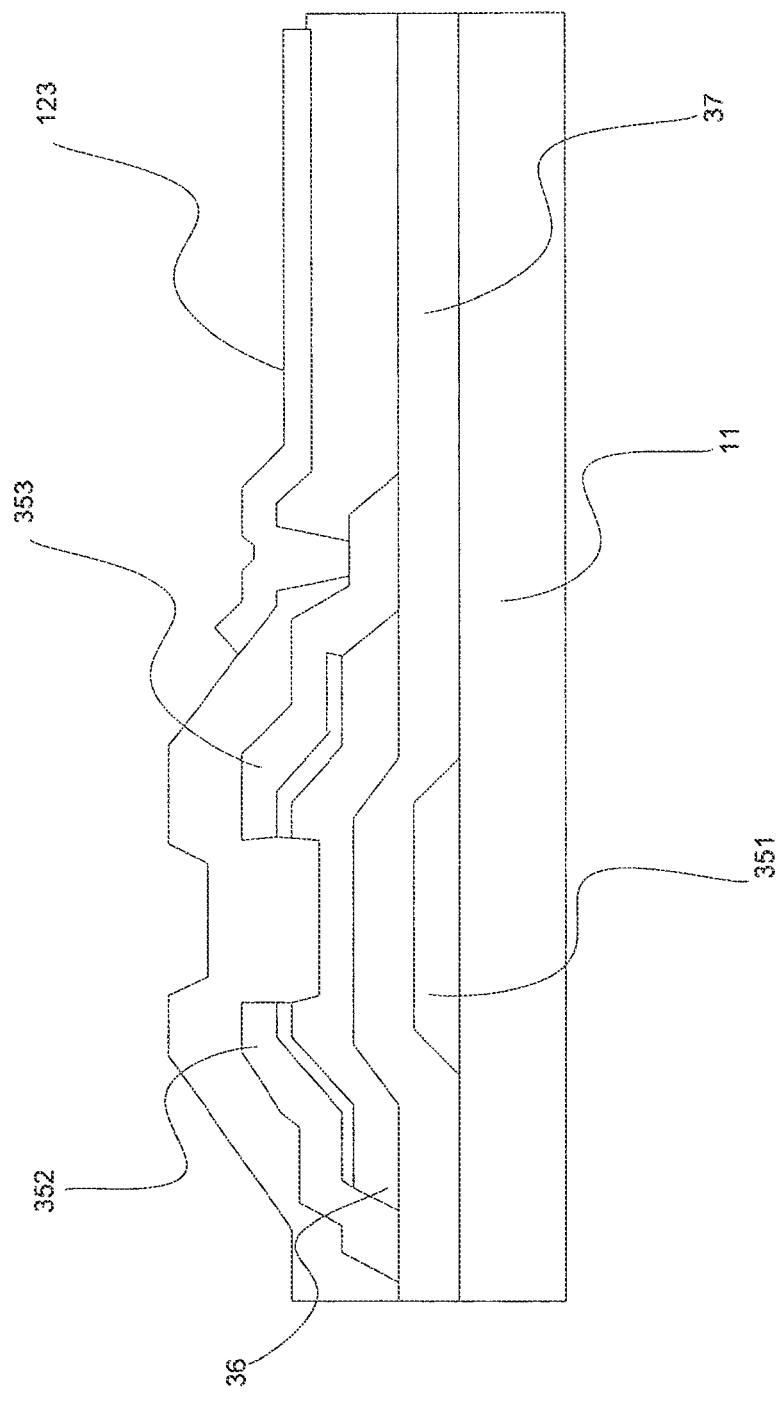
FIG. 38 illustrates a cross-sectional view of a TFT structure manufactured with the five-mask process.
Figure 39:
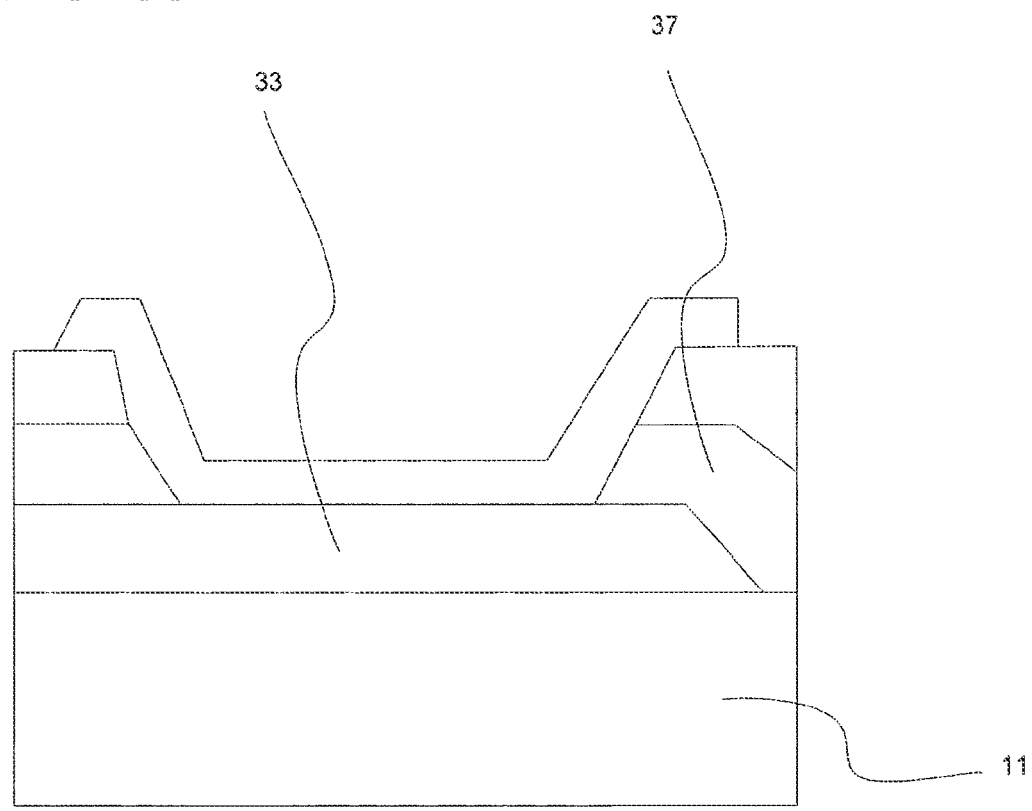
FIG. 39 illustrates a cross-sectional view of an electrode terminal for an external connection.
Figure 40:
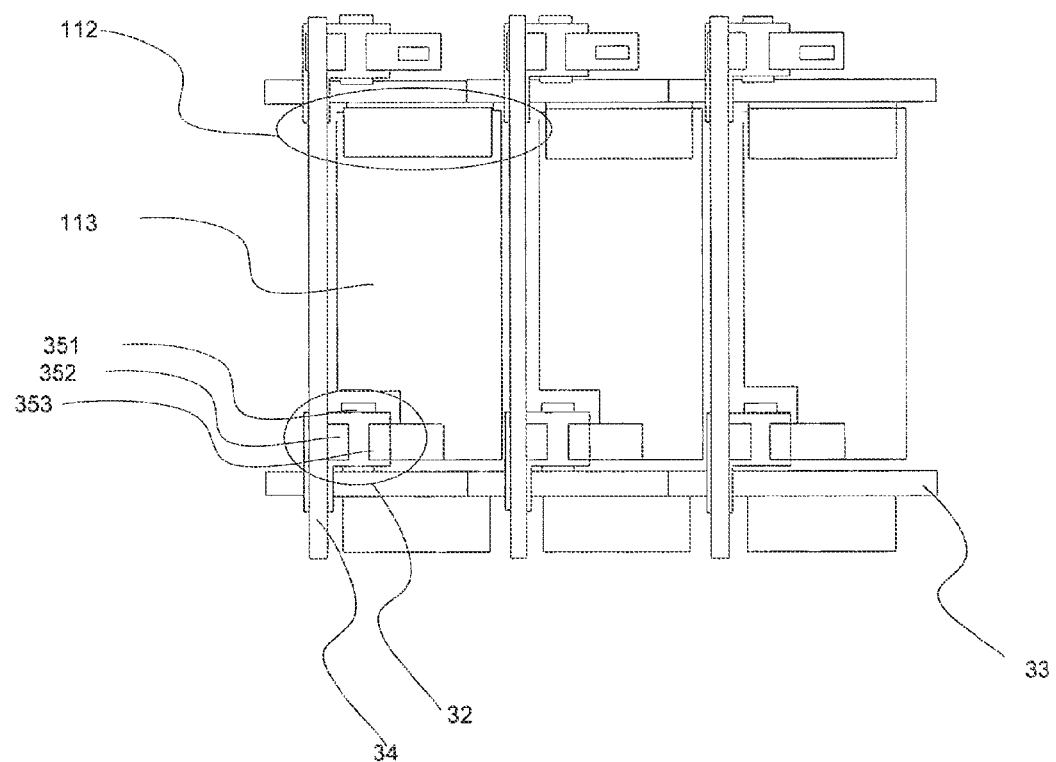
FIG. 40 illustrates a plan view of an embodiment of TFT-LCD module showing pixel and TFT portions.

FIG. 38 illustrates a cross-sectional view of the TFT structure manufactured with the five-mask process. As shown in FIG. 39, in the gate terminal portion, which is an external electrode, laminated structures are formed using a metal and an ITO layers. FIG. 40 illustrates a plan-view of TFT-LCD module showing pixel portions and TFT portions.

The additional element in the copper alloy layer, pertaining to the present invention, has an oxide formation free energy which is negatively greater than the oxide formation free energy for an element in an oxide layer. Accordingly, an oxide covering layer can be formed by reducing the oxide described above. Further, in an oxidation atmosphere, an oxide covering layer may be formed without reducing the oxide.

The Cu alloy, used as the interconnection and electrode materials of the TFT-LCD module of the present invention, is in contact with an insulating layer containing oxygen. As a result, the additional element of Cu alloy diffuses toward the interface and the additional element is oxidized so as to form the interface oxide layer.

Further, each of the elements contained in the insulating layer, Cu, and the additional element in the Cu alloy layer, respectively, forms an oxide so as to form a composite oxide layer. For example, in a case where the TFT substrate contains an oxide such as $SiO_2$ and the like, the gate interconnections of the Cu alloy are formed on the substrate and then a heat treatment is conducted. As a result, the additional element in the Cu alloy forming the gate interconnections diffuses into the interface between the substrate and the gate interconnections, and then reacts with oxygen in the substrate. Accordingly, an oxide interface layer is formed.

In addition, for example, on the gate electrode 351, the gate insulating layer 37, composed of SiNO and the like, is formed. By conducting a heat treatment during the manufacturing process, an oxide layer containing Cu, Si, and the additional element, (Ci, Si, the additional element)$O_x$, is formed at the interface between the gate electrode 351 and the gate insulating layer 37. Accordingly, the oxide layer is formed on the surface by using the copper alloy as the interconnection and electrode materials of the TFT-LCD devices.

Now, the manufacturing process for the LCD device of the present invention will be provided. Using a physical vapor deposition (PVD) method or a chemical vapor deposition (CVD) method, a Cu alloy layer is deposited on the TFT substrate 11. The Cu alloy layer is mainly composed of Cu and an additional element used for forming an oxide layer on its surface and at the interface with the substrate. Then, a photolithography and etching methods are used for patterning the copper alloy layer, so as to form at least one of the interconnections and electrodes.

In this embodiment, the additional element of the copper alloy layer, is a metal element preferably selected from the group of Mn, Zn, Ga, Li, Ge, Sr, Ag, In, Sn, Ba, Pr, and Nd. In addition, in this embodiment, manufacturing process is performed such that an oxide layer is formed on at least one surface of the obtained interconnections or electrodes.

It is preferable that the atmosphere gas, used for the process of forming the oxide layer, is an inert gas such as argon which contains oxygen in the amount of not less than 0.01 ppm and not more than 100 ppm. In addition, the oxygen concentration in the atmosphere gas is preferably 5 to 50 ppm. Alternatively, an argon gas which contains oxygen as inevitable impurities may be used. Further, after forming at least one of either the interconnections or electrodes, a heat treatment is conducted at temperatures ranging from 150 to 400° C. for a period ranging from 2 to 50 hours. Thereby, an oxide layer of the additional element in the copper alloy layer may be formed on the surface of at least one of the interconnections or the electrodes.

In this embodiment, Cu-2 atom % Mn alloy, which is composed of Cu having 99.9999% purity and Mn having 99.98 purity, is used as a target material. After a thin layer of the alloy is deposited on an insulating layer $SiO_2$, the heat treatment at a temperature of not less than 150° C. and not more than 450° C. is conducted, thereby forming a sample for analysis. Then, the composition of the thin layer is analyzed, using an Auger electron spectroscopy, from its surface to its depth direction.

Figure 41:
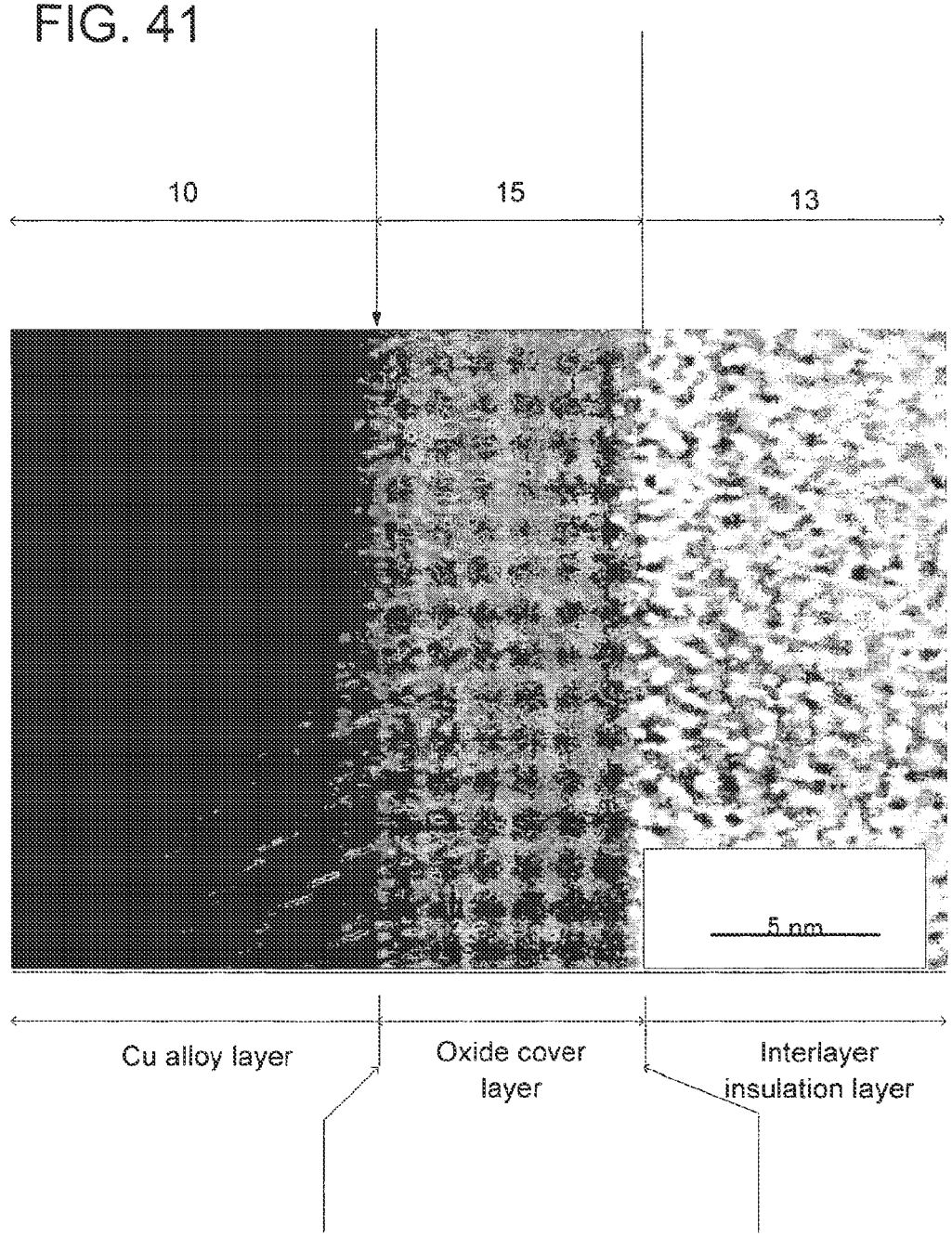
FIG. 41 illustrates a cross-sectional view of a TEM image for the copper alloy sample after conducting the heat treatment.
Figure 42:
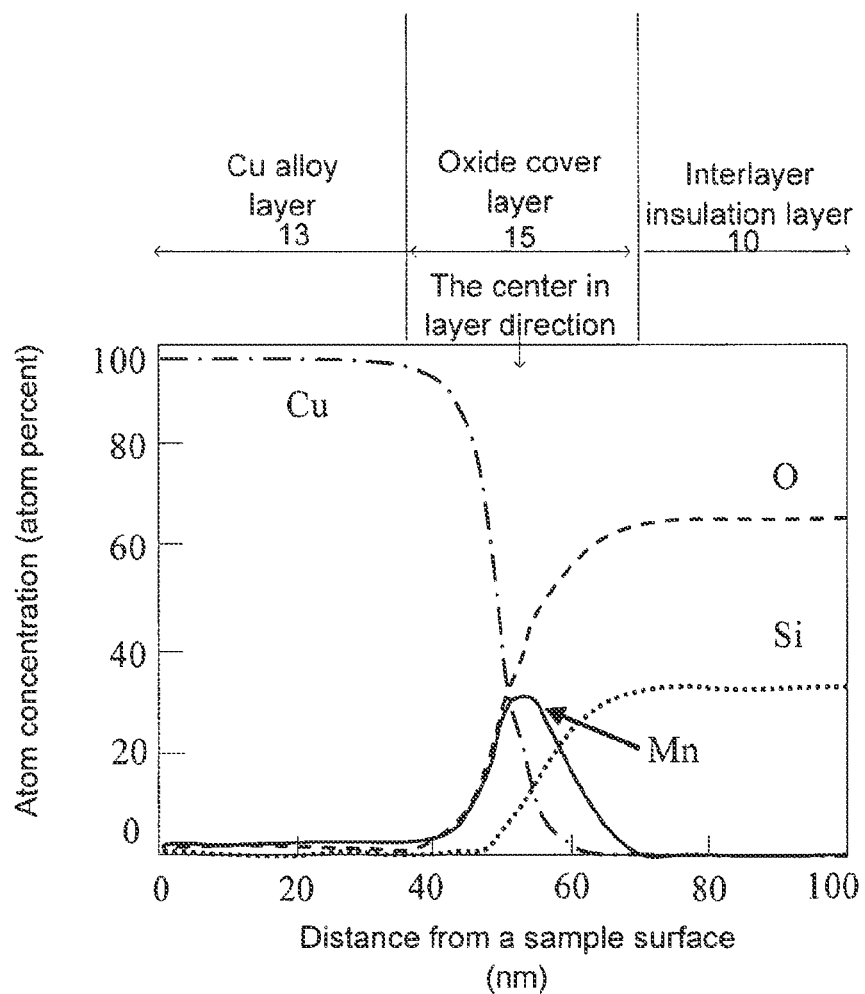
FIG. 42 is a composition view of an oxide covering layer of the interconnections.

FIG. 41 illustrates a cross-sectional view of a TEM image for the copper alloy sample after conducting the heat treatment. By using a transmission electron microscope and an electron energy loss spectrometer (EELS), the microstructure observation and composition analysis are conducted. An example of the results is shown in FIG. 42. Stable oxide layers are formed at the interface between the Cu—Mn alloy layer and the insulating substrate layer as well at the Cu—Mn alloy surface. The oxide layers are mainly composed of Mn and their thickness is about few to twenty-some nm.

Figure 43:
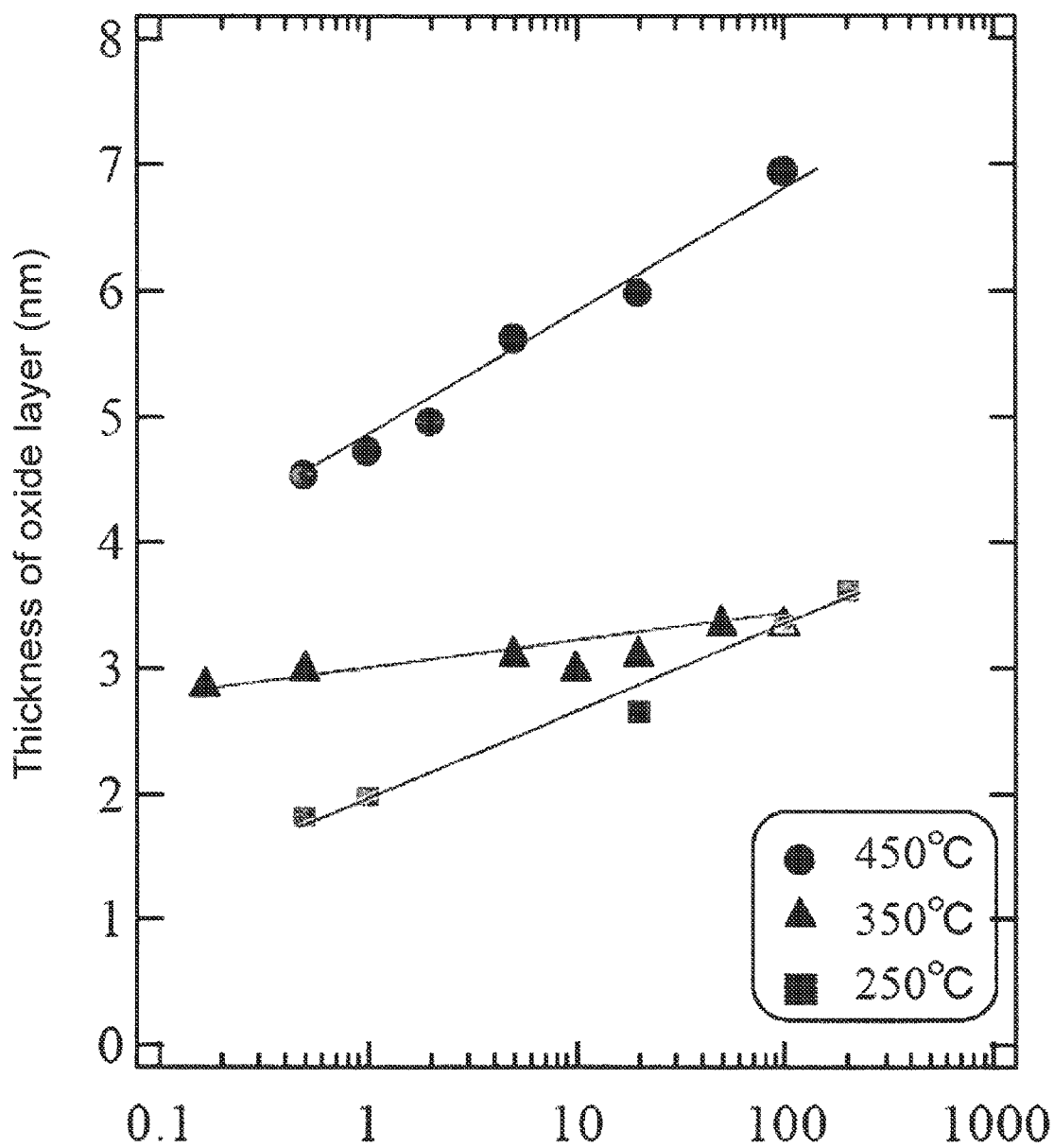
FIG. 43 illustrates thickness of an oxide covering layer.

FIG. 43, illustrates the thickness of oxide layer as a function of the heating period. Table II summarizes the thicknesses of the obtained oxide layers for various Mn atom concentration, heating time period, and temperatures. Referring back to FIGS. 31-32, the atomic concentration of Cu—Mn sample is shown as a function of distance. According to these results, Mn shows a distribution where its peak is substantially at the center of the oxide layer. It should be understood that even though Cu intrudes into the oxide layer from the interconnection body side, the intrusion of Cu into the insulating layer is prevented.

TABLE II

The thicknesses of formed oxide layers

| Atom concentration in Cu—Mn alloy (at %) | Heat treatment time (minutes) | Heat treatment temperature (° C.) | |
|---|---|---|---|
| | | 350° C. | 450° C. |
| 10% | 20 minutes | 3.2 nm | 6.1 nm |
| 20% | 30 minutes | — | 8.2 nm |

A requisite relating to a sputtering target is provided, in the case where Cu—Mn is used as the copper alloy in the LCD device of the present invention. More specifically, in the TFT-LCD module of the present invention, the propagation delay in the gate interconnection increases. As described above, in order to reduce this propagation delay, it is preferable to use copper interconnections to achieve low resistivity interconnections, which is close to the resistivity of the pure copper.

Figure 44:
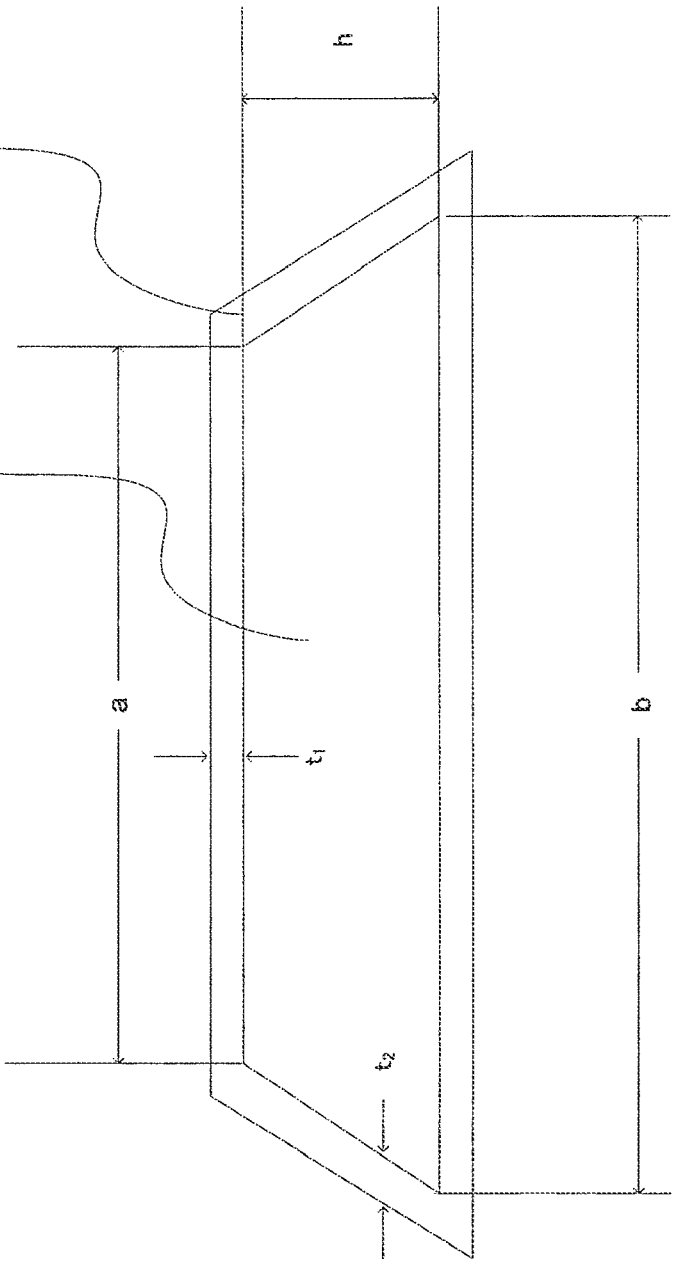
FIG. 44 illustrates a cross-sectional view of an exemplary embodiment of a gate interconnection structure.

FIG. 44 illustrates a cross-sectional view of an exemplary gate interconnection using Cu—Mn. The gate interconnection is composed of an interconnection body 171 and an oxide covering layer 172. Parameters a, b, h, $t_1$ and $t_2$, shown in FIG. 44, indicate the size of each portion related to the gate interconnection. The sizes of a and b are in the range of a few to ten-some μm. The size of h is around 200 to 500 nm. The sizes of $t_1$ and $t_2$ are around 2 to 10 nm. In order to realize an interconnection body 171 with a resistance close to the resistance of the pure copper, it is preferable that the corresponding amount of Mn contained in the covering oxide layer 172 after the heat treatment, being the same amount contained in the Cu—Mn alloy layer before the heat treatment. Accordingly, the amount of Mn, which is the additional element in the target of the sputtering method, is defined.

[Organic EL]

Figure 45:
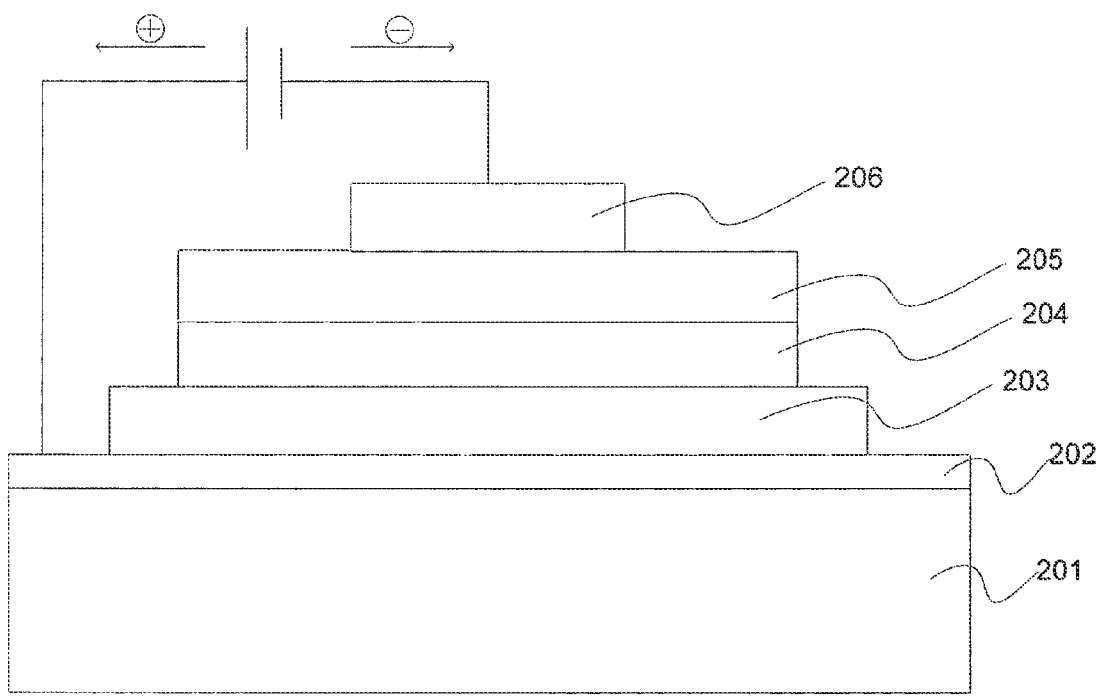
FIG. 45 illustrates a schematic diagram of an organic EL device.

The present invention is not limited to the TFT-type liquid crystal display device. The present invention may also be applied to organic EL display devices. FIG. 45 illustrates a schematic diagram of one example of the organic EL device according to the present invention. The organic EL device mainly includes a glass substrate 201, an anode (ITO) 202, a hole transporting layer (HTL) 203, an emitting layer (EML) 204, an electron transporting layer (ETL) 205, and a cathode 206 positioned on the electron transporting layer 205 sequentially laminated on the glass substrate 201. As the emitting layer, for example, organic substances such as diamines and the like are used. The anode 202 and the cathode 206 are electrically connected through a power source by an electrode wire. Each layer has thickness of, for example, about tens of nm.

Figure 46:
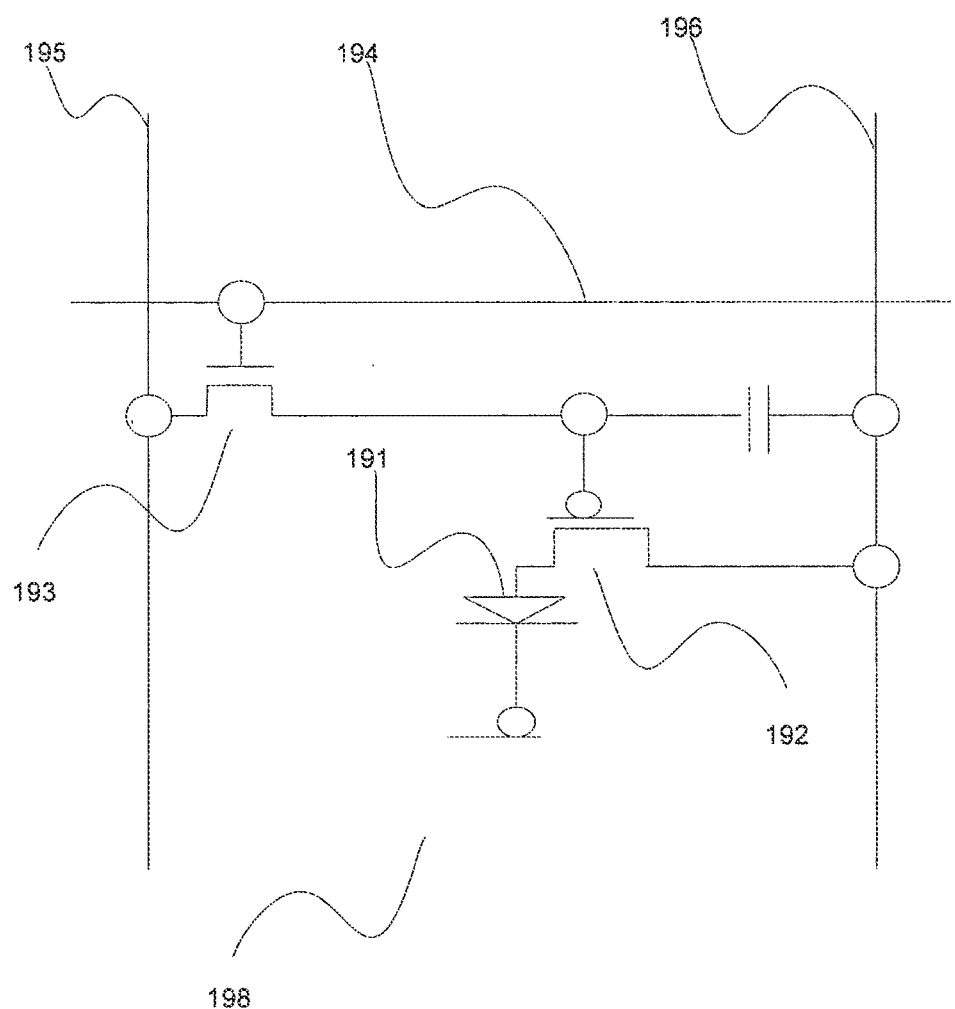
FIG. 46 illustrates a schematic diagram of an equivalent circuit for an organic EL display device.

With reference to FIG. 46, a schematic diagram of an equivalent circuit for an organic EL display device is shown. The organic EL display device includes a scan line 194, a signal line 195 and a power line 196 which cross in the matrix way on a substrate 201. There is a pixel region 198 surrounded by the scan line 194, the signal line 195 and the power line 196. In this embodiment, the pixel region 198 includes an organic EL element 191, a drive TFT 192 and a switch TFT 193.

The organic EL includes an anode, a hole transporting layer, an organic emitting layer, an electron transporting layer and a cathode, which are laminated on a glass substrate. One pixel is composed of a TFT circuit and an organic EL element. A plurality of pixels are positioned in the matrix way. This is called an active matrix organic EL display device.

Figure 47:
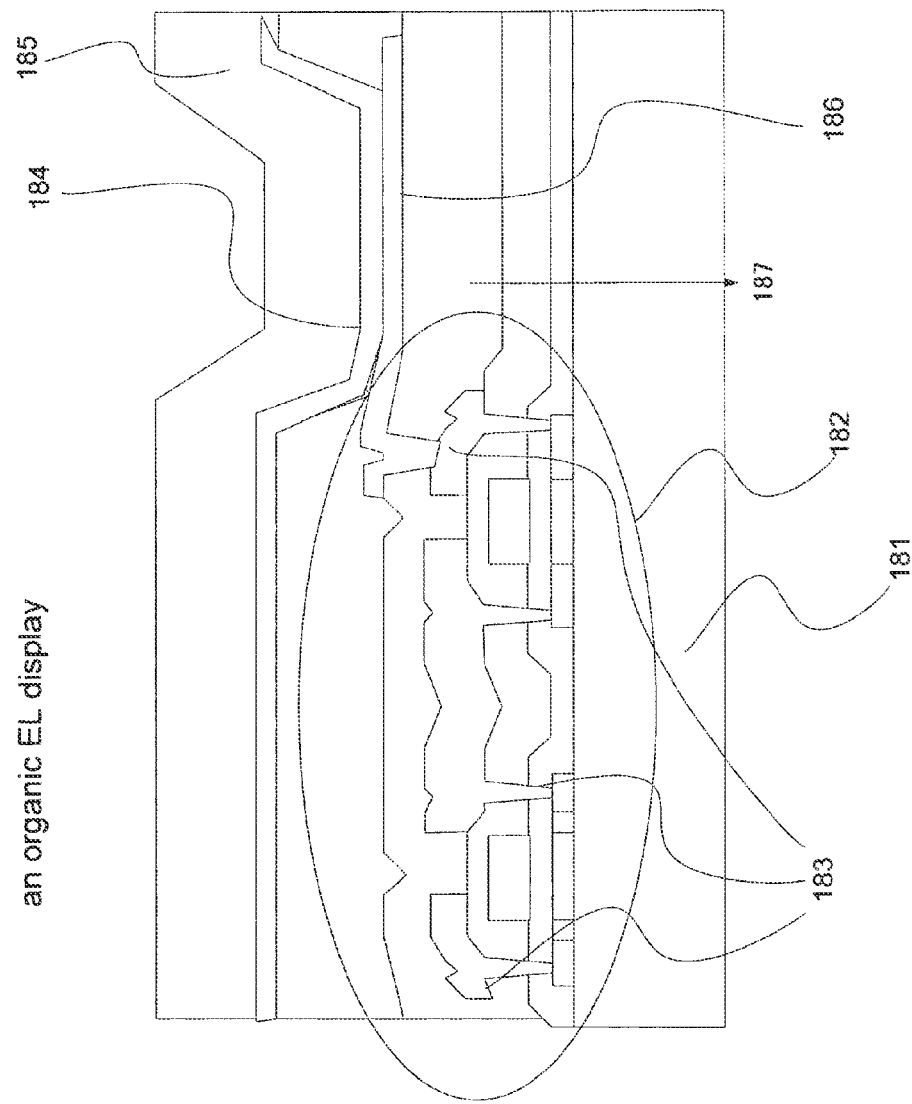
FIG. 47 illustrates a cross-sectional view of an embodiment of an organic EL display device.

FIG. 47 illustrates a cross-sectional view of an organic EL display device. The organic EL display device may include a driving TFT portion 182 and an organic EL element 184, which are positioned on the glass substrate 181. In addition, a TFT electrode 183, a cathode 185 made from metals, and a transparent electrode 186 is included. In this embodiment, light 187 is emitted toward a lower portion of the substrate.

In the active matrix type organic EL display device, there exists a problem with regard to the unevenness of picture images. The unevenness is caused by the propagation delay of the gate voltage pulse occurred in the active matrix type liquid crystal display device. In order to solve the problem, copper alloy is used as an interconnection material having high conductivity.

The copper alloy in the present invention is used for the scan lines and the signal lines. In the organic EL display device according to the present invention, at least one of the scan line, the signal line, the power line and the electrode of the TFT is formed from the copper alloy mainly composed of copper. The copper alloy is to form oxide layers of the additional element that is added to the copper. The oxide layer covers interconnections or electrodes. The structure of cross-sectional view of the interconnections is illustrated in FIG. 44.

Furthermore, the copper alloy of the present invention is a copper alloy in which the additional element diffuses in the surface of the copper alloy and oxide covering layers of the additional element are formed. In addition, the additional element may be at least one metal element selected from the group of Mn, Zn, Ga, Li, Ge, Sr, Ag, In, Sn, Ba, Pr and Nd. More preferably, the additional element may be at least one metal element selected from the group of Mn, Zn and Ga. In addition, it is the most preferable that the additional element is Mn.

Furthermore, it is preferable that the electrode terminal for an external connection has a structure according to the structure shown in FIGS. 20-24.

What is claimed is:

1. A thin film transistor comprising:
   a semiconductor layer;
   a first electrode comprising:
      a layer comprising copper, and
      an oxide layer in contact with the semiconductor layer; and
   a second electrode in contact with the semiconductor layer;
   wherein the semiconductor layer and the first electrode are configured to have a substantially linear current-voltage relationship when a voltage is applied between the semiconductor layer and the first electrode.

2. The thin film transistor of claim 1, wherein the first electrode is a source electrode and the second electrode is a drain electrode.

3. The thin film transistor of claim 1, wherein the first electrode is a drain electrode and the second electrode is a source electrode.

4. The thin film transistor of claim 1, wherein the second electrode comprises a layer comprising copper and an oxide layer in contact with the semiconductor layer.

5. The thin film transistor of claim 1, further comprising:
   a substrate, wherein each of the first electrode, the second electrode, and the semiconductor layer is disposed, at least in part, on the substrate.

6. The thin film transistor of claim 5, further comprising:
   an insulating layer in contact with each of the substrate, the first electrode, the second electrode, and the semiconductor layer; and
   a gate electrode in contact with and separated from the first electrode, the second electrode, and the semiconductor layer by the insulating layer.

7. The thin film transistor of claim 1, further comprising:
   a substrate;
   a gate electrode disposed on the substrate; and
   an insulating layer, wherein the semiconductor layer is disposed on and separated from the gate electrode by the insulating later.

8. The thin film transistor of claim 7, further comprising:
   a passivation layer disposed on each of the insulating layer, the first electrode, the second electrode, and the semiconductor layer.

9. The thin film transistor of claim 8, wherein the passivation layer comprises a through hole, the thin film transistor further comprising:
   a pixel electrode disposed on the passivation layer and in contact with the first electrode via the through hole.

10. The thin film transistor of claim 1, wherein the thin film transistor is part of a liquid crystal display.

11. A method of forming a thin film transistor, comprising:
    depositing a gate electrode on a substrate;
    depositing a gate insulating layer over the substrate and the gate electrode;
    depositing a semiconductor layer over the gate insulating layer;
    forming a first electrode over at least a first portion of the semiconductor layer;
    forming a second electrode over at least a second portion of the semiconductor layer; and
    heating at least the first electrode to form a first oxidation layer on the first electrode, wherein the first oxidation layer is formed, at least in part, along the first portion of the semiconductor layer;
    wherein the semiconductor layer and the first electrode are configured to have a substantially linear current-voltage relationship when a voltage is applied between the semiconductor layer and the first electrode.

12. The method of claim 11, wherein the first electrode is a source electrode and the second electrode is a drain electrode.

13. The method of claim 11, wherein the first electrode is a drain electrode and the second electrode is a source electrode.

14. The method of claim 11, wherein the heating further comprises:
    heating the second electrode to form a second oxidation layer on the second electrode, wherein the second oxidation layer is formed, at least in part, along the second portion of the semiconductor layer.

15. The method of claim 11, further comprising:
    heating the gate electrode to form a third oxidation layer on the gate electrode, wherein the third oxidation layer is formed, at least in part, between the gate electrode and the substrate.

16. The method of claim 11, wherein the first oxidation layer is formed around the substantially the entire exterior of the first electrode.

17. The method of claim 16, wherein the first electrode comprises a copper-manganese alloy, wherein the first oxidation layer comprises a copper-manganese-silicon oxide in an area along the first portion of the semiconductor layer and a copper-manganese oxide in an area that is not along the first portion of the semiconductor layer.

18. The method of claim 11, further comprising:
    disposing a passivation layer disposed over each of the insulating layer, the first electrode, the second electrode, and the semiconductor layer.

19. The method of claim 18, further comprising:
    creating a through hole in the passivation layer.

20. The method of claim 19, further comprising:
    disposing a pixel electrode on the passivation layer and in contact with the first electrode via the through hole.

* * * * *